United States Patent
Saito et al.

(10) Patent No.: US 9,159,843 B2
(45) Date of Patent: Oct. 13, 2015

(54) SEMICONDUCTOR DEVICE AND METHOD OF MANUFACTURING THE SAME

(75) Inventors: Kentaro Saito, Kanagawa (JP); Kazumasa Yanagisawa, Kanagawa (JP); Yasushi Ishii, Kanagawa (JP); Koichi Toba, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 469 days.

(21) Appl. No.: 13/476,356

(22) Filed: May 21, 2012

(65) Prior Publication Data

US 2012/0299084 A1 Nov. 29, 2012

(30) Foreign Application Priority Data

May 27, 2011 (JP) .................. 2011-118722

(51) Int. Cl.
| | | |
|---|---|---|
| *H01L 29/778* | (2006.01) | |
| *H01L 21/336* | (2006.01) | |
| *H01L 29/792* | (2006.01) | |
| *H01L 21/28* | (2006.01) | |
| *H01L 27/115* | (2006.01) | |
| *H01L 29/423* | (2006.01) | |
| *H01L 29/66* | (2006.01) | |
| *G11C 16/04* | (2006.01) | |

(52) U.S. Cl.
CPC .......... *H01L 29/792* (2013.01); *G11C 16/0466* (2013.01); *H01L 21/28282* (2013.01); *H01L 27/11573* (2013.01); *H01L 29/4234* (2013.01); *H01L 29/66833* (2013.01)

(58) Field of Classification Search
CPC ................ H01L 29/792; H01L 21/336; H01L 21/28282; H01L 21/31155; H01L 27/105; H01L 27/11521; H01L 27/11546; H01L 27/11568; H01L 29/42344; H01L 29/66833; H01L 27/11526
USPC ............ 257/324, E21.409, E29.309; 438/591
See application file for complete search history.

(56) References Cited

U.S. PATENT DOCUMENTS

| | | | |
|---|---|---|---|
| 8,450,790 B2 | 5/2013 | Kawashima | |
| 2004/0188753 A1* | 9/2004 | Kawashima et al. | ......... 257/316 |
| 2005/0247971 A1* | 11/2005 | Lee | ......... 257/314 |
| 2008/0029805 A1* | 2/2008 | Shimamoto et al. | ......... 257/315 |

(Continued)

FOREIGN PATENT DOCUMENTS

| | | |
|---|---|---|
| JP | 2004-266203 A | 9/2004 |
| JP | 2010-108976 A | 5/2010 |

(Continued)

OTHER PUBLICATIONS

Office Action issued Sep. 30, 2014, in Japanese Patent Application No. 2011-118722.

*Primary Examiner* — Asok K Sarkar
*Assistant Examiner* — Dmitriy Yemelyanov
(74) *Attorney, Agent, or Firm* — Miles & Stockbridge P.C.

(57) ABSTRACT

To improve the electric performance and reliability of a semiconductor device. A memory gate electrode of a split gate type nonvolatile memory is a metal gate electrode formed from a stacked film of a metal film 6a and a silicon film 6b over the metal film 6a. In an upper end part of the metal film 6a, a metal oxide portion 17 is formed by oxidation of a part of the metal film 6a. A control gate electrode of the split gate type nonvolatile memory is a metal gate electrode formed from a stacked film of a metal film 4a and the silicon film 4b over the metal film 4a.

12 Claims, 38 Drawing Sheets

(56) References Cited

U.S. PATENT DOCUMENTS

2010/0084718 A1* 4/2010 Liu et al. .................. 257/410
2011/0101461 A1 5/2011 Takeuchi et al.

FOREIGN PATENT DOCUMENTS

| JP | 2010-282987 A | 12/2010 |
| JP | 2011-096904 A | 5/2011 |

* cited by examiner

*FIG. 5*

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

SEMICONDUCTOR DEVICE AND METHOD OF MANUFACTURING THE SAME

CROSS-REFERENCE TO RELATED APPLICATION

The disclosure of Japanese Patent Application No. 2011-118722 filed on May 27, 2011 including the specification, drawings and abstract is incorporated herein by reference in its entirety.

BACKGROUND

The present invention relates to a semiconductor device and a method of manufacturing the same, particularly to technology that is effective when applied to a semiconductor device having a nonvolatile memory and a method of manufacturing the same.

As a nonvolatile semiconductor memory device capable of electrical write/erase, EEPROMs (Electrically Erasable and Programmable Read Only Memory) are used widely. These memory devices (memories) represented by flash memories widely used nowadays have an electroconductive floating gate electrode or a trapping insulating film surrounded by an oxide film, under the gate electrode of a MISFET, and utilize an electrical charge accumulation state in the floating gate and the trapping insulating film as storage information to read it as a threshold value of a transistor. The trapping insulating film means an insulating film capable of accumulating electric charges, and includes a silicon nitride film. Injection/release of electric charges to/from such an electric charge accumulation region shifts the threshold value of a MISFET to cause the MISFET to operate as a storage device. As the flash memory, a split gate type cell using a MONOS (Metal-Oxide-Nitride-Oxide-Semiconductor) film exists. This memory has, by using a silicon nitride film as the electric charge accumulation region, an advantage that the reliability of data retention is excellent because electric charges are accumulated discretely. Furthermore, because the reliability of the data retention is excellent, oxide films over and below the silicon nitride film can be thinned to enable low voltage write/erase operation, as compared with an electroconductive floating gate film.

Japanese Patent Laid-Open No. 2010-108976 (Patent Document 1) describes technology related to a split gate type nonvolatile memory, and describes, in paragraphs [0080] to [0082], formation of a gate insulating film GOX from a high-permittivity film.

Japanese Patent Laid-Open No. 2004-266203 (Patent Document 2) describes technology related to a nonvolatile memory element, and describes, in paragraphs [0138] to [0141], formation of a memory gate electrode 36 by an electroconductive film 35 made of a metal and has a resistance lower than a polycrystalline silicon film.

SUMMARY

For conventional split gate type nonvolatile memories, as a stacked gate insulating film, an ONO (Oxide-Nitride-Oxide) film of a stacked structure including a silicon oxide film, a silicon nitride film and a silicon oxide film is formed, and, as a control gate electrode and a memory gate electrode, a polysilicon gate electrode is formed.

Recent years, the nonvolatile memory is desired to have better electric performance and reliability.

The present invention has been made in view of the above circumstances and provides technology capable of improving electric performance of a semiconductor device.

The present invention also provides technology improving the reliability of a semiconductor device.

The present invention also provides technology improving the electric performance of a semiconductor device, and technology improving the reliability of a semiconductor device.

The other purposes and the new feature of the present invention will become clear from the description of the present specification and the accompanying drawings.

The following explains briefly the outline of a typical invention among the inventions disclosed in the present application.

In a semiconductor device according to a typical embodiment, a memory gate electrode of a split gate type nonvolatile memory has a metal film and a silicon film over the metal film, and has a metal oxide portion formed in an upper end part of the metal film.

Further, in a semiconductor device according to a typical embodiment, a metal gate electrode is applied to a control gate electrode of a split gate type nonvolatile memory.

The following explains briefly the effect acquired by the typical invention among the inventions disclosed in the present application.

According to the typical embodiment, the electric performance of the semiconductor device can be improved.

Also, the reliability of the semiconductor device can be improved.

Moreover, the electric performance of the semiconductor device can be improved, and the reliability of the semiconductor device can be improved.

BRIEF DESCRIPTION OF THE DRAWINGS

FIG. 5 is a table showing an application condition of voltage to each site of a selection memory cell in "WRITE," "ERASE" and "READ."

DETAILED DESCRIPTION

Figure 1:
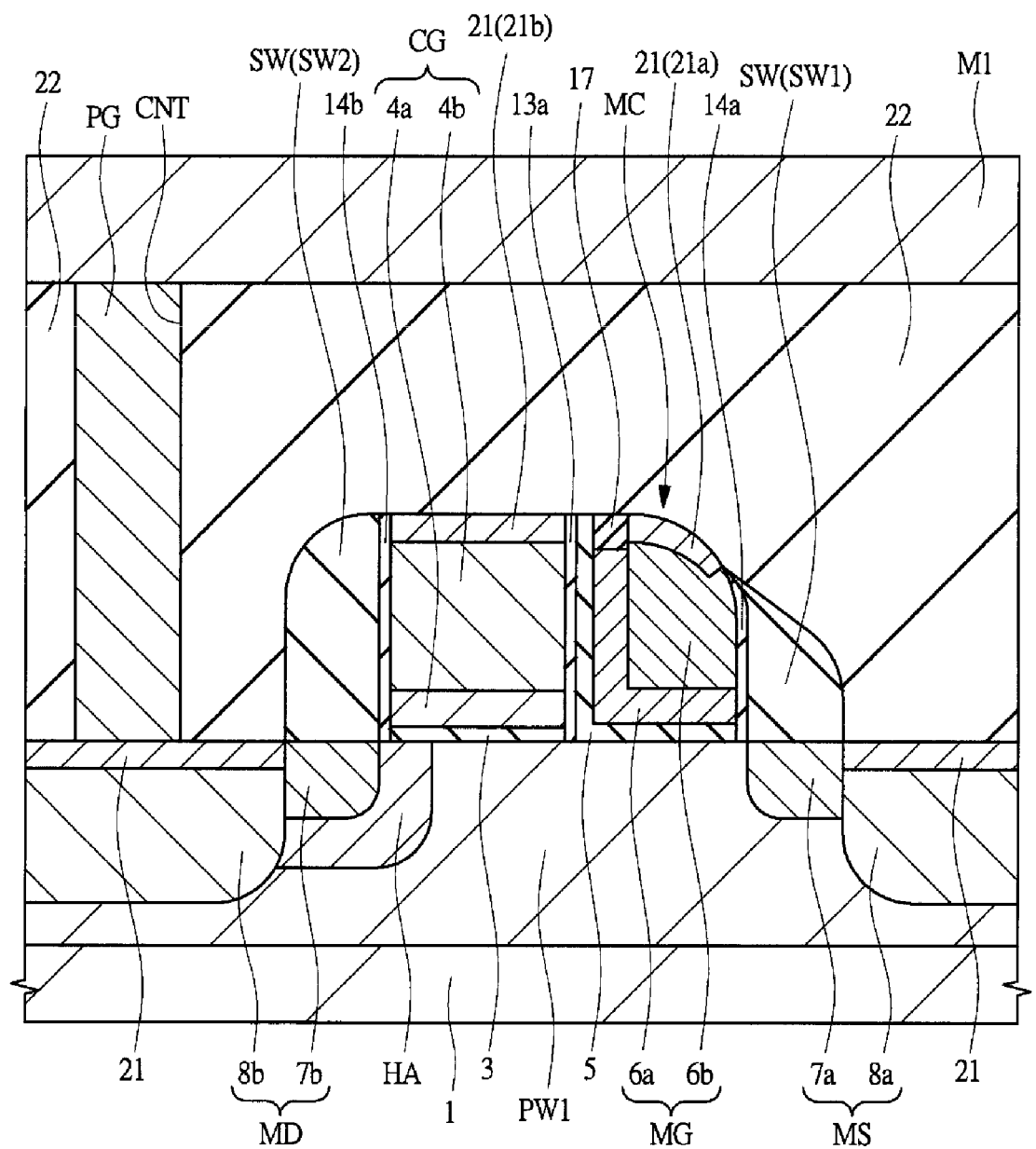
FIG. 1 is a cross-sectional view of essential parts of a semiconductor device in an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements (including the number, a numeric value, an amount, and a range), they may be not restricted to the specific number but may be greater or smaller than the specific number, except for the case where they are clearly specified in particular and where they are clearly restricted to a specific number theoretically. Furthermore, in the following embodiments, an element (including an element step) is not necessarily indispensable, except for the case where it is clearly specified in particular and where it is considered to be clearly indispensable from a theoretical point of view. Similarly, in the following embodiments, when shape or position relationship of an element is referred to, what resembles or is similar to the shape substantially shall be included, except for the case where it is clearly specified in particular and where it is considered to be clearly not right from a theoretical point of view. This statement also applies to the numeric value and range described above.

Hereinafter, embodiments of the present invention are explained in detail on the basis of the drawings. In all the drawings for explaining embodiments, the same symbol is attached to the member having the same function, as a principle, and the repeated explanation is omitted. In the embodiments below, the explanation for the same or a similar part is not repeated in principle, except for cases requiring an explanation in particular.

In drawings used in embodiments, to make the drawing intelligible, hatching may be omitted even if it is a cross-sectional view. Moreover, to make the drawing intelligible, hatching may be attached even if it is a plan view.

Embodiment 1

The present invention is a semiconductor device including a nonvolatile memory (a nonvolatile memory device, a flash memory, a nonvolatile semiconductor memory device), and the nonvolatile memory uses a trapping insulating film (an insulating film capable of accumulating electric charges) mainly in an electric charge accumulation part. In the embodiment below, the nonvolatile memory is explained based on a memory cell on the basis of an n-channel type MISFET (Metal Insulator Semiconductor Field Effect Transistor) using the trapping insulating film. Polarity (polarity of an applied voltage in write/erase/read, or polarity of a carrier) in the embodiment below is for explaining the operation in the case of a memory cell on the basis of the n-channel type MISFET, and, when the memory cell is based on a p-channel type MISFET, it is possible to obtain the same operation, in principle, by reversing all the polarities of the applied potential, the conductivity type of the carrier.

The semiconductor device of the embodiment is explained with reference to the drawings.

Figure 2:
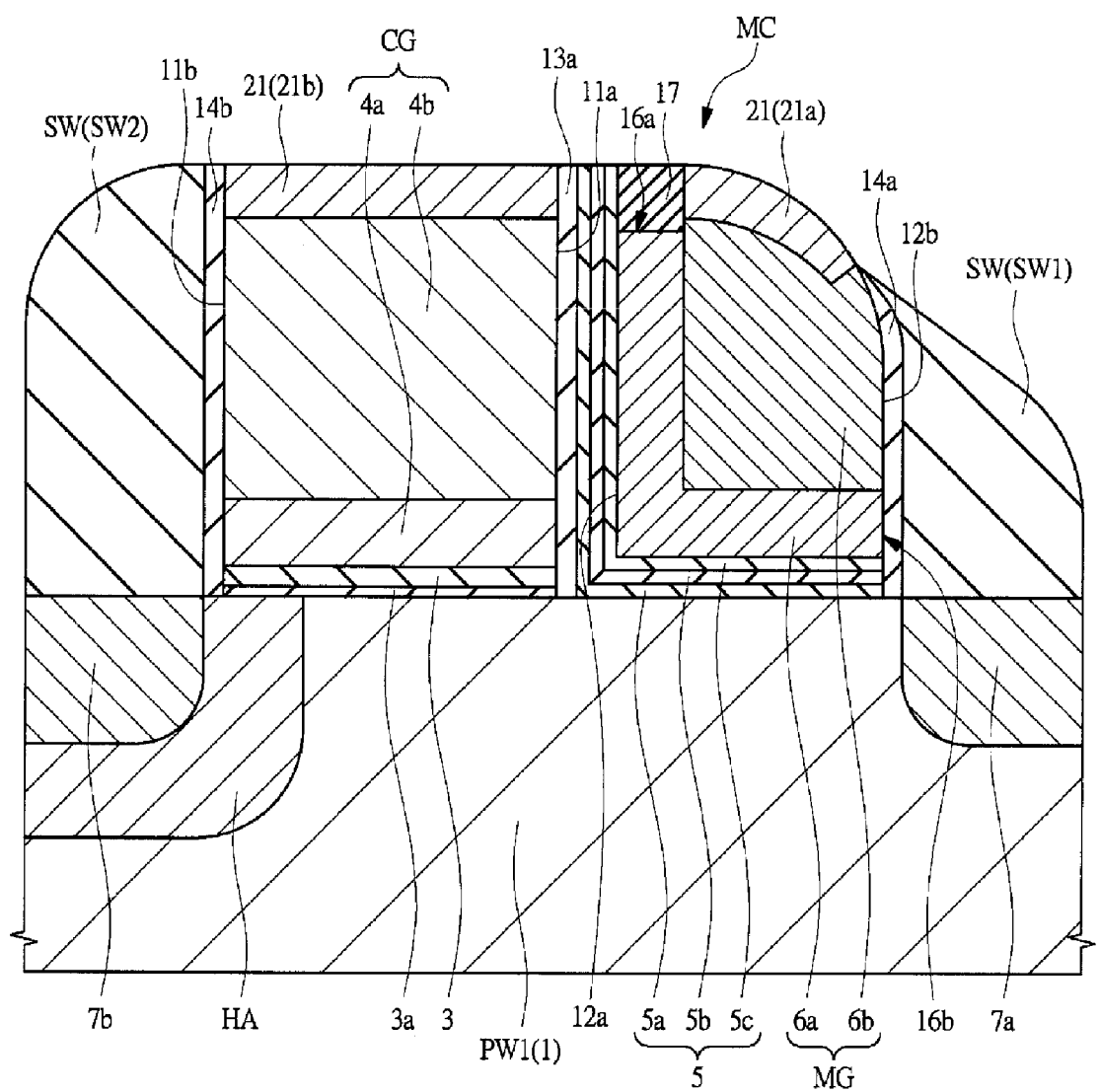
FIG. 2 is a partially enlarged cross-sectional view of FIG. 1.
Figure 3:
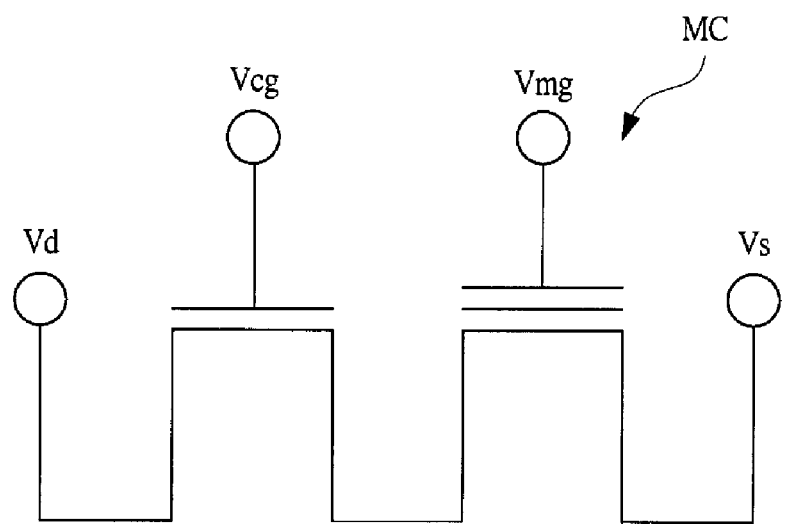
FIG. 3 is an equivalent circuit diagram of a memory cell.

FIG. 1 is a cross-sectional view of essential parts of the semiconductor device in the embodiment. The semiconductor device in the embodiment is a semiconductor device including a nonvolatile memory. FIG. 1 shows a cross-sectional view of essential parts of a memory cell region of the nonvolatile memory. FIG. 2 is a partially enlarged cross-sectional view (a cross-sectional view of essential parts) of a memory cell MC of the semiconductor device in the embodiment, and a part of FIG. 1 is enlarged. FIG. 3 is an equivalent circuit diagram of the memory cell MC. In FIG. 2, to make the drawing intelligible, illustration of an interlayer insulating film 22 shown in FIG. 1 is omitted.

As shown in FIG. 1, for a semiconductor substrate (a semiconductor wafer) 1 including a p-type single crystalline silicon having a specific resistance of around 1 to 10 Ωcm, an element isolation region (which corresponds to an element isolation region 2 described later, but is not shown here) for isolating elements is formed, and, in an active region isolated (defined) by the element isolation region, a p-type well PW1 is formed. For the p-type well PW1 in the memory cell region, the memory cell MC of nonvolatile memory including a memory transistor and a control transistor (selection transistor) as shown in FIG. 1 is formed. In each of the memory cell regions, actually, a plurality of memory cells MC is formed in an array, and FIG. 1 shows a cross section of one memory cell MC among these. Each memory cell region is isolated electrically from other regions by the element isolation region.

As shown in FIGS. 1 to 3, the memory cell MC of the nonvolatile memory of the semiconductor device in the embodiment is a split gate type memory cell, in which two MISFETs of a control transistor (selection transistor) having a control gate electrode (a selection gate electrode) CG and a memory transistor having a memory gate electrode (a gate electrode for a memory) MG are connected.

A MISFET (Metal Insulator Semiconductor Field Effect Transistor) including a gate insulating film including an electric charge accumulation part (an electric charge accumulation layer), and a memory gate electrode MG is called a memory transistor (a transistor for memory), and a MISFET including the gate insulating film and the control gate electrode CG is called a control transistor (a selection transistor, a transistor for selecting a memory cell). Accordingly, the memory gate electrode MG is the gate electrode of a memory transistor, the control gate electrode CG is the gate electrode of a control transistor, and the control gate electrode CG and the memory gate electrode MG are gate electrodes constituting the nonvolatile memory (its memory cell).

Hereinafter, the structure of the memory cell MC is explained specifically.

As shown in FIGS. 1 and 2, the memory cell MC of the nonvolatile memory has n-type semiconductor regions MS and MD for a source and a drain, formed in a p-type well PW1 of the semiconductor substrate 1, the control gate electrode CG formed in an upper part of the semiconductor substrate 1 (the p-type well PW1), and the memory gate electrode MG that is formed in an upper part of the semiconductor substrate 1 (the p-type well PW1) and is adjacent to the control gate electrode CG. And, the memory cell MC of the nonvolatile memory furthermore has an insulating film (a gate insulating film) 3 formed between the control gate electrode CG and the semiconductor substrate 1 (the p-type well PW1), and an insulating film 5 formed between the memory gate electrode MG and the semiconductor substrate 1 (the p-type well PW1), and between the memory gate electrode MG and the control gate electrode CG.

The control gate electrode CG and the memory gate electrode MG extend along the main surface of the semiconductor substrate 1, and are arranged side by side, with the insulating film 5 interposed between the opposing side surfaces (side walls) of these electrodes. The extending direction of the control gate electrode CG and the memory gate electrode MG is the direction perpendicular to the plane of paper of FIG. 1. The control gate electrode CG and the memory gate electrode MG are formed in the upper part of the semiconductor substrate 1 (the p-type well PW1) between the semiconductor region MD and the semiconductor region MS via the insulating films 3 and 5 (the control gate electrode CG is formed via the insulating film 3, and the memory gate electrode MG is formed via the insulating film 5). The memory gate electrode MG is located on the semiconductor region MS side and the control gate electrode CG is located on the semiconductor region MD side.

The control gate electrode CG and the memory gate electrode MG are adjacent to each other with the insulating film 5 interposed between them, and the memory gate electrode MG is formed in a sidewall spacer shape over the side surface (the side wall) of the control gate electrode CG via the insulating film 5. The insulating film 5 extends over both regions of a region between the memory gate electrode MG and the semiconductor substrate 1 (the p-type well PW1), and a region between the memory gate electrode MG and the control gate electrode CG.

The insulating film 3 formed between the control gate electrode CG and the semiconductor substrate 1 (the p-type well PW1) (the insulating film 3 under the control gate electrode CG) functions as the gate insulating film of the control transistor, and the insulating film 5 between the memory gate electrode MG and the semiconductor substrate 1 (the p-type well PW1) (the insulating film 5 under the memory gate electrode MG) functions as the gate insulating film of the memory transistor (a gate insulating film including an electric charge accumulation part).

In the embodiment, the insulating film 3 is a high-permittivity film having a permittivity (a relative permittivity) higher than that of a silicon nitride film (a High-k film). In the application, a High-k film, high-permittivity film or a high-permittivity gate insulating film means a film having a permittivity (a relative permittivity) higher than that of silicon nitride film. A metal oxide film such as a hafnium oxide film, a zirconium oxide film, an aluminum oxide film, a tantalum oxide film, or a lanthanum oxide film may be used as the insulating film 3.

The insulating film 3 being a high-permittivity film may be formed directly on the surface (the silicon surface) of the semiconductor substrate 1 (the p-type well PW1) (an interface layer 3a is omitted), or, as shown in FIG. 2, the insulating interface layer (an insulating layer, insulating film) 3a including a silicon oxide film or a silicon oxynitride film may be provided at the interface between the insulating film 3 being a high-permittivity film and the semiconductor substrate 1 (the p-type well PW1). By providing the interface layer 3a including silicon oxide or silicon oxynitride, it is possible to form the interface between the gate insulating film and the semiconductor substrate (the silicon surface thereof) of the control transistor to an $SiO_2/Si$ (or SiON/Si) structure, to reduce a number of defects such as traps, and to improve driving capability and reliability.

The insulating film 5 includes a stacked film having a silicon oxide film (an oxide film) 5a, a silicon nitride film (a nitride film, electric charge accumulation layer) 5b over the silicon oxide film 5a, and a silicon oxide film (an oxide film) 5c over the silicon nitride film 5b.

In FIG. 1, to make the drawing intelligible, the stacked film of the silicon oxide film 5a, the silicon nitride film 5b and the silicon oxide film 5c is shown simply as the insulating film 5. But, actually, as shown in FIG. 2, the insulating film 5 includes the stacked film of the silicon oxide film 5a, the silicon nitride film 5b over the silicon oxide film 5a, and the silicon oxide film 5c over the silicon nitride film 5b.

Because the insulating film 5 has the stacked structure of the silicon oxide film 5a, the silicon nitride film 5b and the silicon oxide film 5c, the insulating film 5 extending in the region between the memory gate electrode MG and the semiconductor substrate 1 (the p-type well PW1) and the region between the memory gate electrode MG and the control gate electrode CG may be considered as a stacked gate insulating film (a gate insulating film of a stacked structure). The insulating film 5 between the memory gate electrode MG and the semiconductor substrate 1 (the p-type well PW1) functions as the gate insulating film of the memory transistor, and the insulating film 5 between the memory gate electrode MG and the control gate electrode CG functions as an insulating film for insulating (isolating electrically) between the memory gate electrode MG and the control gate electrode CG.

In the insulating film 5, the silicon nitride film 5b is an insulating film for accumulating electric charges, and functions as an electric charge accumulation layer (an electric charge accumulation part). The silicon nitride film 5b is a trapping insulating film formed in the insulating film 5. Consequently, the insulating film 5 may be considered as an insulating film including the electric charge accumulation part (the electric charge accumulation layer, the silicon nitride film 5b).

The silicon oxide film 5c and the silicon oxide film 5a located over and below the silicon nitride film 5b can function as an electric charge blocking layer (an electric charge blocking film, electric charge confinement layer). The structure of sandwiching the silicon nitride film 5b with the silicon oxide film 5c and the silicon oxide film 5a enables the accumulation of electric charges in the silicon nitride film 5b. The silicon oxide film 5a, the silicon nitride film 5b and the silicon oxide film 5c may also be considered as an ONO (oxide-nitride-oxide) film.

Figure 4:
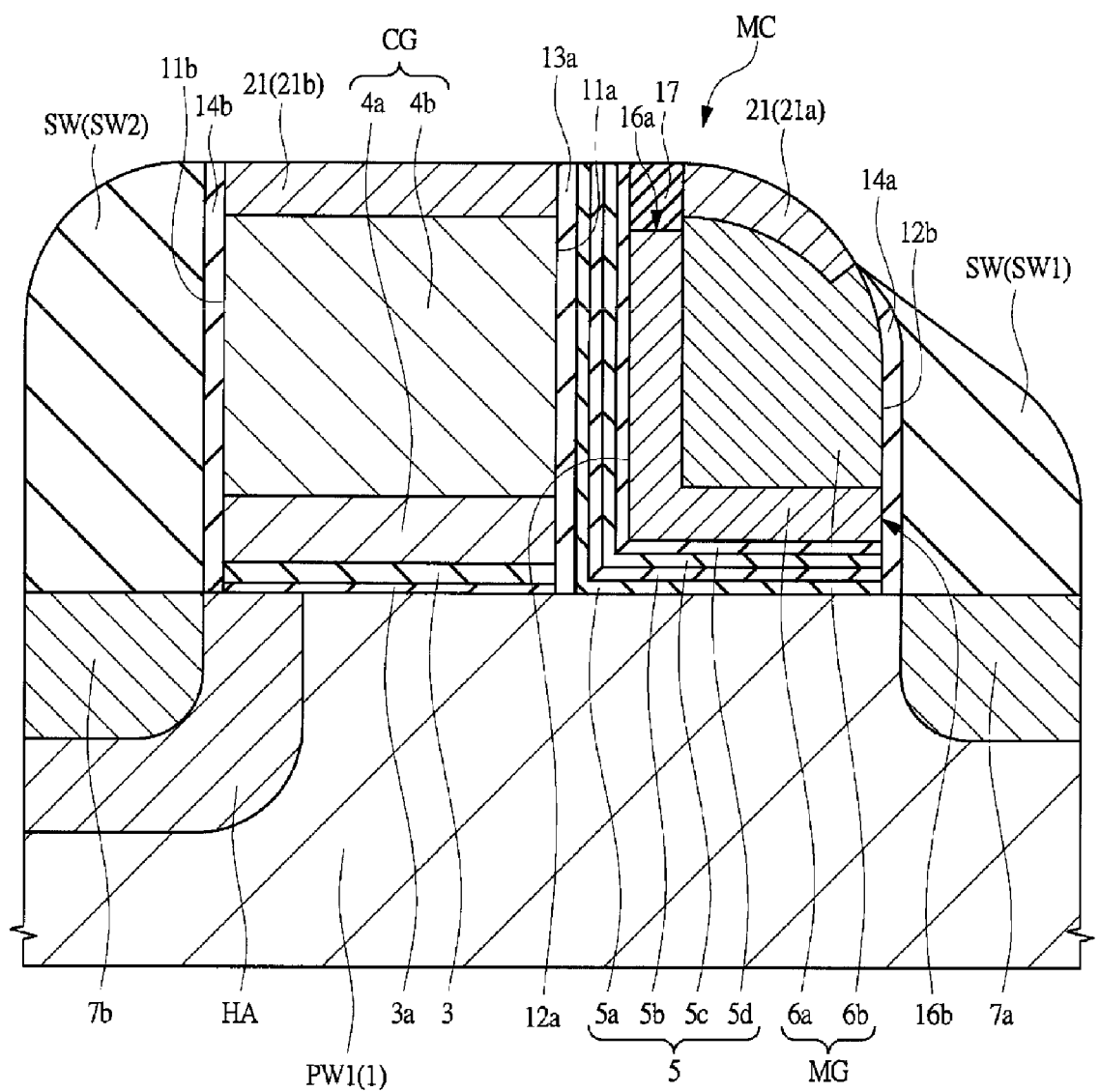
FIG. 4 is a cross-sectional view of essential parts showing a modification of a semiconductor device in an embodiment of the present invention.

As a modification, as shown in FIG. 4, it is also possible to form the insulating film 5 as a stacked film of the silicon oxide film 5a, the silicon nitride film (the electric charge accumulation layer) 5b over the silicon oxide film 5a, the silicon oxide film 5c over the silicon nitride film 5b, and an insulating film 5d over the silicon oxide film 5c, and to set the insulating film 5d of the uppermost layer to be a high-permittivity film (a High-k film) having a permittivity (a relative permittivity) higher than that of a silicon nitride film. FIG. 4 is a cross-sectional view of essential parts showing the modification of the semiconductor device in the embodiment, and shows a cross-sectional region corresponding to that in FIG. 2. A metal oxide film such as a hafnium oxide film, a zirconium oxide film, an aluminum oxide film, a tantalum oxide film or a lanthanum oxide film may be used as the insulating film 5d.

The semiconductor region MS is a semiconductor region functioning as one of a source region and a drain region, and the semiconductor region MD is a semiconductor region functioning as the other of the source region and the drain region. The semiconductor region MS is a semiconductor region functioning as the source region, and the semiconductor region MD is a semiconductor region functioning as the drain region. The semiconductor regions MS and MD include a semiconductor region into which an n-type impurity has been introduced (an n-type impurity diffusion layer), and each has an LDD (lightly doped drain) structure. The semiconductor region MS for the source has an $n^-$-type semiconductor region 7a and an $n^+$-type semiconductor region 8a having an impurity concentration higher than that of the $n^-$-type semiconductor region 7a, and the semiconductor region MD for the drain has an $n^-$-type semiconductor region 7b and an $n^+$-type semiconductor region 8b having an impurity concentration higher than that of the $n^-$-type semiconductor region 7b. The $n^+$-type semiconductor region 8a is deeper in a junction depth and higher in the impurity concentration than the $n^-$-type semiconductor region 7a, and the $n^+$-type semiconductor region 8b is deeper in the junction depth and higher in the impurity concentration than the $n^-$-type semiconductor region 7b.

Over the side walls of the memory gate electrode MG and the control gate electrode CG (side walls on the sides that are not adjacent to each other), a sidewall spacer (a sidewall, a side wall insulating film) SW including an insulating film (a silicon oxide film, a silicon nitride film, or a stacked film of these films) is formed. The sidewall spacer SW is formed over the side wall (the side surface) of the memory gate electrode MG on the other side of the side adjacent to the control gate electrode CG via the insulating film 5, and over the side wall (the side surface) of the control gate electrode CG on the other side of the side adjacent to the memory gate electrode MG via the insulating film 5.

Out of the side walls (the side surfaces) of the control gate electrode CG, the side wall (the side surface) on the side adjacent to the memory gate electrode MG via the insulating film 5 shall be given a symbol 11a to be referred to as a side wall (a side surface) 11a, and the side wall (the side surface) on the other side of the side adjacent to the memory gate electrode MG via the insulating film 5 shall be given a symbol 11b to be referred to as a side wall (a side surface) 11b. The side wall 11a and the side wall 11b of the control gate electrode CG are located on the sides opposite to each other. Moreover, out of the side walls (the side surfaces) of the memory gate electrode MG, the side wall (the side surface) on the side adjacent to the control gate electrode CG via the insulating film 5 shall be given a symbol 12a to be referred to as a side wall (a side surface) 12a, and the side wall (the side surface) on the other side of the side adjacent to the control gate electrode CG via the insulating film 5 shall be given a symbol 12b to be referred to as a side wall (a side surface) 12b. The side wall 12a and the side wall 12b of the memory gate electrode MG are located on the sides opposite to each other. The sidewall spacer SW formed over the side wall (the side surface) 12b of the memory gate electrode MG shall be given a symbol SW1 to be referred to as a sidewall spacer SW1. The sidewall spacer SW formed over the side wall (the side surface) 11b of the control gate electrode CG shall be given a symbol SW2 to be referred to as a sidewall spacer SW2.

The sidewall spacer SW1 is formed over the side wall 12b of the memory gate electrode MG. The sidewall spacer SW1 is not formed directly on the side wall 12b of the memory gate electrode MG, but formed over the side wall 12b of the memory gate electrode MG via the side wall insulating film 14a. The side wall insulating film 14a is formed over the side wall 12b of the memory gate electrode MG, and the sidewall spacer SW1 is formed over the side wall 12b of the memory gate electrode MG via the side wall insulating film 14a. The sidewall spacer SW2 is formed over the side wall 11b of the control gate electrode CG. The sidewall spacer SW2 is not formed directly on the side wall 11b of the control gate electrode CG, but formed over the side wall 11b of the control gate electrode CG via the side wall insulating film 14b. The side wall insulating film 14b is formed over the side wall 11b of the control gate electrode CG, and the sidewall spacer SW2 is formed over the side wall 11b of the memory gate electrode MG via the side wall insulating film 14b. The side wall insulating film 14a is interposed between the memory gate electrode MG (its side wall 12b) and the sidewall spacer SW1. The side wall insulating film 14b is interposed between the control gate electrode CG (its side wall 11b) and the sidewall spacer SW2.

Over the side wall 11a of the control gate electrode CG, the side wall insulating film 13a is formed. Between the memory gate electrode MG (its side wall 12a) and the control gate electrode CG (its side wall 11a), the side wall insulating film 13a and the insulating film 5 are interposed. The side wall insulating film 13a is interposed between a part of the insulating film 5 located between the memory gate electrode MG (its side wall 12a) and the control gate electrode CG (its side wall 11a), and the control gate electrode CG (its side wall 11a). Between the memory gate electrode MG (its side wall 12a) and the control gate electrode CG (its side wall 11a), the side wall insulating film 13a and the insulating film 5 are stacked in the order from the control gate electrode CG side. The side wall insulating film 13a is not formed between the memory gate electrode MG (its lower surface) and the semiconductor substrate 1 (the p-type well PW1). The insulating film 5 also extends between the memory gate electrode MG (its lower surface) and the semiconductor substrate 1 (the p-type well PW1).

The n$^-$-type semiconductor region 7a of the source part is formed by self-alignment technique for the side surface of the side wall insulating film 14a over the side wall 12b of the memory gate electrode MG (the side surface on the side opposite to the side in contact with the memory gate electrode MG), and the n$^+$-type semiconductor region 8a is formed by self-alignment technique for the side surface of the sidewall spacer SW1 (the side surface on the side opposite to the side in contact with the side wall insulating film 14a). Consequently, the low-concentration n$^-$-type semiconductor region 7a is formed under (below) the sidewall spacer SW1 over the side wall of the memory gate electrode MG, and the high-concentration n$^+$-type semiconductor region 8a is formed outside the low-concentration n$^-$-type semiconductor region 7a. Accordingly, the low-concentration n$^-$-type semiconductor region 7a is formed to be adjacent to a channel region of the memory transistor, and the high-concentration n$^+$-type semiconductor region 8a is formed to contact (is adjacent to) the low-concentration n$^-$-type semiconductor region 7a to be separated from the channel region of the memory transistor by the portion of the n$^-$-type semiconductor region 7a.

The n$^-$-type semiconductor region 7b of the drain part is formed by self-alignment technique for the side surface of the side wall insulating film 14b over the side wall of the control gate electrode CG (the side surface on the side opposite to the side in contact with the control gate electrode CG), and the n$^+$-type semiconductor region 8b is formed by self-alignment technique for the side surface of the sidewall spacer SW2 (the side surface on the side opposite to the side in contact with the side wall insulating film 14b). Consequently, the low-concentration type semiconductor region 7b is formed under (below) the sidewall spacer SW2 over the side wall of the control gate electrode CG, and the high-concentration n$^+$-type semiconductor region 8b is formed outside the low-concentration n$^-$-type semiconductor region 7b. Accordingly, the low-concentration type semiconductor region 7b is formed to be adjacent to the channel region of the control transistor, and the high-concentration n$^+$-type semiconductor region 8b is formed to contact (is adjacent to) the low-concentration n$^-$-type semiconductor region 7b to be separated from the channel region of the memory transistor by the portion of the n$^-$-type semiconductor region 7b.

The channel region of the memory transistor is formed under the insulating film 5 under the memory gate electrode MG, and that of the control transistor is formed under the insulating film 3 under the control gate electrode CG.

For the n$^-$-type semiconductor region 7b of the drain part, a halo region HA for suppressing short-channel characteristics (punch through) is formed. In the p-type well PW1, the halo region HA is formed to encompass (cover) the n$^-$-type semiconductor region 7b. The halo region HA has an inverse conductivity type with respect to the n$^-$-type semiconductor region 7b, has the same conductivity type as that of the p-type well PW1, has an impurity, concentration (p type impurity concentration) higher than that of the p-type well PW1, and is of a p-type (a p-type semiconductor region).

The halo region HA is formed for the n⁻-type semiconductor region 7b for the drain (is formed to encompass the n⁻-type semiconductor region 7b in the p-type well PW1), and is formed for suppressing the short-channel characteristics of the control transistor. The halo region HA may not be formed for the n⁻-type semiconductor region 7a for the source, but may also be formed for suppressing the short-channel characteristics of the memory transistor.

The control gate electrode CG includes a conductor (a conductor film). In the embodiment, the control gate electrode CG is formed from a metal film 4a and a silicon film 4b over the metal film 4a. The control gate electrode CG is constituted by a stacked film (a stacked structure) of the metal film (a metal layer, a metal gate film) 4a in contact with the gate insulating film (the insulating film 3 being a high-permittivity gate insulating film) and the silicon film 4b over the metal film 4a. Specifically, the control gate electrode CG includes the patterned stacked film of the metal film 4a and the silicon film 4b. The control gate electrode CG has the metal film 4a in contact with the gate insulating film (the insulating film 3 being a high-permittivity gate insulating film), and therefore it is a metal gate electrode. The metal film 4a is a conductor film showing metallic conduction. An aluminum (Al) film, a titanium (Ti) film, a zirconium (Zr) film, a lanthanum (La) film, or other films may be used. The silicon film 4b is preferably a doped polysilicon film (a polycrystalline silicon film into which an impurity has been introduced), and is made to have a low resistivity by the introduction of an impurity (an n-type impurity).

The memory gate electrode MG is formed from a stacked film of a metal film (a metal layer, a metal gate film) 6a and a silicon film 6b over the metal film 6a. The metal film 6a constituting the memory gate electrode MG contacts the insulating film 5, and the silicon film 6b constituting the memory gate electrode MG does not contact the insulating film 5. The metal film 6a constituting the memory gate electrode MG is interposed between the silicon film 6b constituting the memory gate electrode MG and the insulating film 5. The insulating film 5 and the metal film 6a of the memory gate electrode MG are interposed between the silicon film 6b of the memory gate electrode MG and the semiconductor substrate 1 (the p-type well PW1). The side wall insulating film 13a, the insulating film 5 and the metal film 6a of the memory gate electrode MG are interposed between the silicon film 6b of the memory gate electrode MG and the control gate electrode CG. The memory gate electrode MG has the metal film 6a in contact with the insulating film 5 of a portion located between the memory gate electrode MG and the semiconductor substrate 1 (the p-type well PW1), and it is a metal gate electrode. The metal film 6a is a conductor film showing metallic conduction, and in particular, one capable of being oxidized is furthermore advantageous. For example, an aluminum (Al) film, a titanium (Ti) film, a zirconium (Zr) film, a lanthanum (La) film, or other films may be used. The silicon film 6b is preferably a doped polysilicon film (a polycrystalline silicon film into which an impurity has been introduced), and is made to have a low resistivity by the introduction of an impurity (an n-type impurity).

On an upper end part 16a side of the metal film 6a constituting the memory gate electrode MG, a metal oxide portion 17 having insulating properties is formed. The metal oxide portion 17 is formed by oxidation of a part of the metal film 6a, and the upper end part 16a of the metal film 6a is adjacent to (in contact with) the metal oxide portion 17. The metal oxide portion 17 is formed continuously to the metal film 6a over the upper end part 16a of the metal film 6a. Consequently, the upper end part of the metal film 6a has been oxidized to form the metal oxide portion 17 in the upper end part of the metal film 6a. Because the metal oxide portion 17 is formed by the oxidation of a part of the metal film 6a, the metal element constituting the metal oxide portion 17 is the same as the metal element constituting the metal film 6a. When the metal film 6a is an aluminum (Al) film, the metal oxide portion 17 includes aluminum oxide. Moreover, because the upper end part of the metal film 6a is oxidized to form the metal oxide portion 17, the metal oxide portion 17 is sandwiched vertically by the interlayer insulating film 22 and metal film 6a, and is sandwiched horizontally (in a gate length direction) by the silicon film 6b constituting the memory gate electrode MG, a metal silicide layer 21a formed in an upper part of the silicon film 6b, and the insulating film 5. The metal oxide portion 17 is surrounded by the silicon film 6b constituting the memory gate electrode MG, the metal silicide layer 21a formed in the upper part of the silicon film 6b, the metal film 6a, the insulating film 5, and the interlayer insulating film 22.

A side end part 16b of the metal film 6a constituting the memory gate electrode MG is adjacent to (in contact with) the side wall insulating film 14a formed over the side wall 12b of the memory gate electrode MG, and has scarcely been oxidized. The upper end part 16a and the side end part 16b of the metal film 6a constituting the memory gate electrode MG are located on sides opposite to each other in the metal film 6a extending from between the control gate electrode CG and the memory gate electrode MG to between the memory gate electrode MG and the semiconductor substrate 1. In the metal film 6a extending in a direction parallel to the semiconductor substrate 1 with a prescribed thickness, the end part on a side exposed from the side wall 12b of the memory gate electrode MG is called the side end part 16b of the metal film 6a. In the metal film 6a extending in a direction parallel to the side wall 11a of the control gate electrode CG with a prescribed thickness over the side wall 11a of the control gate electrode CG, the end part located on the upper part side of the memory gate electrode MG is called the upper end part 16a of the metal film 6a.

In an upper part (an upper surface) of the silicon film 6b constituting the memory gate electrode MG, an upper part (an upper surface) of the silicon film 4b constituting the control gate electrode CG, and upper parts (upper surfaces, surfaces) of the n⁺-type semiconductor regions 8a and 8b, the metal silicide layer (metal silicide film) 21 is formed by a Salicide (Self Aligned Silicide) technology. The metal silicide layer 21 includes a cobalt silicide layer, a nickel silicide layer, and a platinum-added nickel silicide layer. The metal silicide layer 21 can lower diffusion resistance and contact resistance. The metal silicide layer 21 formed in the upper part (the upper surface) of the silicon film 6b constituting the memory gate electrode MG shall be given a symbol 21a to be called a metal silicide layer 21a. The metal silicide layer 21 formed in the upper part (the upper surface) of the silicon film 4b constituting the control gate electrode CG shall be given a symbol 21b to be called a metal silicide layer 21b. The metal film 4a and the silicon film 4b constituting the control gate electrode CG together with the metal silicide layer 21b in the upper part of the silicon film 4b collectively may also be considered as the control gate electrode CG, and the metal film 6a and the silicon film 6b constituting the memory gate electrode MG together with the metal silicide layer 21a in the upper part of the silicon film 6b collectively may also be considered as the memory gate electrode MG. The metal film 6a and the silicon film 6b constituting the memory gate electrode MG together with the metal silicide layer 21a in the upper part of the silicon film 6b, and the metal oxide portion 17 in the upper end part of the metal film 6a collectively may also be considered as the memory gate electrode MG (as described above, the metal oxide portion 17 has insulating properties). From the viewpoint of preventing short circuit between the memory gate electrode MG and the control gate electrode CG as far as possible, no metal silicide layer 21 may not be formed in the upper part of one or both of the memory gate electrode MG and the control gate electrode CG.

Over the semiconductor substrate 1, the memory gate electrode MG and the sidewall spacer SW, the interlayer insulating film 22 is formed as an insulating film to cover the control gate electrode CG, the memory gate electrode MG and the sidewall spacer SW. The interlayer insulating film 22 includes a single film of a silicon oxide film, and a stacked film of a silicon nitride film and a silicon oxide film formed over the silicon nitride film, which is thicker than the silicon nitride film. The upper surface of the interlayer insulating film 22 is planarized.

In the interlayer insulating film 22, a contact hole (an opening part, a through hole) CNT is formed. In the contact hole CNT, an electroconductive plug PG is embedded as a conductor part (a conductor part for connection).

The plug PG is formed from a thin barrier conductor film formed over the bottom part and the side wall (the side surface) of the contact hole CNT, and a main conductor film formed to be embedded in the contact hole CNT over the barrier conductor film. To simplify the drawing, FIG. 1 shows the barrier conductor film and the main conductor film constituting the plug PG integrally. The barrier conductor film constituting the plug PG may be a titanium film, a titanium nitride film, or a stacked film of these film. The main conductor film constituting the plug PG may be a tungsten film.

The contact hole CNT and the plug PG embedded in the contact hole CNN are formed in the upper part of the $n^+$-type semiconductor regions 8a and 8b, the control gate electrode CG, the memory gate electrode MG, and other places. In the bottom part of the contact hole CNT, a part of the main surface of the semiconductor substrate 1, such as a part of the $n^+$-type semiconductor regions 8a and 8b (the metal silicide layer 21 over the surface of the $n^+$-type semiconductor regions 8a and 8b), a part of the control gate electrode CG (the metal silicide layer 21 over the surface of the control gate electrode CG), a part of the memory gate electrode MG (the metal silicide layer 21 over the surface of the memory gate electrode MG), is exposed. And, to the exposed part (the exposed part in the bottom part of the contact hole CNT), the plug PG is connected. FIG. 1 shows a cross section in which a part of the $n^+$-type semiconductor region 8b (the metal silicide layer 21 over the surface of the $n^+$-type semiconductor region 8b) is exposed in the bottom part of the contact hole CNT and is connected electrically with the plug PG embedded in the contact hole CNT.

Over the interlayer insulating film 22 in which the plug PG is embedded, wiring (a wiring layer) M1 is formed. The wiring M1 is a damascene wiring (embedded wiring), and is embedded in a wiring trench provided in an insulating film formed over the interlayer insulating film 22 (although not shown in FIG. 1, it corresponds to an insulating film 24 described later). The wiring M1 is connected electrically with the source region of the memory transistor (the semiconductor region MS), the drain region of the control transistor (the semiconductor region MD), the control gate electrode CG, the memory gate electrode MG or the like via the plug PG. FIG. 1 shows, as a wiring M1, the wiring M1 connected electrically with the drain region of the control transistor (the semiconductor region MD) via the plug PG. Although a wiring and an insulating film of a furthermore upper layer are also formed, the illustration and the explanation are omitted. The wiring M1 and a wiring in a layer upper than the wiring M1 are not limited to a damascene wiring (an embedded wiring), but may be formed by patterning a conductor film for wiring. The wiring may be a tungsten wiring, an aluminum wiring, or other wiring.

FIG. 5 is a table showing an example of application conditions of a voltage to each site of a selection memory cell in "WRITE," "ERASE" and "READ" in the embodiment. The table in FIG. 5 describes a voltage Vmg applied to the memory gate electrode MG, a voltage Vs applied to the source region (the semiconductor region MS), a voltage Vcg applied to the control gate electrode CG, a voltage Vd applied to the drain region (the semiconductor region MD), and a voltage Vb applied to the p-type well PW1 of the memory cell (the selection memory cell) in FIGS. 1 to 3, in each of "WRITE," "ERASE" and "READ." The table in FIG. 5 shows a favorable application condition of the voltage, and the condition is not limited to this but can change as needed. In the embodiment, "WRITE" is defined as injection of an electron into the silicon nitride film 5b being the electric charge accumulation layer (the electric charge accumulation part) in the insulating film 5 of the memory transistor, and "ERASE" is defined as injection of a hole.

Hot electron write, which is called SSI (Source Side Injection) system, can be used as a write system. For example, the voltage shown in a column of "WRITE" in FIG. 5 is applied to each site of the selection memory cell for which the write is performed to inject an electron in the silicon nitride film 5b in the insulating film 5 of the selection memory cell. The hot electron is generated in the channel region (between the source and drain) under between two gate electrodes (the memory gate electrode MG and the control gate electrode CG) and then injected into the silicon nitride film 5b being the electric charge accumulation layer (the electric charge accumulation part) in the insulating film 5 under the memory gate electrode MG. The injected hot electron (electron) is trapped at a trap level in the silicon nitride film 5b in the insulating film 5. Consequently, a threshold voltage of the memory transistor rises.

A BTBT (Band-To-Band Tunneling) hot hole injection erase system can be used as the erase method. Erase is performed by injecting the hole generated by the BTBT (Band-To-Band Tunneling) into the electric charge accumulation part (the silicon nitride film 5b in the insulating film 5). The voltage in a column of "ERASE" in FIG. 5 is applied to each site of the selection memory cell for which erase is performed to generate a hole by a BTBT (Band-To-Band Tunneling) phenomenon. Then, the hole is accelerated by electric field to be injected into the silicon nitride film 5b in the insulating film 5 in the selection memory cell. Consequently, the threshold voltage of the memory transistor lowers.

In read, a voltage in the column of "READ" in FIG. 5 is applied to respective sites of the selection memory cell from which the read is performed. By setting the voltage Vmg applied to the memory gate electrode MG in read to a value between the threshold voltage of the memory transistor in a write state and that of the memory transistor in an erase state, the write state can be discriminated from the erase state.

Next, a method of manufacturing the semiconductor device in the embodiment is explained.

Figure 6:
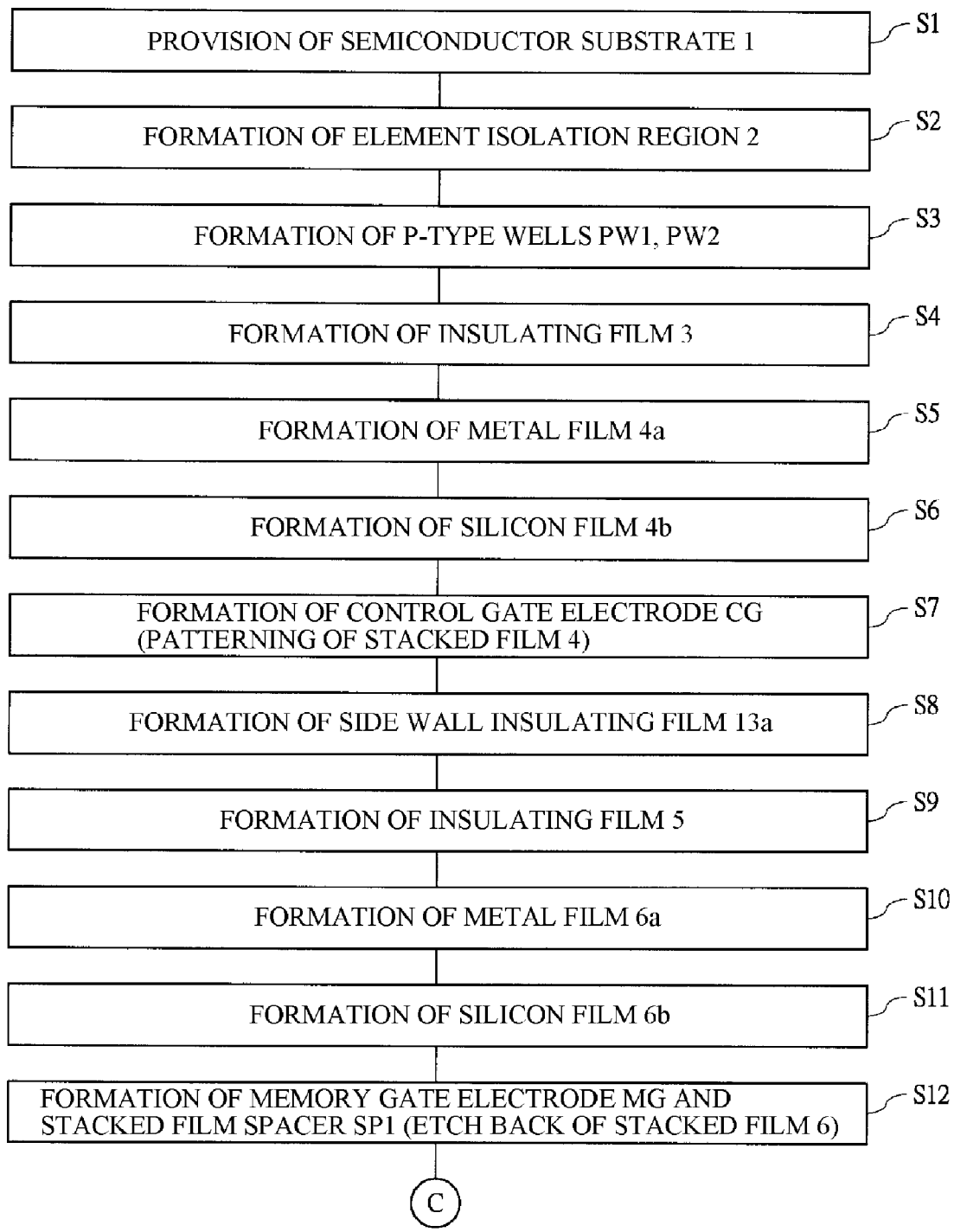
FIG. 6 is a process flow chart partially showing process of manufacturing a semiconductor device in an embodiment of the present invention.
Figure 7:
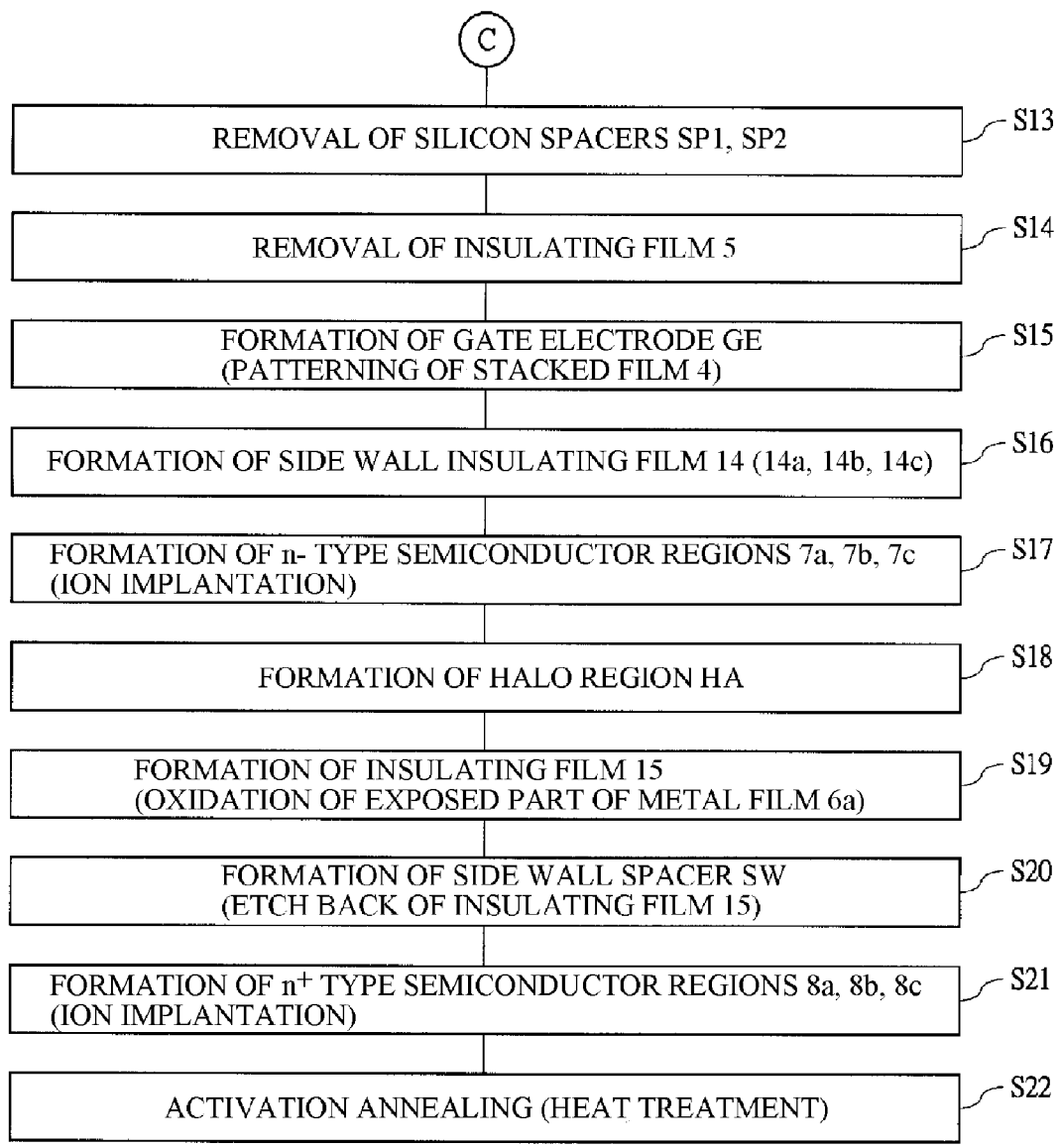
FIG. 7 is a process flow chart partially showing process of manufacturing a semiconductor device in an embodiment of the present invention.
Figure 16:
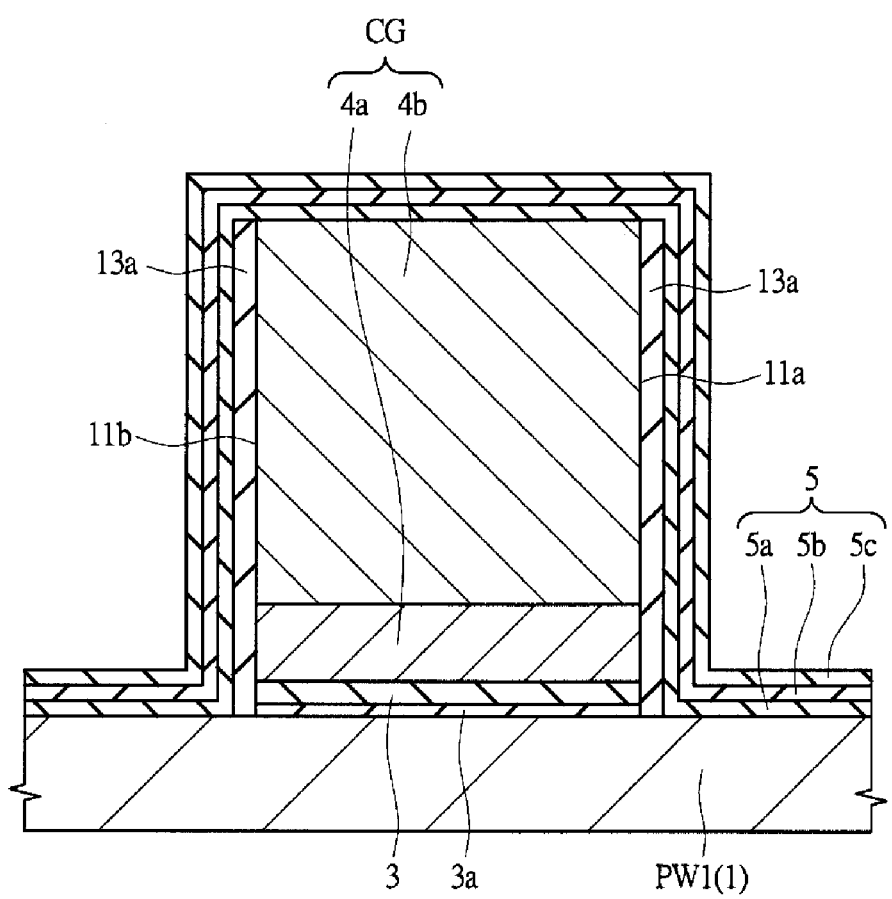
FIG. 16 is a partially enlarged cross-sectional view of FIG. 15.
Figure 17:
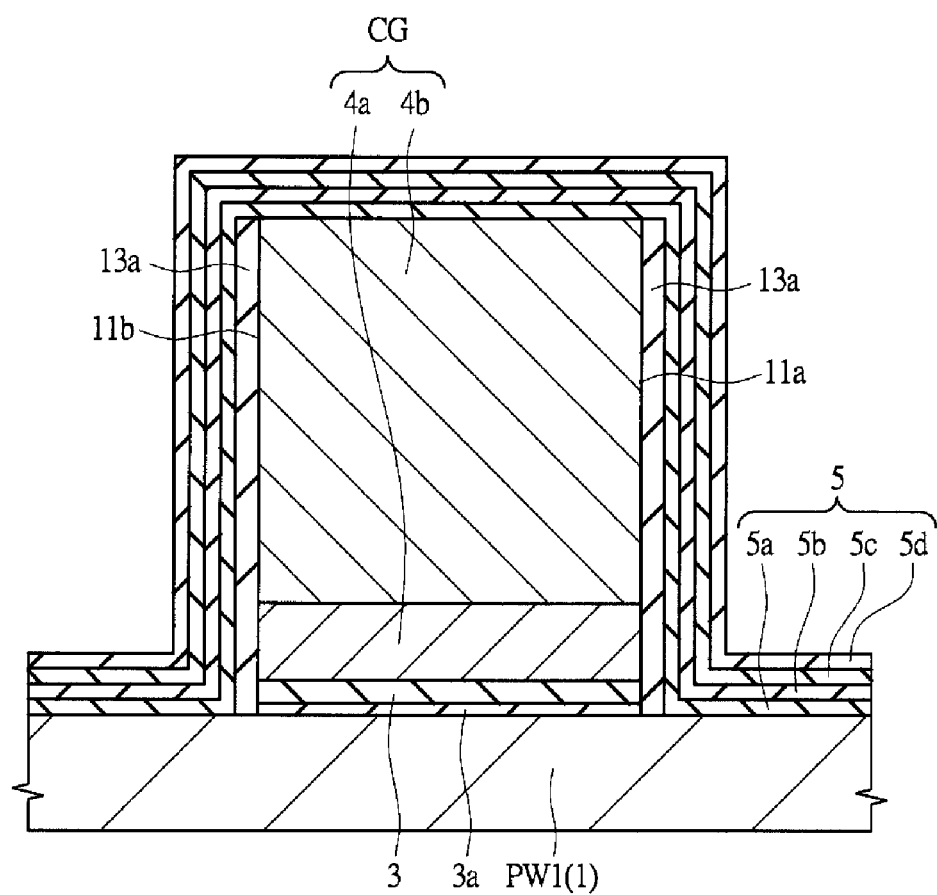
FIG. 17 is a partially enlarged cross-sectional view of FIG. 15 in a modification.

FIGS. 6 and 7 are process flow charts showing a part of the process of manufacturing a semiconductor device in the embodiment. FIGS. 8 to 33 are cross-sectional views of essential parts in the process of manufacturing a semiconductor device in the embodiment. Among these, cross-sectional views in FIGS. 8 to 15 and 18 to 33 show cross-sectional views of essential parts of a memory cell region (a region in which the memory cell MC of the nonvolatile memory is formed) 1A and a peripheral circuit region (a region in which a circuit other than the nonvolatile memory is formed) 1B, and show how the memory cell MC is formed in the memory cell region 1A and the MISFET is formed in the peripheral circuit region 1B. FIGS. 16 and 17 correspond to the partially enlarged cross-sectional view of FIG. 15. The memory cell region 1A and the peripheral circuit region 1B are formed in the same semiconductor substrate 1. The memory cell region 1A and the peripheral circuit region 1B may not be adjacent to each other. But, for easy understanding, in cross-sectional views in FIGS. 8 to 15 and 18 to 33, the peripheral circuit region 1B is next to the memory cell region 1A. The peripheral circuit means a circuit other than the nonvolatile memory, and includes processors such as a CPU, a controlling circuit, a sense amplifier, a column decoder, a row decoder, and an input/output circuit. The MISFET formed in the peripheral circuit region 1B is a MISFET for the peripheral circuit.

In the embodiment, n-channel type MISFETs (the control transistor and the memory transistor) are formed in the memory cell region 1A, but, p-channel type MISFETs (the control transistor and the memory transistor) may be formed in the memory cell region 1A by reversing the conductivity type. Similarly in the embodiment, n-channel type MISFETs are formed in the peripheral circuit region 1B is explained, but p-channel type MISFETs may be formed in the peripheral circuit region 1B by reversing the conductivity type. Also, a CMISFET (a Complementary MISFET) may also be formed in the peripheral circuit region 1B.

Figure 8:
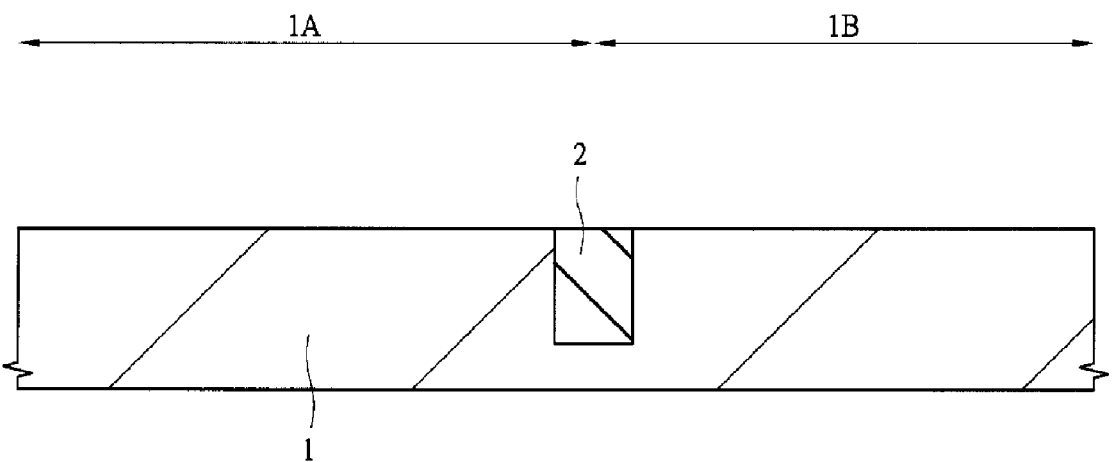
FIG. 8 is a cross-sectional view of essential parts in a process of manufacturing a semiconductor device in an embodiment of the present invention.

As shown in FIG. 8, first, the semiconductor substrate (the semiconductor wafer) 1 including a p-type single crystalline silicon having a specific resistance of around 1 to 10 Ωcm is provided (prepared) (Step S1 in FIG. 6). Next, in the main surface of the semiconductor substrate 1, the element isolation region (an inter-element isolation insulating region) 2 defining (demarcating) an active region is formed (Step S2 in FIG. 6). The element isolation region 2 includes an insulator such as silicon oxide, and can be formed by an STI (Shallow Trench Isolation) process or a LOCOS (Local Oxidization of Silicon) process. The element isolation region 2 may be formed by forming a trench for element isolation in the main surface of the semiconductor substrate 1 and then by embedding the trench for element isolation with an insulating film including silicon oxide.

Figure 9:
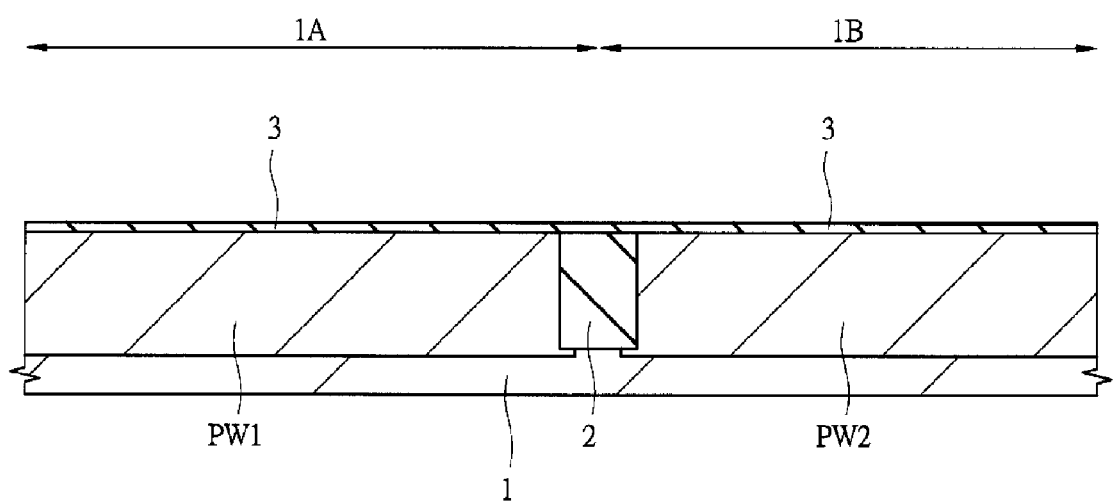
FIG. 9 is a cross-sectional view of essential parts in the process of manufacturing a semiconductor device subsequent to FIG. 8.

Next, as shown in FIG. 9, a p-type well PW1 is formed in the memory cell region 1A of the semiconductor substrate 1, and a p-type well PW2 is formed in the peripheral circuit region 1B (Step S3 in FIG. 6). The p-type wells PW1 and PW2 can be formed by ion implantation of a p-type impurity such as boron (B) into the semiconductor substrate 1. The p-type wells PW1 and PW2 are formed over a prescribed depth from the main surface of the semiconductor substrate 1.

In the embodiment, it is desirable not to perform channel dope ion implantation for the memory cell region 1A (the p-type well PW1) of the semiconductor substrate 1. Or, even when performing the channel dope ion implantation, it is preferable to make a dose amount small to lower the impurity concentration in the channel region. The channel dope ion implantation is, generally, an ion implantation for adjusting the threshold value of a transistor, and is performed for introducing (doping) an impurity into a region to be the channel region of the transistor later. In the embodiment, by not performing the channel dope ion implantation for introducing (doping) an impurity into a region to be the channel region of, the control transistor or the memory transistor later, or, even when performing the channel dope ion implantation, by making the dose amount small, it is possible to lower the impurity concentration in the channel region of the control transistor and the memory transistor.

Next, by wet etching using a hydrofluoric acid (HF) solution, a natural oxide film on the surface of the semiconductor substrate 1 is removed and then the surface of the semiconductor substrate 1 is cleaned (washed). Consequently, the surface (the silicon surface) of the semiconductor substrate 1 (the p-type wells PW1 and PW2) is exposed.

Next, over the main surface of the semiconductor substrate 1 (the surfaces of the p-type wells PW1 and PW2), the insulating film 3 is formed (Step S4 in FIG. 6). The insulating film 3 is, as described above, high-permittivity film (a High-k film), and the usable materials are as described above. The insulating film 3 can be formed using a sputtering process, an ALD (Atomic Layer Deposition) process, a CVD (Chemical, Vapor Deposition) process, or the like. The thickness of the insulating film 3 may be set to around from 0.5 to 3.0 nm.

Prior to forming the insulating film 3, it is possible to form the interface layer 3a including a silicon oxide film or a silicon oxynitride film over the surface of the semiconductor substrate 1 (the surfaces of the p-type wells PW1 and PW2) using a thermal oxidation process and then to form the insulating film 3 over the interface layer 3a (FIG. 9 does not show the interface layer 3a). When the interface layer 3a is formed, the insulating film 3 is formed over the interface layer 3a. Because the interface layer 3a is not formed over the element isolation region 2, the insulating film 3 is formed directly on the element isolation region 2. When the interface layer 3a is formed and then the insulating film 3 is formed over the interface layer 3a, it is possible to reduce the number of defects such as traps and then to improve driving capability and reliability. When the interface layer 3a is formed, the thickness of the interface layer 3a may be as small as from 0.5 to 3.0 nm.

Figure 10:
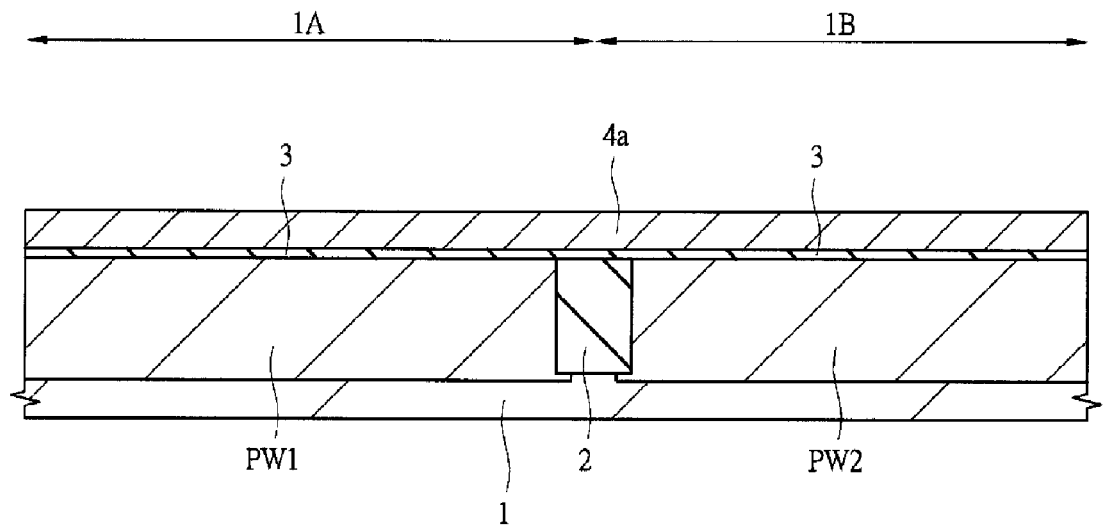
FIG. 10 is a cross-sectional view of essential parts in the process of manufacturing a semiconductor device subsequent to FIG. 9.

Next, as shown in FIG. 10, over the main surface (the whole main surface) of the semiconductor substrate 1 (over the insulating film 3), a metal film (a metal layer, a metal gate film) 4a for a metal gate (a metal gate electrode) is formed (deposited) (Step S5 in FIG. 6). Favorable materials as the metal film 4a are as described above. The metal film 4a may be formed by a sputtering process or the like. The thickness of the metal film 4a (formed film thickness) may be around from 10 to 20 nm.

Figure 11:
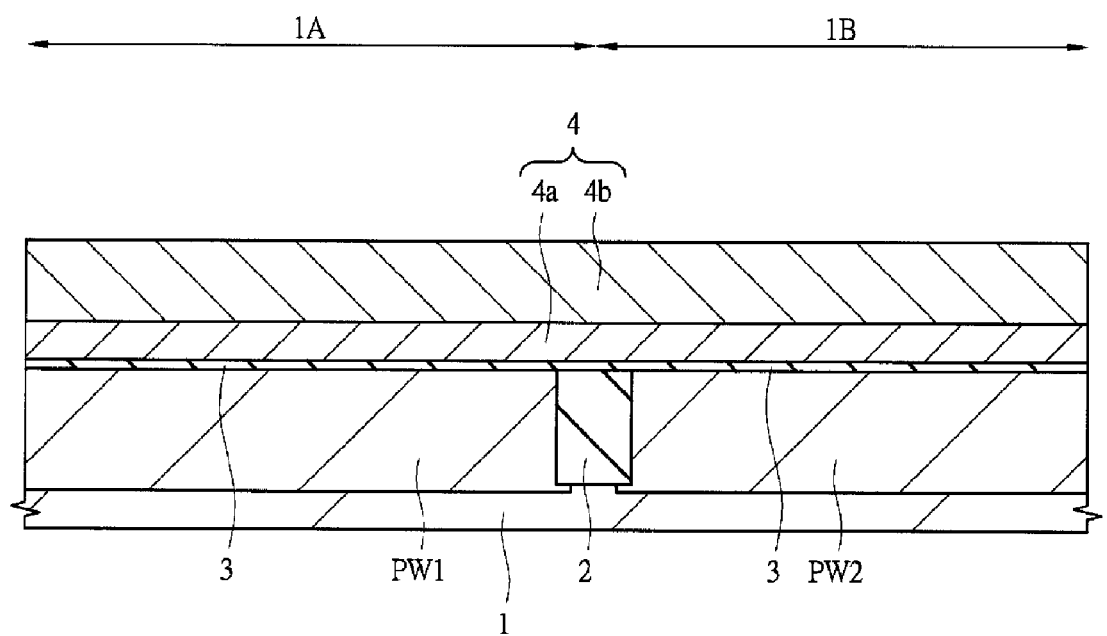
FIG. 11 is a cross-sectional view of essential parts in the process of manufacturing a semiconductor device subsequent to FIG. 10.

Next, as shown in FIG. 11, over the main surface (the whole main surface) of the semiconductor substrate 1 (over the metal film 4a), a silicon film 4b is formed (deposited) (Step S6 in FIG. 6).

The silicon film 4b includes a polycrystalline silicon film (a polysilicon film), and can be formed using a CVD process or the like. The thickness of the silicon film 4b (deposited film thickness) may be around from 50 to 200 nm. It is possible to form the silicon film 4b as an amorphous silicon film in film forming and then to form the amorphous silicon film into a polycrystalline silicon film by a subsequent heat treatment.

The silicon film 4b is more preferable if it has a low resistivity by introducing an impurity (an n-type impurity such as phosphorus (P) or arsenic (As), or a p-type impurity such as boron (B)). The impurity can be introduced in or after forming the silicon film 4b. When the impurity is introduced in forming the silicon film, by including a doping gas (a gas for adding an impurity) in a gas for forming the silicon film 4b, the silicon film 4b into which the impurity has been introduced can be formed. When an impurity is introduced after forming the silicon film, after forming the silicon film without introducing intentionally an impurity, an impurity is introduced into the silicon film by an ion implantation process or the like and then it is possible to form the silicon film 4b into which the impurity has been introduced.

Although it is also possible to omit the step of forming the silicon film 4b of Step S6 (the step of forming the control gate electrode CG by the metal film 4a without the silicon film 4b) by increasing the thickness of the metal film 4a formed in Step S5, it is more preferable to form the silicon film 4b over the metal film 4a in Step S6 (to form the control gate electrode CG by a stacked film of the metal film 4a and the silicon film 4b over the metal film 4A). The reason is that the metal film 4a having too large a thickness may cause such problems that the metal film 4a is easily peeled off or the substrate is damaged by overetching in patterning the metal film 4a, but that, by forming the control gate electrode CG by the stacked film of the metal film 4a and the silicon film 4b, the thickness of the metal film 4a can be decreased as compared with the case of forming the control gate electrode CG only with the metal film 4a, thus improving the above-mentioned problems. Moreover, when the silicon film 4b is formed over the metal film 4a, traditional processing methods and processes of polysilicon gate electrodes (gate electrodes made of polysilicon) can be followed. This is advantageous in terms of fine processing properties, manufacturing cost, and yield. Hereinafter, the stacked film of the metal film 4a and the silicon film 4b over the metal film 4a is called a stacked film 4.

Next, the stacked film 4 (the stacked film 4 of the silicon film 4b and the metal film 4a) of the memory cell region 1A is patterned by etching (preferably dry etching) to form the control gate electrode CG including the metal film 4a and the silicon film 4b over the metal film 4a (Step S7 in FIG. 6). The patterning process in Step S7 may be performed as follows.

A photoresist pattern is formed over the stacked film 4 (although not shown here, the photoresist pattern is formed in a region where the control gate electrode CG is to be formed in the memory cell region 1A and in the whole peripheral circuit region 1B) by using a photolithographic process. Then, by using the photoresist pattern as an etching mask, the stacked film 4 (the stacked film 4 of the silicon film 4b and the metal film 4a) is etched (dry-etched) to be patterned. After that, the photoresist pattern is removed.

Figure 12:
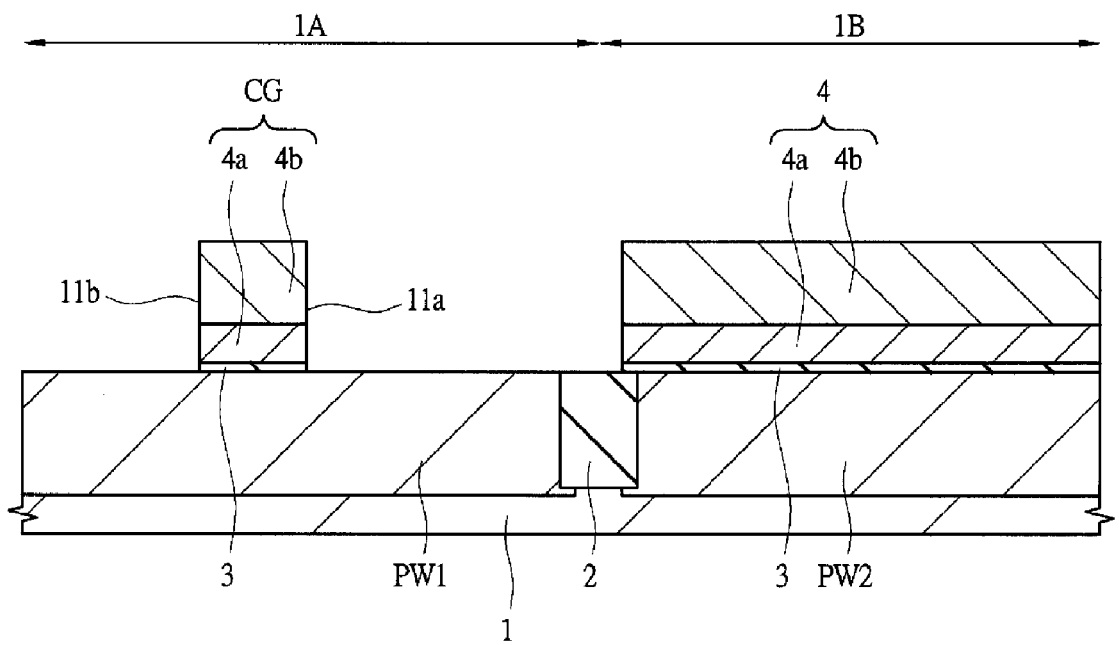
FIG. 12 is a cross-sectional view of essential parts in the process of manufacturing a semiconductor device subsequent to FIG. 11.

As described above, the stacked film 4 (the stacked film 4 of the silicon film 4b and the metal film 4a) is patterned in Step S7. As shown in FIG. 12, the control gate electrode CG including the patterned stacked film 4 (the stacked film 4 of the silicon film 4b and the metal film 4a) is formed in the memory cell region 1A. At this time, in the peripheral circuit region 1B, no patterning of the stacked film 4 (the stacked film 4 of the silicon film 4b and the metal film 4a) is performed because the photoresist pattern has been formed as described above. Consequently, the stacked film 4 remains in the whole peripheral circuit region 1B.

In the memory cell region 1A, the insulating film 3 in a part not covered with the control gate electrode CG (sometimes, the interface layer 3a, too) may be removed by the dry etching performed in the patterning process in Step S7, or by wet etching after the dry etching. The insulating film 3 on the lower part of the control gate electrode CG (when the interface layer 3a is formed, the interface layer 3a, too) is not removed by the dry etching in Step S7 and the subsequent wet etching and remains. In the memory cell region 1A, the insulating film 3 (when the interface layer 3a is formed, the insulating film 3 and the interface layer 3a) remaining under the control gate electrode CG works as the gate insulating film of the control transistor. Accordingly, the control gate electrode CG including the metal film 4a and the silicon film 4b over the metal film 4a is formed over the semiconductor substrate 1 (the p-type well PW1) via the insulating film 3 (and the interface layer 3a) being the gate insulating film.

Next, over the side wall of the control gate electrode CG, a side wall insulating film 13a including an insulator (an insulating film) is formed (Step S8 in FIG. 6). The formation process of the side wall insulating film 13a in Step S8 can be performed as follows (see FIGS. 13 and 14).

Figure 13:
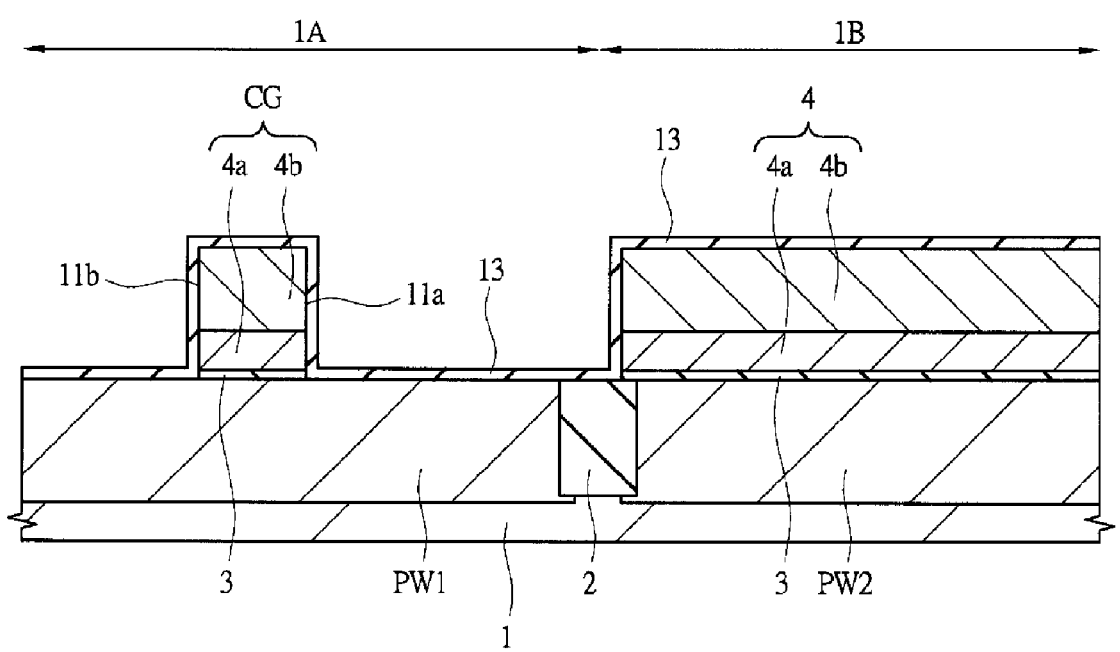
FIG. 13 is a cross-sectional view of essential parts in the process of manufacturing a semiconductor device subsequent to FIG. 12.
Figure 14:
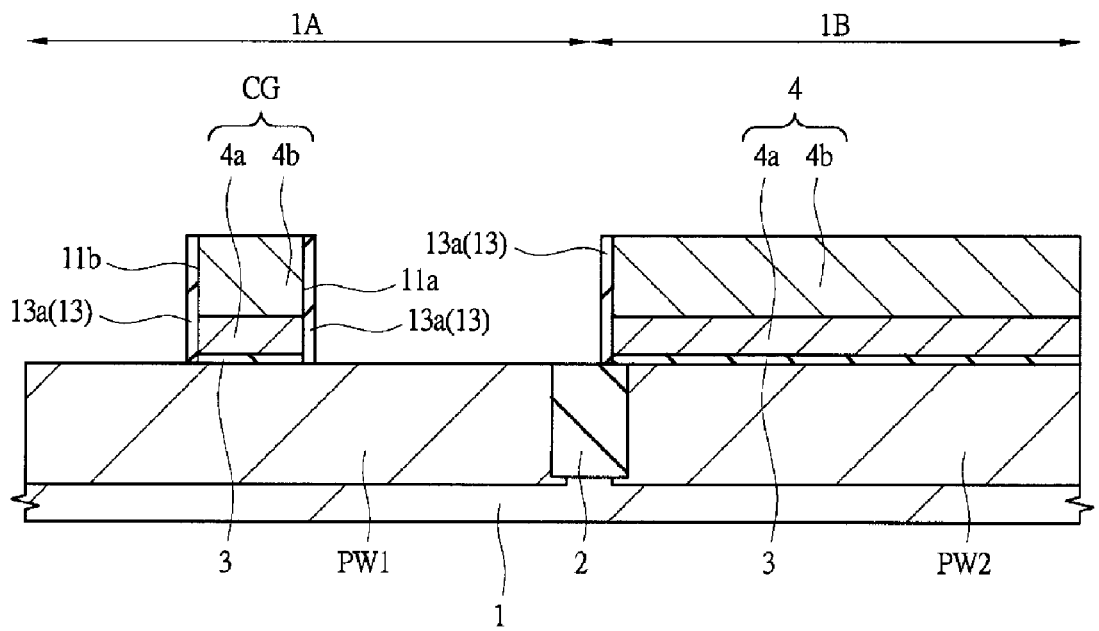
FIG. 14 is a cross-sectional view of essential parts in the process of manufacturing a semiconductor device subsequent to FIG. 13.

First, as shown in FIG. 13, over the whole main surface of the semiconductor substrate 1, the insulating film 13 is formed (deposited) to cover the control gate electrode CG. The insulating film 13 preferably includes a silicon nitride film. Then, the insulating film 13 is subjected to anisotropic etching (etch back), as shown in FIG. 14, to leave selectively the insulating film 13 over the side wall of the control gate electrode CG. Then, the side wall insulating film 13a is formed. In this stage, the side wall insulating film 13a is formed over both side walls of the control gate electrode CG (the side walls 11a and 11b) in the memory cell region 1A and over the side wall of the stacked film 4 in the peripheral circuit region 1B.

The formation process of the side wall insulating film 13a in Step S8 may be omitted. When the side wall insulating film 13a is formed over the side wall of the control gate electrode CG, the side surface of the metal film 4a of the control gate electrode CG and the side surface of the insulating film 3 being a high-permittivity film can be covered with the side wall insulating film 13a. Therefore, it is possible to prevent the metal film 4a of the control gate electrode CG and the insulating film 3 from being subjected to unnecessary etching in subsequent processes. When the side wall insulating film 13a is formed, not only the insulating film 5 but also the side wall insulating film 13a is interposed between the side wall of the control gate electrode CG and that of the memory gate electrode MG which is formed later. Therefore, a breakdown voltage between the control gate electrode CG and the memory gate electrode MG can also be improved.

Figure 15:
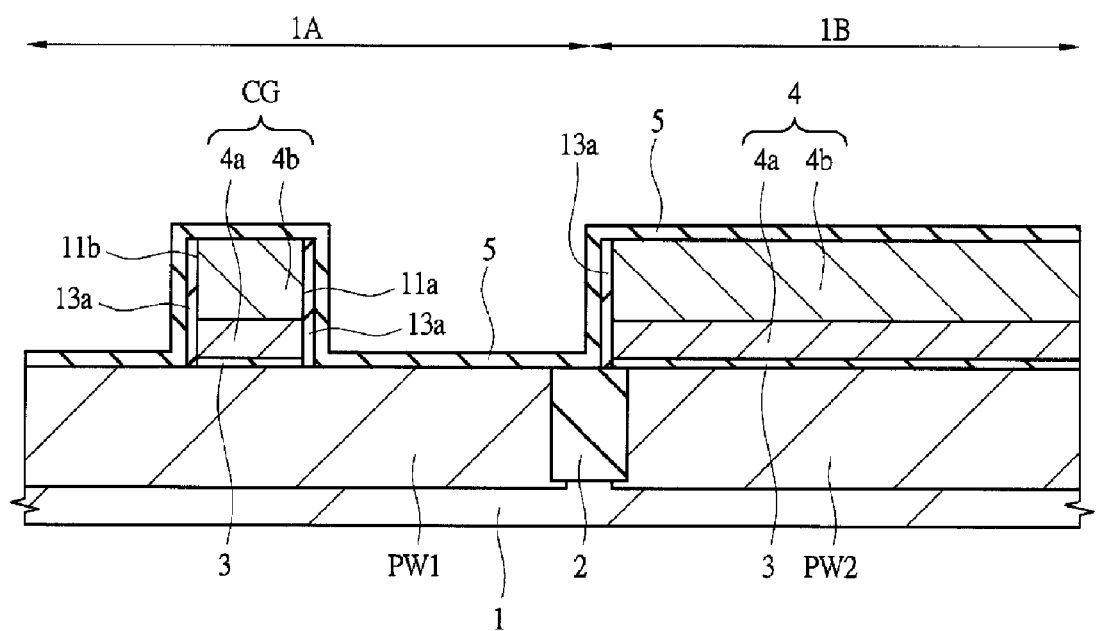
FIG. 15 is a cross-sectional view of essential parts in the process of manufacturing a semiconductor device subsequent to FIG. 14.

Next, after performing a washing process to subject the main surface of the semiconductor substrate 1 to a cleaning process, as shown in FIG. 15, over the whole main surface of the semiconductor substrate 1 (over the main surface (the surface) of the semiconductor substrate 1 and over the surface (the upper surface and the side surface) of the control gate electrode CG), the insulating film 5 for the gate insulating film of the memory transistor is formed (Step S9 in FIG. 6). In the peripheral circuit region 1B, because the stacked film 4 remains, the insulating film 5 is formed over the surface (the upper surface and the side surface) of the stacked film 4. Consequently, in Step S9, the insulating film 5 is formed over the semiconductor substrate 1 to cover the control gate electrode CG and the stacked film 4 in the peripheral circuit region 1B. Because the side wall insulating film 13a is formed over the side walls (11a and 11b) of the control gate electrode CG, the side wall insulating film 13a is interposed between the side walls (11a and 11b) of the control gate electrode CG and the insulating film 5.

The insulating film 5 is, as described above, an insulating film having an electric charge accumulation part (an electric charge accumulation layer), and includes, as an insulating film, a stacked film of the silicon oxide film 5a, the silicon nitride film 5b and the silicon oxide film 5c formed in the order from the bottom. To facilitate viewing the drawing, in FIG. 16, the stacked film of the silicon oxide film 5a, the silicon nitride film 5b and the silicon oxide film 5c is illustrated simply as the insulating film 5. Accordingly, actually, as shown in FIG. 16, the insulating film 5 includes the stacked film of the silicon oxide film (an oxide film) 5a, the silicon nitride film (a nitride film) 5b over the silicon oxide film 5a, and the silicon oxide film (an oxide film) 5c over the silicon nitride film 5b.

In the insulating film 5, the silicon oxide films 5a and 5c can be formed by an oxidation treatment (a thermal oxidation treatment), a CVD process, or a combination of these things. As the oxidation treatment (the thermal oxidation treatment), ISSG (In Situ Steam Generation) oxidation may also be used. In the insulating film 5, the silicon nitride film 5b can be formed by a CVD process.

In the embodiment, as the insulating film having a trap level (the electric charge accumulation layer), the silicon nitride film 5b is formed. Although a silicon nitride film is favorable from the viewpoint of reliability, it is not limited to a silicon nitride film. A high-permittivity film having a permittivity higher than that of the silicon nitride film, such as an aluminum oxide film (alumina), a hafnium oxide film, or a tantalum oxide film, can also be used as the electric charge accumulation layer (the electric charge accumulation part). The electric charge accumulation layer (the electric charge accumulation part) can also be formed from silicon nano dots.

To form the insulating film 5, first, over the surface of the semiconductor substrate 1 (the p-type well PW1), over the surface of the control gate electrode CG (over the side surface and the upper surface), and over the surface of the stacked film 4 (over the side surface and the upper surface) the silicon oxide film 5a is formed by a thermal oxidation process (preferably the ISSG oxidation). As another form, the silicon oxide film 5a can, also be formed by an ALD process. Then, over the silicon oxide film 5a, the silicon nitride film 5b is deposited by a CVD process. Furthermore, over the silicon nitride film 5b, the silicon oxide film 5c is formed by a CVD process or thermal oxidation, or by both. Consequently, the insulating film 5 including the stacked film of the silicon oxide film 5a, the silicon nitride film 5b and the silicon oxide film 5c can be formed.

The silicon oxide film 5a may have a thickness of around from 2 to 10 nm. The silicon nitride film 5b may have a thickness of around from 5 to 15 nm. The silicon oxide film 5c may have a thickness of around from 2 to 10 nm.

The insulating film 5 formed in the memory cell region 1A functions as a gate insulating film of the memory gate electrode MG formed later, and has a function of electric charge retention (electric charge accumulation). Because requiring the electric charge retention function, the insulating film 5 has a structure formed by sandwiching an electric charge accumulation layer (the silicon nitride film 5b) by electric charge blocking layers (the silicon oxide films 5a and 5c). The height of potential barrier of the electric charge blocking layer (here, the silicon oxide films 5a and 5c) becomes larger than that of potential barrier of the electric charge accumulation layer (the silicon nitride film 5b).

When the semiconductor device of the modification shown in FIG. 4 is manufactured, as shown in FIG. 17, the insulating film 5 is formed as a stacked film of the silicon oxide film (oxide film) 5a, the silicon nitride film (nitride film) 5b over the silicon oxide film 5a, the silicon oxide film (oxide film) 5c over the silicon nitride film 5b, and the insulating film 5d over the silicon oxide film 5c. After forming the silicon oxide film 5a, the silicon nitride film 5b and the silicon oxide film 5c as described above, by forming the insulating film 5d over the silicon oxide film 5c by a sputtering process, an ALD process, or a CVD process, the insulating film 5 including the stacked film of the silicon oxide film 5a, the silicon nitride film 5b, the silicon oxide film 5c and the insulating film 5d as shown in FIG. 16 can be formed. The insulating film 5d may have a thickness of around from 0.5 to 2 nm. Favorable materials as the insulating film 5d are as described above.

Figure 18:
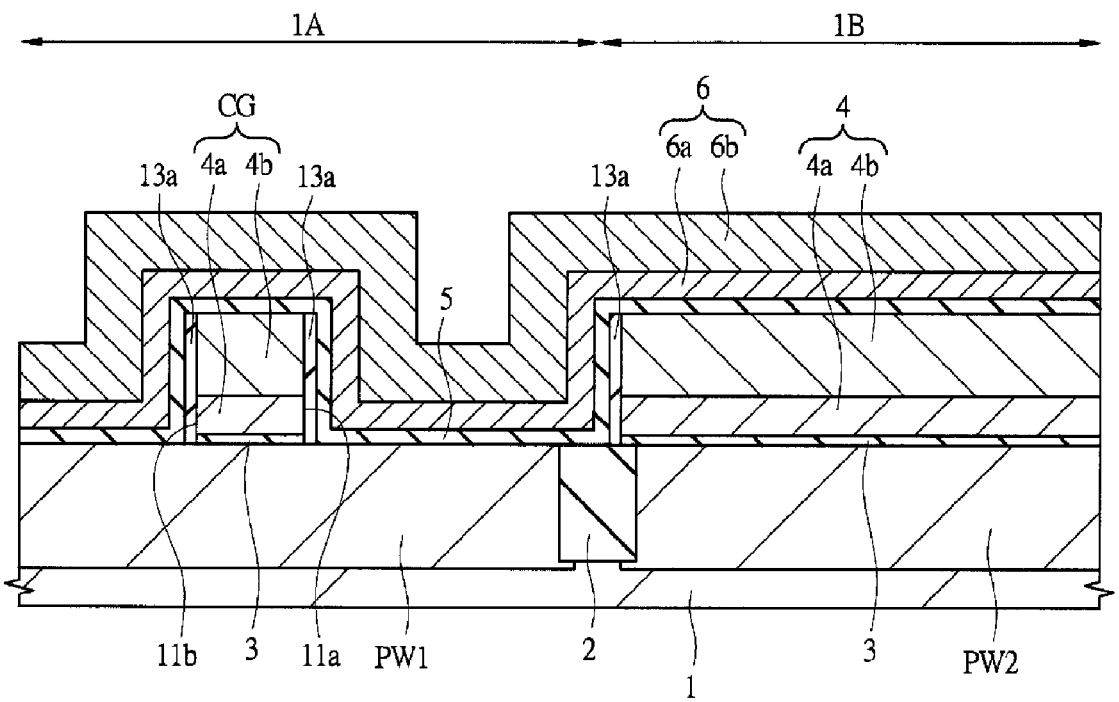
FIG. 18 is a cross-sectional view of essential parts in the process of manufacturing a semiconductor device subsequent to FIG. 15.

Next, as shown in FIG. 18, over the main surface (the whole main surface) of the semiconductor substrate 1 (over the insulating film 5), the metal film 6a for forming the memory gate electrode MG is formed (deposited) in the memory cell region 1A to cover the control gate electrode CG and in the peripheral circuit region 1B to cover the stacked film 4 (Step S10 in FIG. 6). Favorable materials as the metal film 6a are as described above. The metal film 6a can be formed by a sputtering process. The metal film 6a may have a thickness (formed film thickness) of around from 10 to 20 nm.

Next, over the main surface (the whole main surface) of the semiconductor substrate 1 (over the metal film 6a), the silicon film 6b is formed (deposited) (Step S11 in FIG. 6).

The silicon film 6b includes a polycrystalline silicon film (a polysilicon film), and can be formed using a CVD process or the like. The silicon film 6b may have a thickness (a deposited film thickness) of around from 40 to 60 nm. It is also possible to form the silicon film 6b as an amorphous silicon film in film forming, and form the amorphous silicon film into a polycrystalline silicon film by a subsequent heat treatment.

The silicon film 6b is more preferably introduced with an impurity (an n-type impurity such as phosphorus (P) or arsenic (As), or a p-type impurity such as boron (B)) to have a low resistivity. The impurity may be introduced into the silicon film 6b by an ion implantation after the formation of the silicon film 6b, or may also be introduced into the silicon film 6b in the formation of the silicon film 6b. When the impurity is introduced in forming the silicon film 6b, by including a doping gas (a gas for adding an impurity) in a gas for forming the silicon film 6b, the silicon film 6b into which the impurity has been introduced can be formed. The stacked film of the metal film 6a and the silicon film 6b over the metal film 6a is called a stacked film 6.

Next, by an anisotropic etching technology, the stacked film 6 (the stacked film 6 of the silicon film 6b and the metal film 6a) is etched back (etching, dry etching, anisotropic etching) to form the memory gate electrode MG (Step S12 in FIG. 6).

Figure 19:
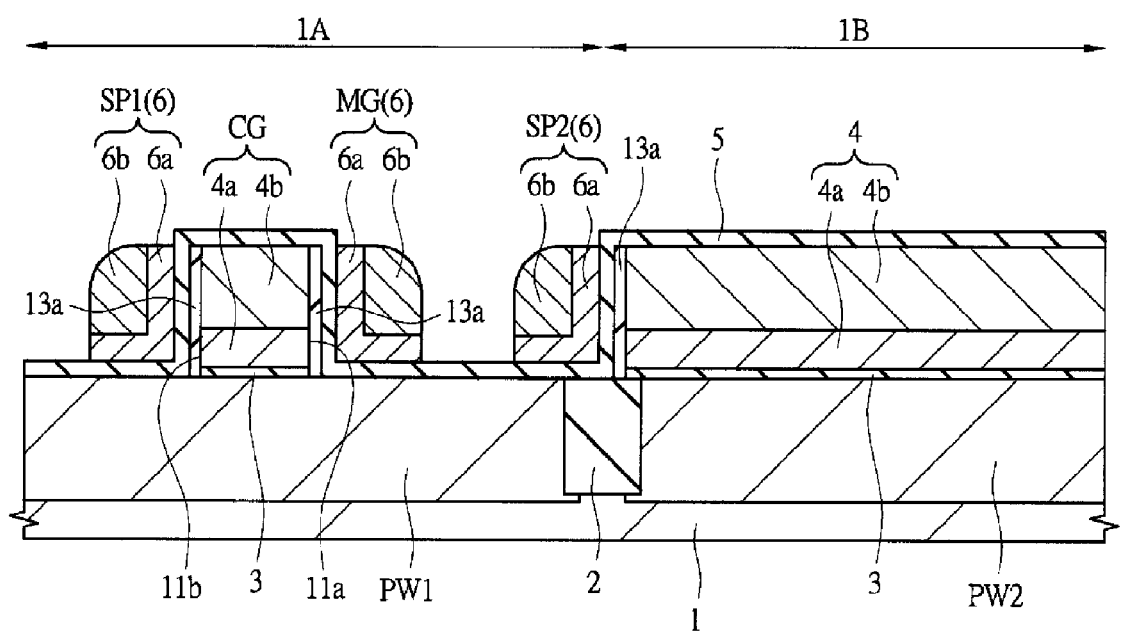
FIG. 19 is a cross-sectional view of essential parts in the process of manufacturing a semiconductor device subsequent to FIG. 18.

In the etch back process of Step S12, by anisotropically etching the stacked film 6 (the stacked film 6 of the metal film 6a and the silicon film 6b) (etch back) by the deposited film thickness of the stacked film 6, the stacked film 6 is left over both side walls (side surfaces) 11a and 11b of the control gate electrode CG (via the side wall insulating film 13a and the insulating film 5) in a sidewall spacer shape, and the stacked film 6 in the other regions is removed. Consequently, as shown in FIG. 19, in the memory cell region 1A, the memory gate electrode MG is formed from the stacked film 6 left in a sidewall spacer shape over one side wall 11a out of both side walls 11a and 11b of the control gate electrode CG via the side wall insulating film 13a and the insulating film 5, and a stacked film spacer SP1 is formed from the stacked film 6 left in a sidewall spacer shape over the other side wall 11b via the side wall insulating film 13a and the insulating film 5. The stacked film spacer SP1 may also be considered as a sidewall spacer including the stacked film 6. The memory gate electrode MG is formed over the insulating film 5 to be adjacent to the control gate electrode CG via the side wall insulating film 13a and the insulating film 5. The memory gate electrode MG and the stacked film spacer SP1 are formed over side walls of the control gate electrode CG opposite to each other, and have approximately symmetric structures while sandwiching the control gate electrode CG. Over the side surface (side wall) of the stacked film 4 left in the peripheral circuit region 1B, too, the stacked film 6 remains in a sidewall spacer shape via the insulating film 5. The stacked film 6 is called a stacked film spacer SP2.

The insulating film 5 is interposed between the memory gate electrode MG, which is formed in Step S12, and the semiconductor substrate 1 (the p-type well PW1), and between the memory gate electrode MG and the control gate electrode CG. The memory gate electrode MG is formed from the metal film 6a in contact with the insulating film 5 and the silicon film 6b which is separated from the insulating film 5 via the metal film 6a. When the side wall insulating film 13a is formed over the side wall of the control gate electrode CG as described above, the side wall insulating film 13a and the insulating film 5 result in interposing between the memory gate electrode MG and the control gate electrode CG.

In the stage of performing the etch back process in Step S12, the insulating film 5 in regions not being covered with the memory gate electrode MG and the stacked film spacers SP1 and SP2 is exposed. The insulating film 5 under the memory gate electrode MG in the memory cell region 1A works as the gate insulating film of the memory transistor. By adjusting the deposited thickness of the metal film 6a and the silicon film 6b deposited in Steps S10 and S11, the memory gate length can be adjusted.

Figure 20:
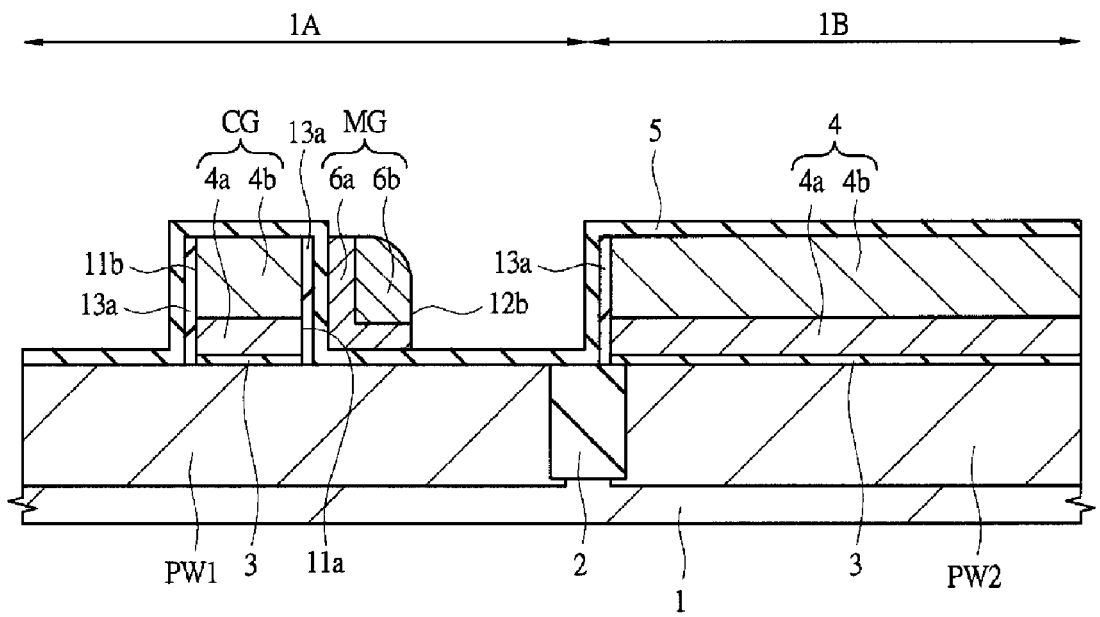
FIG. 20 is a cross-sectional view of essential parts in the process of manufacturing a semiconductor device subsequent to FIG. 19.

Next, using a photolithographic technology, a photoresist pattern to cover the memory gate electrode MG and expose the stacked film spacers SP1 and SP2 (not shown) is formed over the semiconductor substrate 1, and then, by dry etching using the photoresist pattern as an etching mask, the stacked film spacers SP1 and SP2 are removed (Step S13 in FIG. 7). After that, the photoresist pattern is removed. By the etching process in Step S13, as shown in FIG. 20, the stacked film spacers SP1 and SP2 are removed, but the memory gate electrode MG is not etched and left because it is covered with the photoresist pattern.

Figure 21:
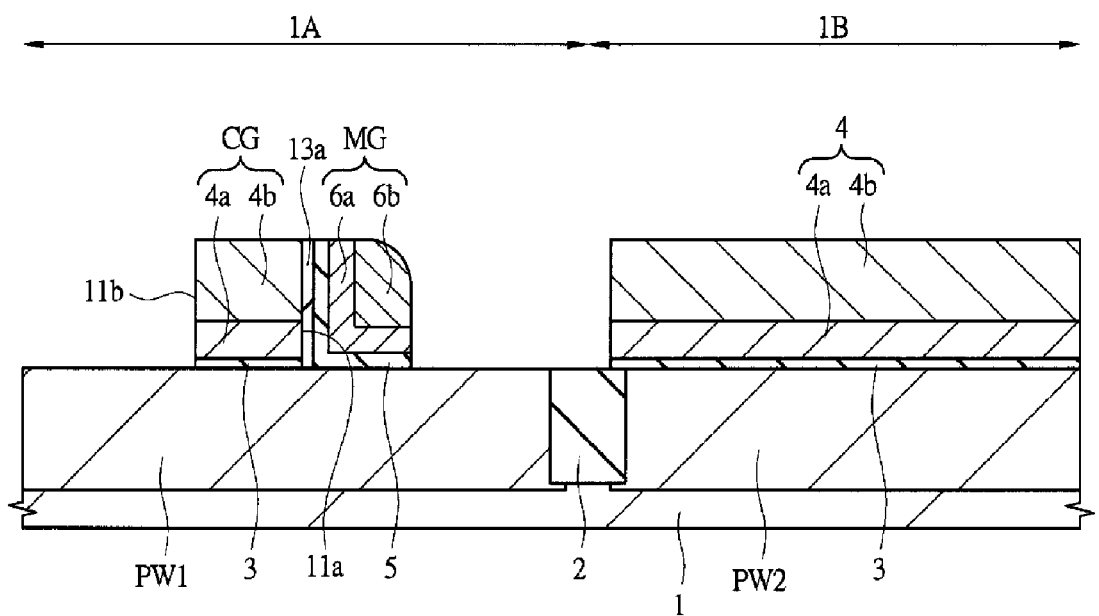
FIG. 21 is a cross-sectional view of essential parts in the process of manufacturing a semiconductor device subsequent to FIG. 20.
Figure 22:
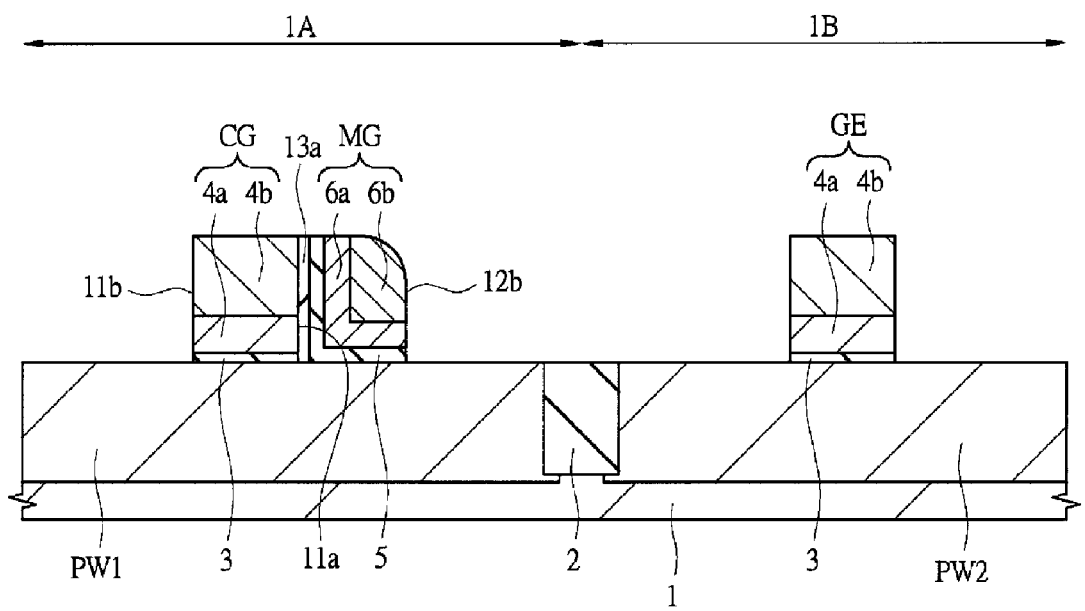
FIG. 22 is a cross-sectional view of essential parts in the process of manufacturing a semiconductor device subsequent to FIG. 21.

Next, as shown in FIG. 21, in the insulating film 5, parts not covered with the memory gate electrode MG but exposed are removed by etching (by wet etching) (Step S14 in FIG. 7). In the memory cell region 1A, the insulating film 5 located under the memory gate electrode MG and between the memory gate electrode MG and the control gate electrode CG is not removed but is left, and the insulating film 5 in other regions is removed. Also shown in FIG. 21, in the memory cell region 1A, the insulating film 5 extends continuously over both regions of the region between the memory gate electrode MG and the semiconductor substrate 1 (the p-type well PW1) and the region between the memory gate electrode MG and the control gate electrode CG.

When the insulating film 5 is removed in Step S14, the side wall insulating film 13a over the side wall 11b of the control gate electrode CG is also removed. FIG. 21 shows the case. As another form, when performing the removal (etching) process of the insulating film 5 in Step S14 so that the side wall insulating film 13a over the side wall 11b of the control gate electrode CG is not removed but is left, in the stage in FIG. 21, a state where the side wall insulating film 13a is formed (remains) over the side wall 11b of the control gate electrode CG is kept.

Next, by patterning the stacked film 4 in the peripheral circuit region 1B using a photolithographic technology and an etching technology, the gate electrode GE is formed in the peripheral circuit region 1B (Step S14 in FIG. 7). The patterning process in Step S14 can be performed as follows.

Over the main surface of the semiconductor substrate 1, a photoresist pattern is formed using a photolithographic process (although not shown here, the photoresist pattern is formed in a region where the gate electrode GE is formed in the peripheral circuit region 1B and in the whole memory cell region 1A). Then, by using the photoresist pattern as an etching mask, the stacked film 4 (the stacked film 4 of the silicon film 4b and the metal film 4a) in the peripheral circuit region 1B is etched (dry-etched) and patterned. Because the memory cell region 1A is covered with the photoresist pattern, the memory gate electrode MG and the control gate electrode CG are not etched. After that, the photoresist pattern is removed.

As described above, as shown in FIG. 22, the gate electrode GE including the patterned stacked film 4 (the stacked film 4 of the metal film 4a and the silicon film 4b over the metal film 4a) is formed in the peripheral circuit region 1B. The gate electrode GE is a gate electrode of a MISFET constituting the peripheral circuit.

Next, over the side walls of the control gate electrode CG and the memory gate electrode MG (the side walls opposite to the sides adjacent to each other via the insulating film 5) and over the side wall of the gate electrode GE, a side wall insulating film 14 including an insulator (an insulating film) is formed (Step S16 in FIG. 7). The process of forming the side wall insulating film 14 in Step S16 can be performed as follows (see FIGS. 23 and 24).

Figure 23:
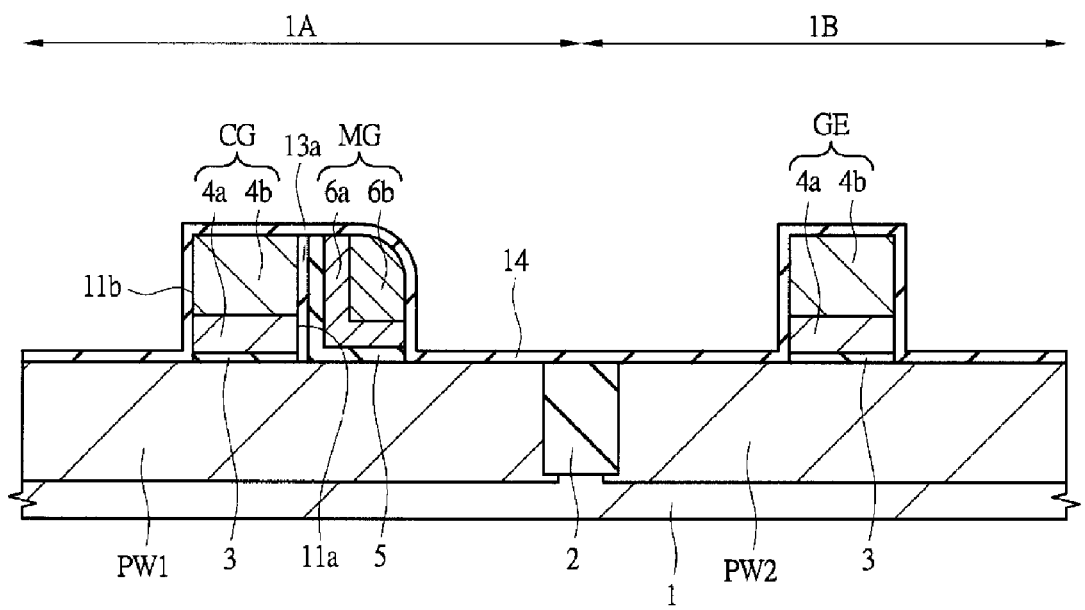
FIG. 23 is a cross-sectional view of essential parts in the process of manufacturing a semiconductor device subsequent to FIG. 22.
Figure 24:
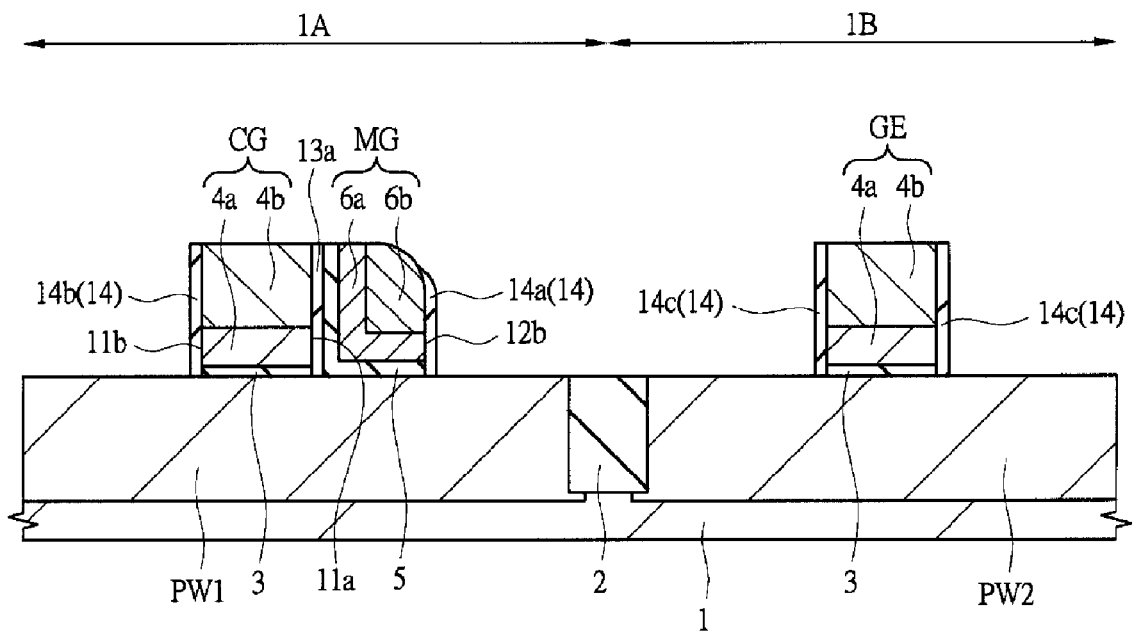
FIG. 24 is a cross-sectional view of essential parts in the process of manufacturing a semiconductor device subsequent to FIG. 23.

First, as shown in FIG. 23, over the whole main surface of the semiconductor substrate 1, an insulating film 14d for the side wall insulating film 14 is formed (deposited) to cover the control gate electrode CG, the memory gate electrode MG, and the gate electrode GE. The insulating film 14d preferably includes a silicon nitride film. Then, by anisotropically etching (etching back) the insulating film 14d, as shown in FIG. 24, the insulating film 14d is left selectively over the side walls of the control gate electrode CG and the memory gate electrode MG (the side walls opposite to the side walls adjacent to each other via the insulating film 5) and over the side wall of the gate electrode GE and then the side wall insulating film 14 is formed. The side wall insulating film 14 includes the insulating film 14d remaining over the side walls of the control gate electrode CG and the memory gate electrode MG (the side walls opposite to the side walls adjacent to each other via the insulating film 5) and over the side wall of the gate electrode GE.

The side wall insulating film 14 is formed over the side wall 11b of the control gate electrode CG, over the side wall 12b of the memory gate electrode MG, and over both side walls of the gate electrode GE. The side wall insulating film 14 formed over the side wall 12b of the memory gate electrode MG is given a symbol 14a and called the side wall insulating film 14a. The side wall insulating film 14 formed over the side wall 11b of the control gate electrode CG is given a symbol 14b and called the side wall insulating film 14b. The side wall insulating film 14 formed over both side walls of the gate electrode GE is given a symbol 14c and called the side wall insulating film 14c. The side wall 11b of the control gate electrode CG is the side wall (the side surface) on the side opposite to the side adjacent to the memory gate electrode MG via the insulating film 5 (and the side wall insulating film 13a) out of the side walls (the side surfaces) of the control gate electrode CG. The side wall 12b of the memory gate electrode MG is the side wall (the side surface) on the side opposite to the side adjacent to the control gate electrode CG via the insulating film 5 (and the side wall insulating film 13a) out of the side walls (the side surfaces) of the memory gate electrode MG.

In the case where the side wall insulating film 13a over the side wall 11b of the control gate electrode CG is also removed in removing the insulating film 5 in Step S14, when the side wall insulating film 14 is formed in Step S16, the side wall insulating film 14b formed over the side wall 11b of the control gate electrode CG includes the side wall insulating film 14 (the remaining part of the insulating film 14d). FIG. 24 shows the case. As another form, in the case where the side wall insulating film 13a over the side wall 11b of the control gate electrode CG is not removed but is left in removing the insulating film 5 in Step S14, when the side wall insulating film 14 is formed in Step S16, the side wall insulating film 14b formed over the side wall 11b of the control gate electrode CG includes the stacked film (the stacked structure) of the side wall insulating film 13a and the side wall insulating film 14 (the remaining part of the insulating film 14d).

Figure 25:
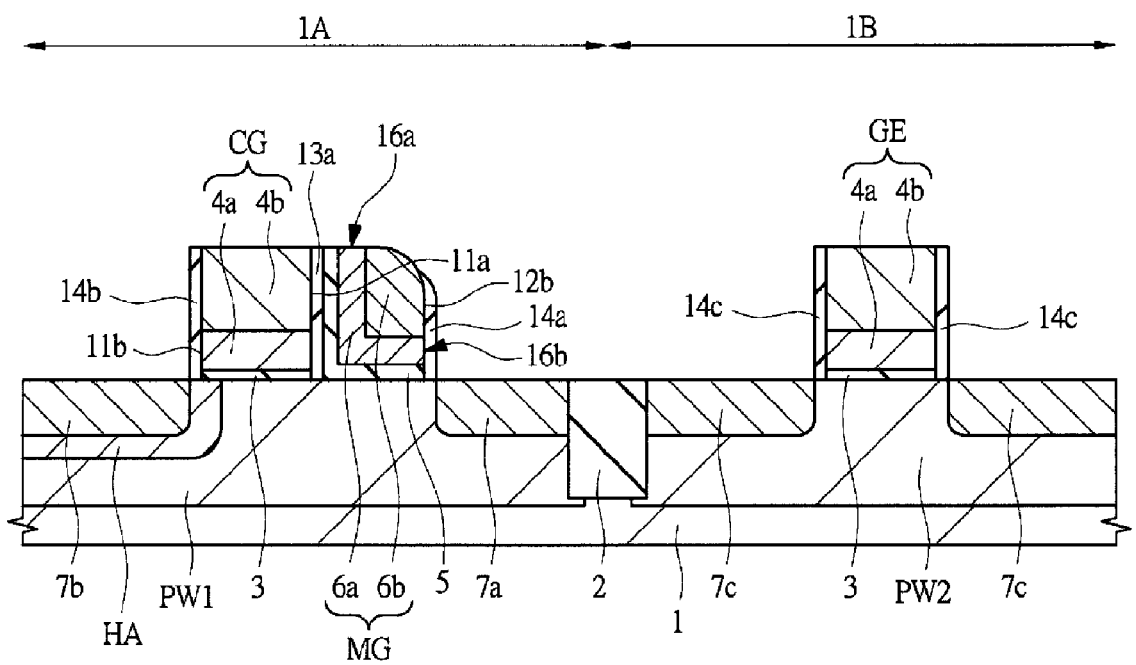
FIG. 25 is a cross-sectional view of essential parts in the process of manufacturing a semiconductor device subsequent to FIG. 24.

Next, with an ion implantation process, by introducing (doping) an n-type impurity such as arsenic (As) or phosphorus (P) into the semiconductor substrate 1 (the p-type wells PW1 and PW2) using the control gate electrode CG, the memory gate electrode MG and the gate electrode GE as a mask (an ion implantation obstructing mask), as shown in FIG. 25, $n^-$-type semiconductor regions (impurity diffused layers) 7a, 7b and 7c are formed (Step S17 in FIG. 7).

On this occasion, the $n^-$-type semiconductor region 7a is formed by self-alignment technique for the side surface of the side wall insulating film 14a over the side wall 12b of the memory gate electrode MG in the memory cell region 1A. The $n^-$-type semiconductor region 7b is formed by self-alignment technique for the side surface of the side wall insulating film 14b over the side wall 11b of the control gate electrode CG in the memory cell region 1A. The $n^-$-type semiconductor region 7c is formed by self-alignment technique for the side surface of the side wall insulating film 14c formed over both side walls of the gate electrode GE in the peripheral circuit region 1B. The $n^-$-type semiconductor regions 7a and 7b can function as a part of a source/drain region (a source region or a drain region) of a memory cell formed in the memory cell region 1A. The $n^-$-type semiconductor region 7c can function as a part of a source/drain region (a source region or a drain region) of a MISFET formed in the peripheral circuit region 1B. The $n^-$-type semiconductor regions 7a, 7b, and 7c can be formed by the same ion implantation process, but may also be formed by different ion implantation processes. In the ion implantation for forming the $n^-$-type semiconductor regions 7a, 7b and 7c, ions are preferably implanted in a direction perpendicular to the main surface of the semiconductor substrate 1, instead of oblique ion implantation.

Next, ion implantation of a p-type impurity (halo ion implantation) is performed for the semiconductor substrate 1 (the p-type well PW1) in the memory cell region 1A to form a halo region (a p-type semiconductor region) HA (Step S18 in FIG. 7). The halo region HA is formed to encompass (cover) the $n^-$-type semiconductor region 7b, and has an impurity concentration (a p-type impurity concentration) higher than that of the p-type well PW1.

The halo region HA is a halo region formed for the $n^-$-type semiconductor region 7b, and is formed to encompass (cover) the $n^-$-type semiconductor region 7b in the p-type well PW1, and has a conductivity type inverse to that of the $n^-$-type semiconductor region 7b and same as that of the p-type well PW1, and has the p-type (is a p-type semiconductor region). The halo region HA is formed for suppressing the short-channel characteristics (punch through).

In the ion implantation for forming the halo region HA, the control gate electrode CG can function as a mask (an ion implantation-obstructing mask), and the ion implantation for forming the halo region HA is more preferably set to be oblique ion implantation (inclined ion implantation), which enables the halo region HA to be formed precisely to encompass (cover) the $n^-$-type semiconductor region 7b. In general ion implantation, impurity ions are accelerated and driven in a direction perpendicular to the main surface of the semiconductor substrate 1. In oblique ion implantation, impurity ions are accelerated and driven in a direction inclined in a prescribed angle (an angle of inclination) from the direction perpendicular to the main surface of the semiconductor substrate 1.

The $n^-$-type semiconductor region 7b and the halo region HA may be formed not necessarily in this order, but the ion implantation for forming the $n^-$-type semiconductor region 7b and the ion implantation for forming the halo region HA should be performed, at least, after the formation of the control gate electrode CG and before the formation of the sidewall spacer SW described later.

The halo region HA is formed for suppressing short-channel characteristics, and is formed for the $n^-$-type semiconductor region 7b for drain (formed to encompass the $n^-$-type semiconductor region 7b), but the formation of the halo region HA is not necessary for the $n^-$-type semiconductor region 7a for source. Therefore, in the ion implantation for forming the halo region HA, it is only required to cover the $n^-$-type semiconductor region 7a for source with a photoresist pattern so that no p-type halo region is formed for the $n^-$-type semiconductor region 7a. In FIG. 25, ion implantation for forming the halo region HA is performed in such a state that the whole peripheral circuit region 1B and the $n^-$-type semiconductor region 7a in the memory cell region 1A are covered with a photoresist pattern (not shown) to form the halo region HA for the $n^-$-type semiconductor region 7b, but that no halo region is formed for the $n^-$-type semiconductor regions 7a and 7c. As another form, the halo region may also be formed for the $n^-$-type semiconductor regions 7a and 7c for suppressing short-channel characteristics.

Figure 26:
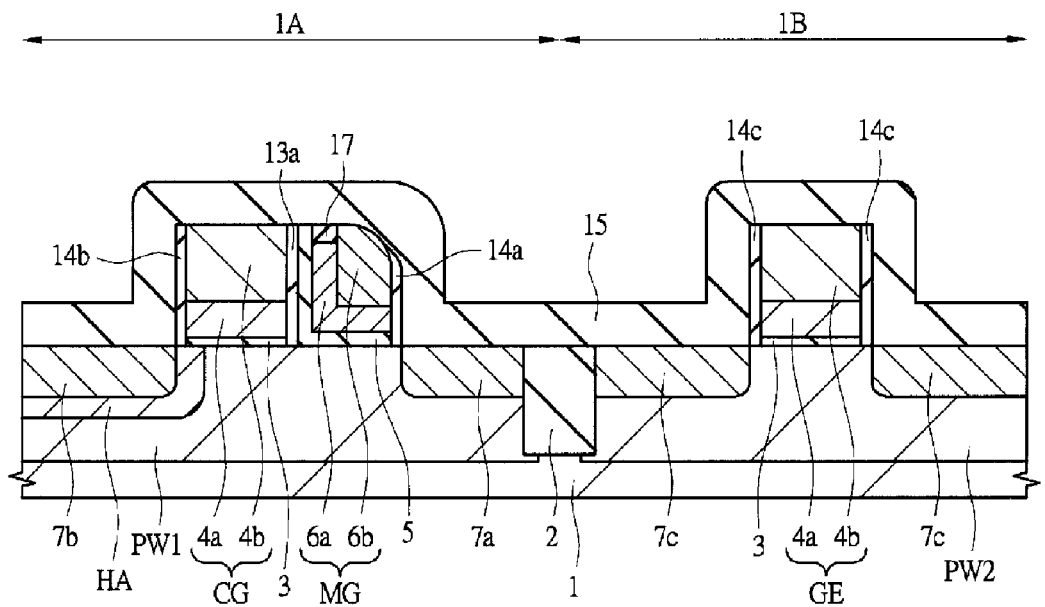
FIG. 26 is a cross-sectional view of essential parts in the process of manufacturing a semiconductor device subsequent to FIG. 25.

Next, as shown in FIG. 26, over the whole main surface of the semiconductor substrate 1, an insulating film 15 for the sidewall spacer SW is formed (deposited) (Step S19 in FIG. 7). The insulating film 15 is a single film of a silicon oxide film, or a stacked film of a silicon oxide film and an insulating film over the silicon oxide film. Specifically, the insulating film 15 can be made to be a single film of a silicon oxide film, a stacked film of a silicon oxide film and a silicon nitride film over the silicon oxide film, or a stacked film of a silicon oxide film, a silicon nitride film over the silicon oxide film, and a silicon oxide film over the silicon nitride film.

In forming the insulating film 15 in Step S19, the exposed part of the metal film 6a having constituted the memory gate electrode MG is oxidized. To be capable of oxidizing the exposed part of the metal film 6a having constituted the memory gate electrode MG, the formation process of the insulating film 15 is performed. The insulating film 15 is a single film of a silicon oxide film, or a stacked film having a silicon oxide film as the lowermost layer, and, in forming the silicon oxide film, the exposed part of the metal film 6a is oxidized. For this reason, it is preferable to form, when the insulating film 15 is a single film of a silicon oxide film, the silicon oxide film constituting the single film, and to form, when the insulating film 15 is a stacked film, the lowermost silicon oxide film of the stacked film, under conditions capable of oxidizing the exposed part of the metal film 6a. Because having strong oxidizing properties, an $O_3$-TEOS oxide film is a favorable film for oxidizing the exposed part of the metal film 6a in forming it. The $O_3$-TEOS oxide film is a silicon oxide film by a thermal CVD process using $O_3$ (ozone) and TEOS (Tetraethoxysilane, or also called Tetra Ethyl Ortho Silicate) as source gasses. Accordingly, when the insulating film 15 is a single film of a silicon oxide film, preferably the single film is the $O_3$-TEOS oxide film, and, when the insulating film 15 is a stacked film, preferably the lowermost layer of the stacked film is the $O_3$-TEOS oxide film.

In the stage directly before the formation of the insulating film 15, the upper end part 16a of the metal film 6a is exposed. Accordingly, when the insulating film 15 is formed in Step S19, the upper end part 16a of the metal film 6a having constituted the memory gate electrode MG is oxidized to form the metal oxide portion 17 having insulation properties. Because the metal oxide portion 17 is formed by the oxidation of a part of the metal film 6a, a metal element constituting the metal oxide portion 17 and a metal element constituting the metal film 6a are the same. When the metal film 6a is an aluminum (Al) film, the metal oxide portion 17 includes aluminum oxide. Because the side wall insulating film 14a is formed over the side wall 12b of the memory gate electrode MG, the side end part 16b of the metal film 6a constituting the memory gate electrode MG is covered with the side wall insulating film 14a but is not exposed. Consequently, when the insulating film 15 is formed in Step S19, the side end part 16b of the metal film 6a constituting the memory gate electrode MG is not oxidized. The metal film 6a is not oxidized. In the upper surface of the memory gate electrode MG, the metal film 6a is oxidized to form the metal oxide portion 17. In the side surface (side wall 12b) of the memory gate electrode MG, the metal film 6a is not oxidized.

When a part of the metal film 6a is oxidized in the formation of the insulating film 15 to form the metal oxide portion 17, the exposed part of the silicon film 6b may be slightly oxidized. The material of the metal film 6a and formation conditions of the insulating film 15 are selected so that the metal film 6a is oxidized more easily than the silicon film 6b.

Figure 27:
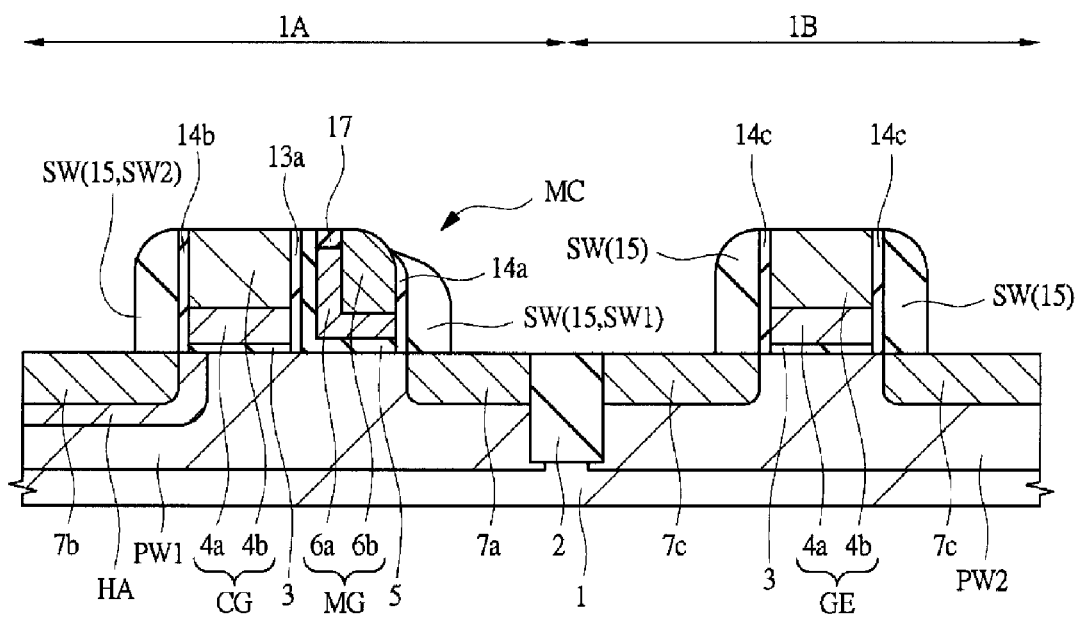
FIG. 27 is a cross-sectional view of essential parts in the process of manufacturing a semiconductor device subsequent to FIG. 26.

Next, by anisotropically etching (etching back) the insulating film 15, as shown in FIG. 27, when the insulating film 15 is left selectively over the side walls of the control gate electrode CG and the memory gate electrode MG (the side walls on the sides opposite to the sides adjacent to each other via the insulating film 5) and over the side wall of the gate electrode GE, the sidewall spacer SW is formed (Step S20 in FIG. 7). The sidewall spacer SW includes the insulating film 15 remaining over the side walls of the control gate electrode CG and the memory gate electrode MG (the side walls on the sides opposite to the sides adjacent to each other via the insulating film 5) and over the side wall of the gate electrode GE. The sidewall spacer SW1 out of the sidewall spacers SW is formed over the side wall 12b of the memory gate electrode MG via the side wall insulating film 14a, and the sidewall spacer SW2 out of the sidewall spacer SW is formed over the side wall 11b of the control gate electrode CG via the side wall insulating film 14b.

Figure 28:
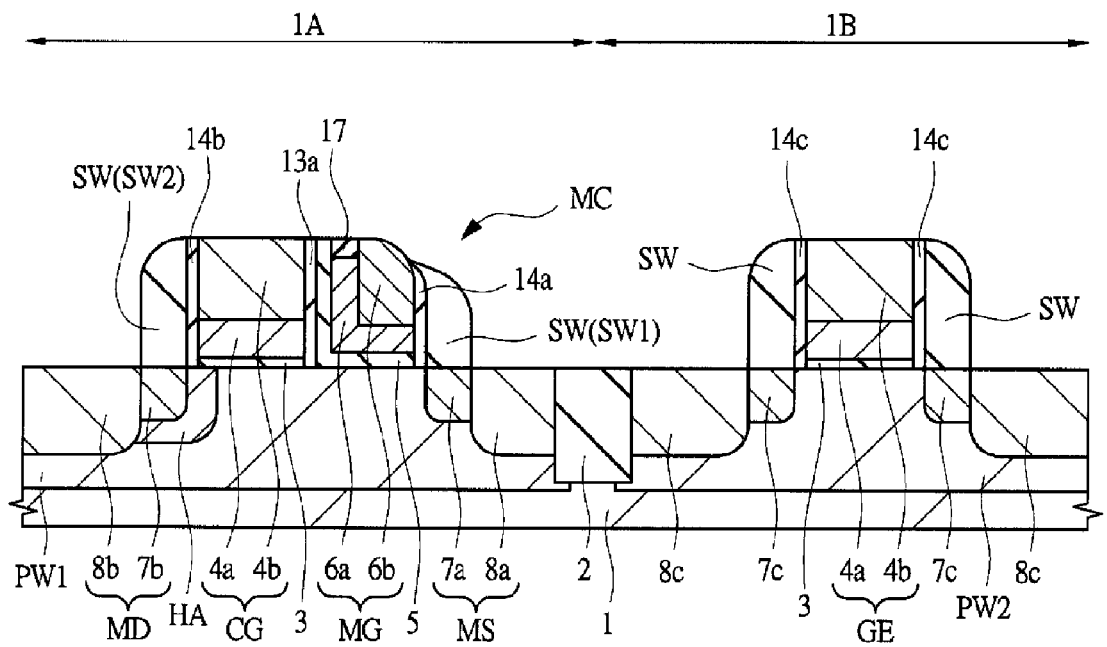
FIG. 28 is a cross-sectional view of essential parts in the process of manufacturing a semiconductor device subsequent to FIG. 27.

Next, as shown in FIG. 28, $n^+$-type semiconductor regions (impurity diffused layers) 8a, 8b and 8c are formed using an ion implantation process (Step S21 in FIG. 7).

In Step S21, by introducing (doping) an n-type impurity such as arsenic (As) or phosphorus (P) into the semiconductor substrate 1 (the p-type wells PW1 and PW2) using the control gate electrode CG, the memory gate electrode MG and the gate electrode GE, and the sidewall spacer SW (and the side wall insulating films 13a, 14a, 14b and 14c) over the side walls of these three electrodes as a mask (an ion implantation-obstructing mask), the $n^+$-type semiconductor regions 8a, 8b and 8c can be formed. The $n^+$-type semiconductor region 8a is formed by self-alignment technique for the sidewall spacer SW1 over the side wall of the memory gate electrode MG in the memory cell region 1A. The $n^+$-type semiconductor region 8b is formed by self-alignment technique for the sidewall spacer SW2 over the side wall of the control gate electrode CG in the memory cell region 1A. The $n^+$-type semiconductor region 8c is formed by self-alignment technique for the sidewall spacer SW over both side walls of the gate electrode GE in the peripheral circuit region 1B. Consequently, an LDD (lightly doped drain) structure is formed. The $n^+$-type semiconductor regions 8a, 8b, and 8c can be formed by the same ion implantation process, but may be formed by different ion implantation processes.

As described above, from the $n^-$-type semiconductor region 7a and the $n^+$-type semiconductor region 8a having a higher impurity concentration than the region 7a, the n-type semiconductor region MS functioning as the source region of the memory transistor is formed. From the $n^-$-type semiconductor region 7b and the $n^+$-type semiconductor region 8b having a higher impurity concentration than the region 7b, the n-type semiconductor region MD functioning as the drain region of the control transistor is formed. From the $n^-$-type semiconductor region 7c and the $n^+$-type semiconductor region 8c having a higher impurity concentration than the region 7c, the n-type semiconductor region functioning as the source/drain region of the MISFET in the peripheral circuit region 1B is formed.

Next, activation annealing being a heat treatment for activating impurities introduced into the n-type semiconductor regions (the $n^-$-type semiconductor regions 7a, 7b and 7c and the $n^+$-type semiconductor regions 8a, 8b and 8c) for the source and drain is performed (Step S22 in FIG. 7).

As described above, the memory cell MC of the nonvolatile memory is formed in the memory cell region 1A, and the MISFET is formed in the peripheral circuit region 1B.

Figure 29:
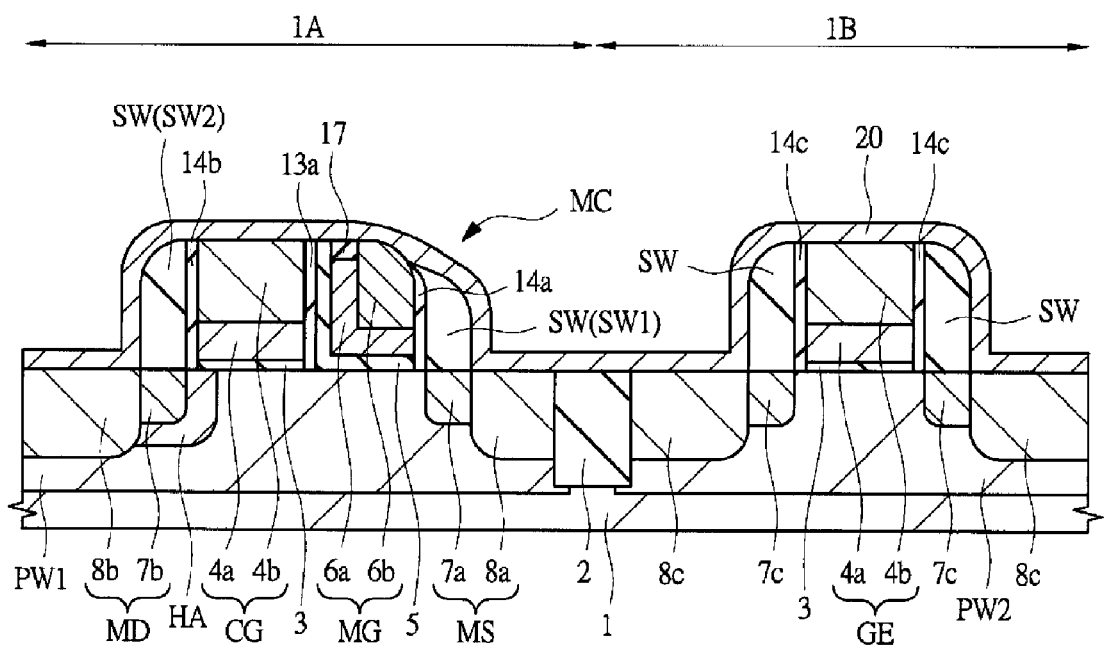
FIG. 29 is a cross-sectional view of essential parts in the process of manufacturing a semiconductor device subsequent to FIG. 28.

Next, over the whole main surface of the semiconductor substrate 1, a silicon oxide film is formed by a CVD process or the like. Then, the silicon oxide film (the silicon oxide film is left over silicon regions in which the metal silicide layer 21 should not be formed) is removed using a photolithographic process and an etching process to expose silicon surfaces (silicon regions, silicon films) of the upper surface (surface) of the $n^+$-type semiconductor regions 8a, 8b and 8c, the upper surface of the control gate electrode CG, the upper surface of the memory gate electrode MG, and the upper surface of the gate electrode GE. Then, as shown in FIG. 29, over the whole main surface of the semiconductor substrate 1 including over the upper surface (the surface) of the $n^+$-type semiconductor regions 8a, 8b and 8c, over the upper surface of the memory gate electrode MG (portions not covered with the sidewall spacer SW), over the upper surface of the control gate electrode CG and over the upper surface of the gate electrode GE, a metal film 20 is formed (deposited) to cover the control gate electrode CG, the memory gate electrode MG, the gate electrode GE, and the sidewall spacer SW. The metal film 20 includes a cobalt (Co) film, a nickel (Ni) film, and a nickel-platinum alloy film, and can be formed using a sputtering process.

Figure 30:
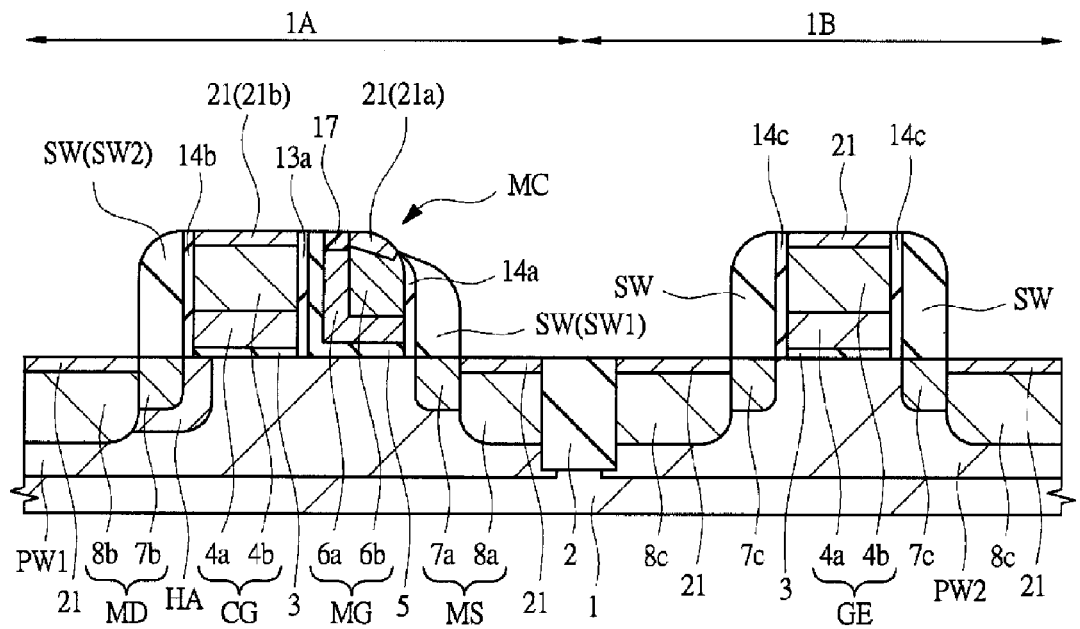
FIG. 30 is a cross-sectional view of essential parts in the process of manufacturing a semiconductor device subsequent to FIG. 29.
Figure 31:
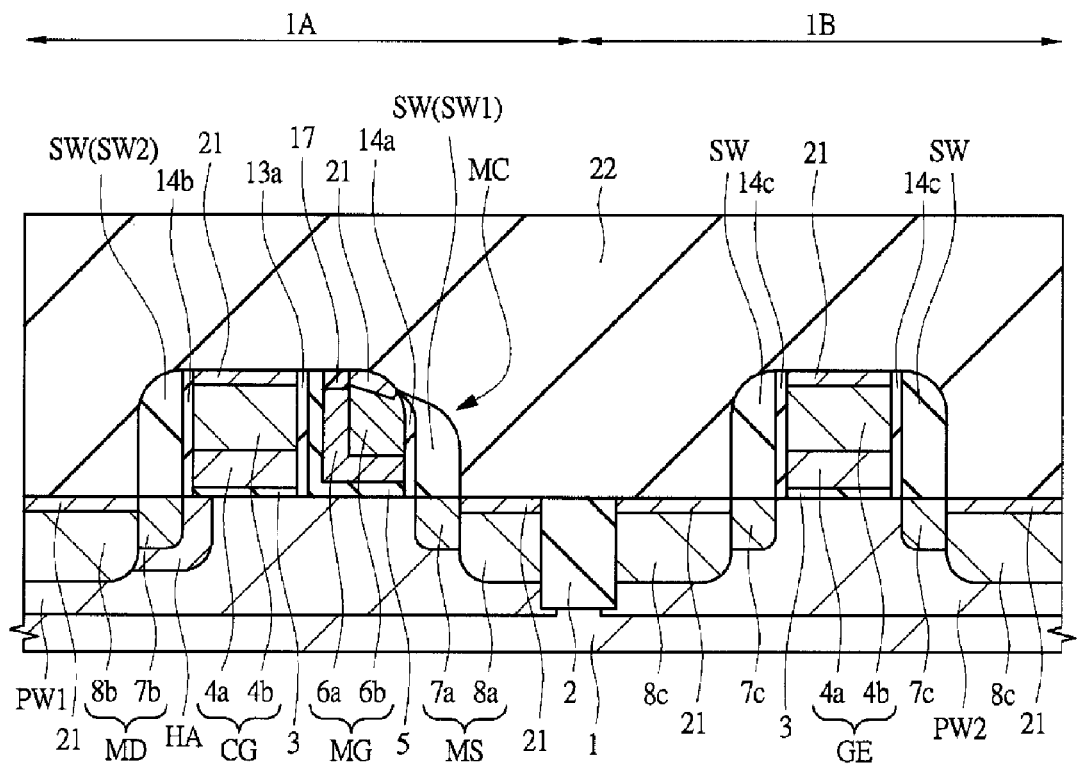
FIG. 31 is a cross-sectional view of essential parts in the process of manufacturing a semiconductor device subsequent to FIG. 30.

Next, by subjecting the semiconductor substrate 1 to a heat treatment, upper layer portions (outer layer portions) of the $n^+$-type semiconductor regions 8a, 8b and 8c, the silicon film 4b of the control gate electrode CG, the silicon film 6b of the memory gate electrode MG and the silicon film 4b of the gate electrode GE are caused to react with the metal film 20. Consequently, as shown in FIG. 30, in respective upper parts (upper surfaces, surfaces, upper layer parts) of the $n^+$-type semiconductor regions 8a, 8b and 8c, the silicon film 4b of the control gate electrode CG, the silicon film 6b of the memory gate electrode MG and the silicon film 4b of the gate electrode GE, the metal silicide layer 21 is formed. The metal silicide layer 21 may be a cobalt silicide layer (when the metal film 20 is a cobalt film), a nickel silicide layer (when the metal film 20 is a nickel film), or a platinum-added nickel silicide layer (when the metal film 20 is a nickel-platinum alloy film). After that, an unreacted metal film 20 is removed. FIG. 30 shows a cross-sectional view in this stage. As described above, by performing a Salicide (Self Aligned Silicide) process, it is possible to form the metal silicide layer 21 in the upper parts of the n$^+$-type semiconductor regions 8a, 8b and 8c, the control gate electrode CG, the memory gate electrode MG and the gate electrode GE, and then to lower the resistances of the source, drain and gate electrodes (CG, MG, GE).

Figure 32:
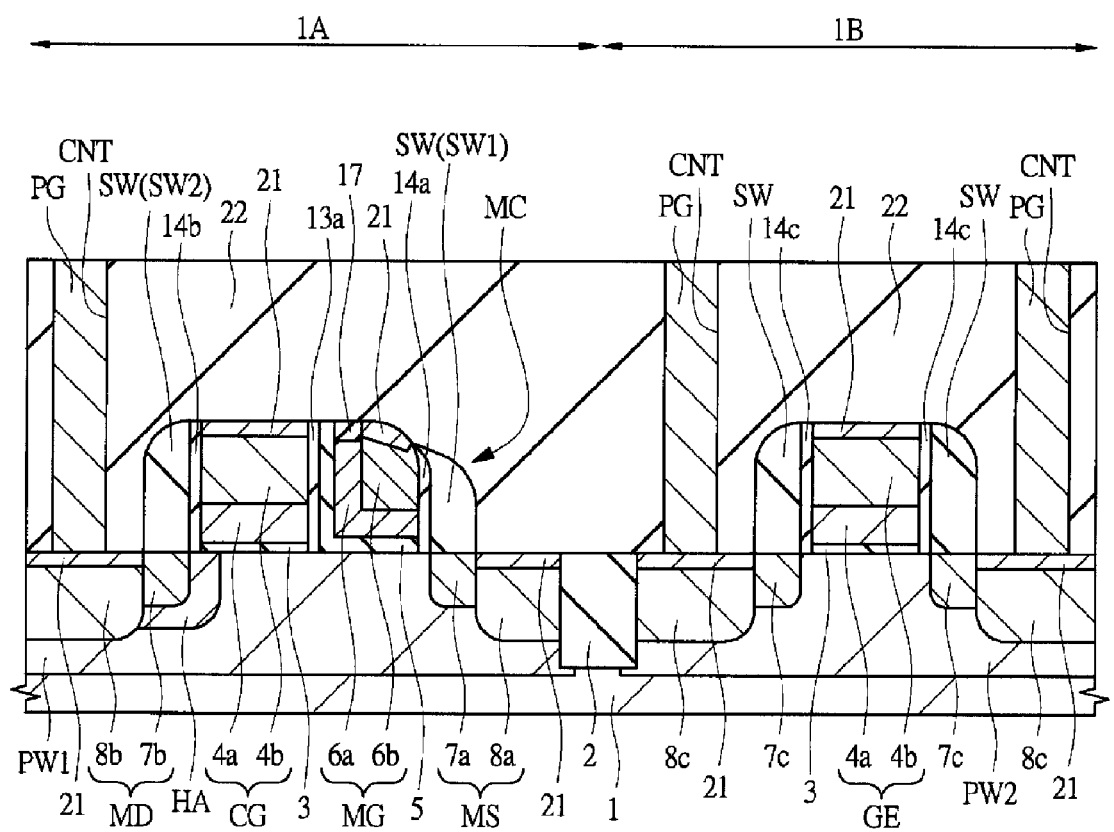
FIG. 32 is a cross-sectional view of essential parts in the process of manufacturing a semiconductor device subsequent to FIG. 31.

Next, as shown in FIG. 32, over the whole main surface of the semiconductor substrate 1, the interlayer insulating film 22 is formed (deposited) as an insulating film to cover the control gate electrode CG, the memory gate electrode MG, the gate electrode GE, and the sidewall spacer SW. The interlayer insulating film 22 includes a single film of a silicon oxide film, a stacked film of a silicon nitride film and a silicon oxide film formed over the silicon nitride film, thicker than the silicon nitride film, and is formed using a CVD process or the like. After the formation of the interlayer insulating film 22, if necessary, the upper surface of the interlayer insulating film 22 is planarized using a CMP (Chemical Mechanical Polishing) process or the like.

Next, by dry-etching the interlayer insulating film 22 using a photoresist pattern (not shown) having been formed over the interlayer insulating film 22 using a photolithographic process as an etching mask, as shown in FIG. 32, a contact hole (an opening part, through hole) CNT is formed in the interlayer insulating film 22.

Next, in the contact hole CNT, an electroconductive plug PG containing tungsten (W) is formed as a conductor part (a conductor part for connection).

To form the plug PG, over the interlayer insulating film 22 including the inside of the contact hole CNT (over the bottom part and the side wall), a barrier conductor film (a titanium film, a titanium nitride film, or a stacked film of these films) is formed. Then, by forming a main conductor film including a tungsten film over the barrier conductor film to be embedded in the contact hole CNT, and by removing an unnecessary main conductor film and barrier conductor film over the interlayer insulating film 22 by a CMP process, an etch back process or the like, the plug PG can be formed. To simplify the drawing, FIG. 32 shows the barrier conductor film and the main conductor film (the tungsten film) constituting the plug PG integrally.

The contact hole CNT and the plug PG embedded in the contact hole CNT are formed in the upper part of the n$^+$-type semiconductor regions 8a, 8b and 8c, the control gate electrode CG, the memory gate electrode MG, and the gate electrode GE. In the bottom part of the contact hole CNT, a part of the main surface of the semiconductor substrate 1, such as a part of the n$^+$-type semiconductor regions 8a, 8b and 8c (the metal silicide layer 21 over the surface of the n$^+$-type semiconductor regions 8a, 8b and 8c), that of the control gate electrode CG (the metal silicide layer 21 over the surface of the control gate electrode CG), that of the memory gate electrode MG (the metal silicide layer 21 over the surface of the memory gate electrode MG), or that of the gate electrode GE (the metal silicide layer 21 over the surface of the gate electrode GE) are exposed. FIG. 32 shows a cross section in which a part of the n$^+$-type semiconductor regions 8b and 8c (the metal silicide layer 21 over the surface of the n$^+$-type semiconductor regions 8b and 8c) is exposed in the bottom part of the contact hole CNT and is connected electrically with the plug PG embedded in the contact hole CNT.

Next, over the interlayer insulating film 22 in which the plug PG is embedded, a wiring (a wiring layer) M1 being a wiring of the first layer is formed. And a case where the wiring M1 is formed using a damascene technology (a single damascene technology) is explained.

Figure 33:
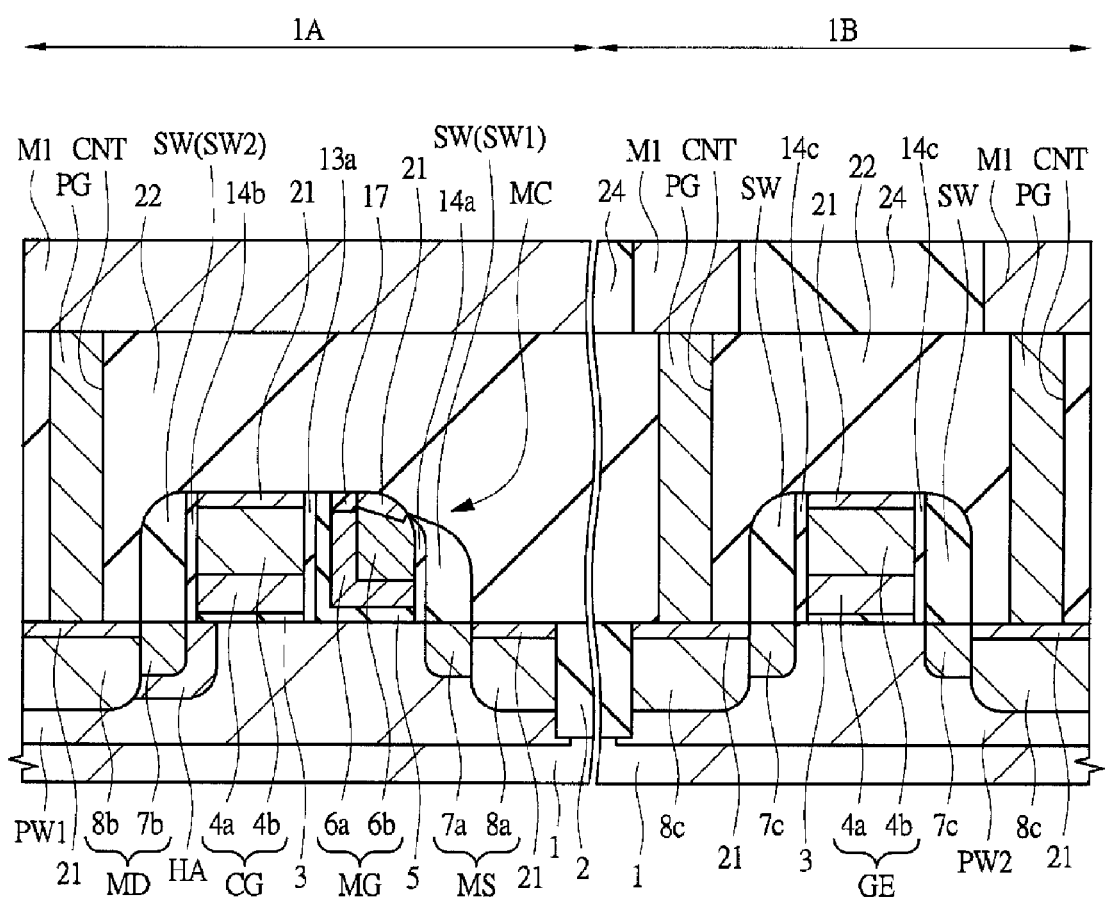
FIG. 33 is a cross-sectional view of essential parts in the process of manufacturing a semiconductor device subsequent to FIG. 32.

First, as shown in FIG. 33, over the interlayer insulating film 22 in which the plug PG has been embedded, the insulating film 24 is formed. The insulating film 24 may also be formed from a stacked film of a plurality of insulating films. Then, after a wiring trench is formed in a prescribed region of the insulating film 24 by dry etching using a photoresist pattern (not shown) as an etching mask, over the insulating film 24 including over the bottom part and the side wall of the wiring trench, a barrier conductor film (a titanium nitride film, a tantalum film, a tantalum nitride, or the like) is formed. Then, over the barrier conductor film, a copper seed layer is formed by a CVD process, a sputtering process, or the like, and, furthermore, over the seed layer, a copper plated film is formed using an electrolytic plating process or the like to embed the copper plated film in the inside of the wiring trench. Then, the main conductor film (the copper plated film and the seed layer) and the barrier conductor film in regions other than the wiring trench are removed by a CMP process to form a wiring M1 of the first layer including the copper embedded in the wiring trench as a main conductive material. To simplify the drawing, FIG. 33 shows the wiring M1 with the barrier conductor film, the seed layer, and the copper plated film integrated.

The wiring M1 is connected electrically with the source region of the memory transistor (the semiconductor region MS), the drain region of the control transistor (the semiconductor region MD), the source/drain region of the MISFET in the peripheral circuit region 1B (the n$^+$-type semiconductor region 8c), the control gate electrode CG, the memory gate electrode MG, the gate electrode GE or the like via the plug PG. After that, wirings of the second layer and subsequent layers are formed by a dual damascene process or the like, but the illustration and explanation are omitted. The wiring M1 and wirings of layers upper than the wiring M1 are not limited to damascene wirings, but may be formed by patterning a conductor film for wiring. The wiring may be a tungsten wiring, an aluminum wiring, or the like.

As described above, the semiconductor device of the embodiment is manufactured.

Next, main characteristics and effects of the embodiment are explained in more detail.

As shown in FIGS. 1, 2 and 4, one of the main characteristics of the semiconductor device of the embodiment is that the memory gate electrode MG has the metal film 6a adjacent to the insulating film 5, and a silicon film 6b formed over the metal film 6a, separated from the insulating film 5 via the metal film 6a. Specifically, the memory gate electrode MG is formed from a stacked film of the metal film 6a and the silicon film 6b over the metal film 6a, the memory gate electrode MG of the portion contacting with the insulating film 5 is constituted by the metal film 6a, and the silicon film 6b of the memory gate electrode MG does not contact with the insulating film 5 and is separated from the insulating film 5 via the metal film 6a. Another main characteristics of the semiconductor device of the embodiment is that the metal oxide portion 17 is formed in the upper end part of the metal film 6a.

If the whole memory gate electrode is formed from polysilicon, differing from the embodiment, there is such an anxiety as the generation of the influence of depletion of the memory gate electrode. Consequently, by applying a metal gate electrode to the memory gate electrode, in accordance with the embodiment, it is possible to solve the problem of the depletion of the memory gate electrode, and to improve the performance (electric performance) of the semiconductor device. Because the memory gate electrode and the control gate electrode lie close to each other via a thin insulating film (an insulating film corresponding to the insulating film 5), to improve the reliability even when a metal gate electrode is applied to the memory gate electrode, it is desirable to make the structure which is not liable to short-circuit between the memory gate electrode and the control gate electrode.

In the embodiment, when a metal gate electrode is applied to the memory gate electrode, the memory gate electrode MG is formed from the stacked film of the metal film 6a and the silicon film 6b over the metal film 6a, and the metal oxide portion 17 is formed in the upper end part of the metal film 6a. The metal oxide portion 17 is formed by the oxidation of a part of the metal film 6a. If the metal oxide portion 17 is not formed in the upper end part of the metal film 6a, differing from the embodiment, since there is such an anxiety that the upper end part of the metal film 6a may short-circuit with the upper end part of the control gate electrode CG because the upper end part of the metal film 6a lies close to the upper end part of the control gate electrode CG (the end part of the metal silicide layer 21b in the upper part of the control gate electrode CG). When the metal oxide portion 17 is formed in the upper end part of the metal film 6a in accordance with the embodiment, the upper end part of the metal film 6a (16a) does not lie close to the upper end part of the control gate electrode CG (the end part of the metal silicide layer 21b in the upper part of the control gate electrode CG) and the insulating metal oxide portion 17 lies between the upper end part of the metal film 6a (16a) and the upper end part of the control gate electrode CG. Therefore, the short circuit between the upper end part of the metal film 6a and that of the control gate electrode CG is prevented.

Moreover, since the silicon film 6b constituting the memory gate electrode MG is formed over the metal film 6a being adjacent to the insulating film 5 and separated from the insulating film 5 via the metal film 6a, the silicon film 6b constituting the memory gate electrode MG and the metal silicide layer 21a over the silicon film 6b are not liable to be short-circuited with the control gate electrode CG. Out of the memory gate electrode MG, the portion that may be most liable to short-circuit with the control gate electrode CG is the upper end part of the metal film 6a. In the embodiment, the upper end part of the metal film 6a is oxidized and changed into the insulating metal oxide portion 17 and then the short circuit between the memory gate electrode and the control gate electrode is prevented. Consequently, the reliability of the semiconductor device can be improved.

It may also be considered, differing from the embodiment, to form the whole memory gate electrode from a metal film (not to use the silicon film 6b). Consequently, the whole upper surface of the memory gate electrode is oxidized to form a metal oxide portion, which takes it difficult to connect the plug PG to the memory gate electrode.

In contrast, in the embodiment, the memory gate electrode MG is set to be a stacked structure of the metal film 6a being adjacent to the insulating film 5, and the silicon film 6b formed over the metal film 6a and separated from the insulating film 5 via the metal film 6a, and the metal oxide portion 17 formed by oxidizing a part of the metal film 6a is not formed in the upper part of the silicon film 6b constituting the memory gate electrode MG. Consequently, when the plug PG is connected to the memory gate electrode MG, it is possible to form the contact hole CNT and the plug PG over the silicon film 6b and to connect the plug PG to the metal silicide layer 21a over the silicon film 6b. Accordingly, the formation of the metal oxide portion 17 never hinders the connection of the plug PG to the memory gate electrode MG.

Further, in the embodiment, when forming the insulating film 15 for the sidewall spacer SW is formed in Step S19, the metal oxide portion 17 having been formed by oxidizing a part of the metal film 6a is formed, the increase in the number of the manufacturing processes which results from the formation of the metal oxide portion 17 can be regulated.

Moreover, when the metal silicide layer is formed in the upper part of the control gate electrode, a short circuit is liable to occur between the memory gate electrode and the control gate electrode. Therefore, an extremely large effect is obtained by the application of the embodiment and embodiments 2 and 4 below to a case where the metal silicide layer 21b is formed in the upper part of the control gate electrode CG.

Moreover, when the insulating film 5 includes the insulating film 5d in the uppermost layer as shown in FIG. 4, the following effects can also be obtained.

In the embodiment, the insulating film 5 includes the insulating film 5d in the uppermost layer and contacts the insulating film 5d, and the memory gate electrode MG is formed. The insulating film 5d is an insulating film that may generate Fermi level pinning. Consequently, because the Fermi level pinning occurs at the interface of the insulating film 5d and the memory gate electrode MG, the Fermi level can be fixed at a low level (at a low energy position) as compared with the case where the insulating film 5d does not exist (the case in FIG. 1). Consequently, an action that makes the potential difference (its absolute value) between the memory gate electrode MG and the semiconductor substrate 1 (the p-type well PW1) small can be obtained. By the action, in the case in FIG. 4, it is possible to regulate such a phenomenon that holes accumulated (retained) in the silicon nitride film 5b go out unnecessarily toward the semiconductor substrate 1 (the p-type well PW1) side, and such a phenomenon that electrons are injected unnecessarily into the silicon nitride film 5b from the semiconductor substrate 1 (the p-type well PW1) side. As a result, it is possible to improve retention properties of the nonvolatile memory for data (retention properties of the nonvolatile memory for stored information) and to improve the performance (the electric performance) of semiconductor devices having the nonvolatile memory. Moreover, by heightening the permittivity of the insulating film 5d, even when the insulating film 5d is added, it is possible to suppress the increase in the effective film thickness (the equivalent oxide film thickness) of the insulating film 5 interposed between the memory gate electrode MG and the semiconductor substrate 1 (the p-type well PW1), as compared with the case where no insulating film 5d is formed (corresponding to FIG. 1). Consequently, even when the insulating film 5d is added, since it is possible to regulate or prevent the lowering of electric field generating in the insulating film 5 interposed between the memory gate electrode MG and the semiconductor substrate 1 (the p-type well PW1) in a write operation or in an erase operation, the lowering of the write speed or the erase speed can be prevented.

Accordingly, the insulating film 5d must be selected from both viewpoints of the capability of generating the Fermi level pinning and having high-permittivity. From the viewpoints, the insulating film 5d is formed from a metal compound containing at least one of Hf (hafnium), Zr (zirconium), Al (aluminum), Ta (tantalum), and La (lanthanum). Specifically, the particularly favorable material films as the insulating film 5d include a hafnium oxide film, a zirconium oxide film, an aluminum oxide film, a tantalum oxide film, and a lanthanum oxide film.

Furthermore another main characteristics of the semiconductor device in the embodiment is that a metal gate electrode is applied to the control gate electrode CG. The control gate electrode CG has the metal film 4a formed over the gate insulating film (the insulating film 3). When a polysilicon gate electrode is applied to the control gate electrode, there is such an anxiety that the control gate electrode is depleted and the driving force lowers. In accordance with the embodiment, by applying a metal gate electrode to the control gate electrode CG, the problem of the depletion of the control gate electrode CG can be solved and the driving force can be improved. Consequently, the performance (the electric performance) of the semiconductor device can be improved.

To improve the performance (the electric performance) of the nonvolatile memory, speeding up the control transistor is important. By applying a metal gate electrode to the control gate electrode CG, the resistance of the control gate electrode CG can be lowered to raise the driving force, too, and the control transistor can be speeded up. Consequently, the performance (the electric performance) of the semiconductor device having the nonvolatile memory can be improved.

When the metal gate electrode is used, as compared with a case where a polysilicon gate electrode is used, the absolute value of the threshold voltage of a MISFET becomes large. The threshold voltage depends also on the impurity concentration in the channel region. When the threshold voltages of the MISFETs is set to be equal in the cases where the metal gate electrode is used and where the polysilicon gate electrode is used, the case where the metal gate electrode is used can lower the impurity concentration in the channel region more than the case where the polysilicon gate electrode is used.

When threshold voltages are set to be equal in the case where the metal gate electrode is used for the control gate electrode CG and in the case where the polysilicon gate electrode is used for it, the impurity concentration in the control transistor channel region can be lowered in the case where the metal gate electrode is used for the control gate electrode CG more than in the case where the polysilicon gate electrode is used for it. The channel region of the control transistor means a channel region formed on the lower side of the control gate electrode CG, and, specifically, corresponds to the channel region formed on the lower side of the insulating film 3 in the lower part of the control gate electrode CG in the p-type well PW1 (the semiconductor substrate 1). In the embodiment, it is possible to lower the impurity concentration in the channel region of the control transistor by applying the metal gate electrode to the control gate electrode CG, as compared with the case where the polysilicon gate electrode is applied to the control gate electrode.

In the embodiment, the impurity concentration in the channel region of the control transistor is, more preferably, set to be not more than $1 \times 10^{17}/cm^3$. The reason why the channel region of the control transistor has such low impurity concentration is as follows.

Figure 34:
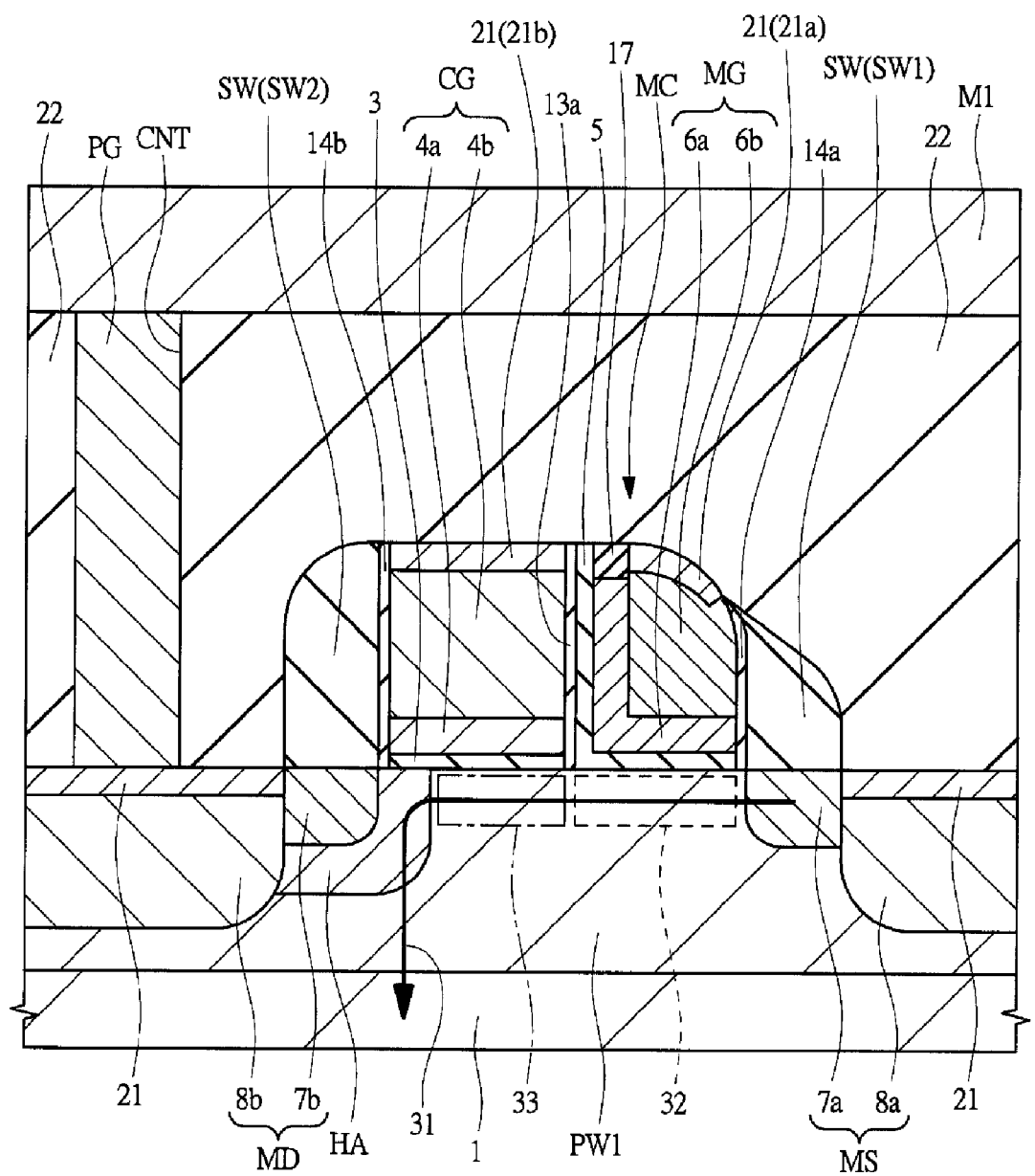
FIG. 34 is an explanatory view for explaining a leak current.

To make a nonvolatile memory have a higher capacity and a smaller size, it is effective to make the cell size of the nonvolatile memory smaller. The gate length of the control gate electrode is desired to be made smaller. When the gate length of the control gate electrode is made small, to compensate accompanying lowering of the threshold voltage, the impurity concentration in the channel region of the control transistor needs to be increased. If the impurity concentration in the channel region of the control transistor is increased when the gate length of the control gate electrode is made small, a leak current 31 shown in FIG. 34 may increase. FIG. 34 is an explanatory view for explaining the leak current 31, and shows the same cross-sectional view as FIG. 1. In FIG. 34, the region 32 surrounded by a doted line corresponds to a substrate region (a Si substrate region) in which an inversion layer (the inversion layer behaves as an n-type region) is formed, when holes are accumulated in the insulating film 5, by the holes accumulated in the insulating film 5, and the inversion layer (the region 32) is formed just beneath the insulating film 5 under the memory gate electrode MG.

When holes are accumulated in the insulating film 5 to form the inversion layer in the region 32, a leak current flows through a path shown by an arrow to which a symbol 31 is given in FIG. 34 (the leak current is called a leak current 31). The leak current 31 flows from the $n^+$-type semiconductor region 8a to the semiconductor substrate 1, via the $n^-$-type semiconductor region 7a, the inversion layer (the inversion layer formed in the region 32), the channel region of the control transistor (corresponding to a region 33 surrounded by a dashed one-dotted line in FIG. 34), the halo region HA, and the p-type well PW1. The higher the impurity concentration in the channel region of the control transistor becomes, the easier the leak current 31 flows (the leak current 31 increases). This is because a higher impurity concentration in the channel region of the control transistor (corresponding to the region 33 surrounded by the dashed one-dotted line in FIG. 34) leads to a stronger electric field and makes the leak current 31 flow easier.

As described above, if the impurity concentration in the channel region of the control transistor is increased when the gate length of the control gate electrode CG is made small, the leak current 31 may increase. In the embodiment, because the absolute value of the threshold voltage of the control transistor can be made large by using the metal gate electrode for the control gate electrode CG, even when the gate length of the control gate electrode CG is made small, it is unnecessary to lower the impurity concentration in the channel region of the control transistor. Even when the gate length of the control gate electrode is made small, the accompanying lowering of the threshold voltage can be compensated by applying the metal gate electrode to the control gate electrode CG, instead of increasing the impurity concentration in the channel region of the control transistor. Consequently, in the embodiment, as the result of applying the metal gate electrode to the control gate electrode CG, it becomes possible to lower the impurity concentration in the channel region of the control transistor, the leak current 31 can be regulated to improve the reliability of the semiconductor device having the nonvolatile memory. Moreover, it is also possible to improve the retention properties of data, and to improve the performance (the electric performance) of the semiconductor device having the nonvolatile memory. Also, the variation of characteristics between memory cells of the nonvolatile memory can be regulated or prevented.

When the gate length of the control gate electrode CG is made small, particularly when the gate length of the control gate electrode CG is not more than 80 nm, the leak current 31 is liable to become large, the embodiment and embodiments 3, 4 and 5 below exert large effect when they are applied to cases where the gate length of the control gate electrode CG is not more than 80 nm. And, the leak current 31 can be regulated by lowering the impurity concentration in the channel region of the control transistor, and the effect becomes large when the impurity concentration in the channel region of the control transistor is not more than $1 \times 10^{17}/cm^3$. Consequently, in the embodiment and embodiments 3, 4 and 5 below, the impurity concentration in the channel region of the control transistor is more preferably not more than $1 \times 10^{17}/cm^3$.

In the embodiment, the metal gate electrode is applied to the control gate electrode CG, as described above, preferably a high-permittivity gate insulating film is applied to the gate insulating film (the insulating film 3) of the control transistor. As the result of the reduction of cell size of nonvolatile memories, that of the thickness of control transistors has proceeded, but there is such an anxiety that, when a thin silicon oxide film is used as a gate insulating film, a tunneling current may occur, in which electrons flowing through the channel of the control transistor tunnel a barrier formed by the gate insulating film of the silicon oxide to flow into the control gate electrode. However, by applying a high-permittivity gate insulating film to the gate insulating film (the insulating film 3) of the control transistor, because a physical film thickness can be increased when the capacity is set to be the same, it is possible to reduce the leak current tunneling the gate insulating film of the control transistor and flowing into the control gate electrode CG. Consequently, the reliability of the semiconductor device having the nonvolatile memory can furthermore be improved.

Further, because the increase in the absolute value of the threshold voltage of the control transistor can be achieved by applying a high-permittivity gate insulating film to the gate insulating film (the insulating film 3) of the control transistor, as described above, it becomes possible to furthermore lower the impurity concentration in the channel region of the control transistor, and to regulate furthermore the leak current 31. Consequently, the reliability of the semiconductor device having the nonvolatile memory can furthermore be improved.

Embodiment 2

Figure 35:
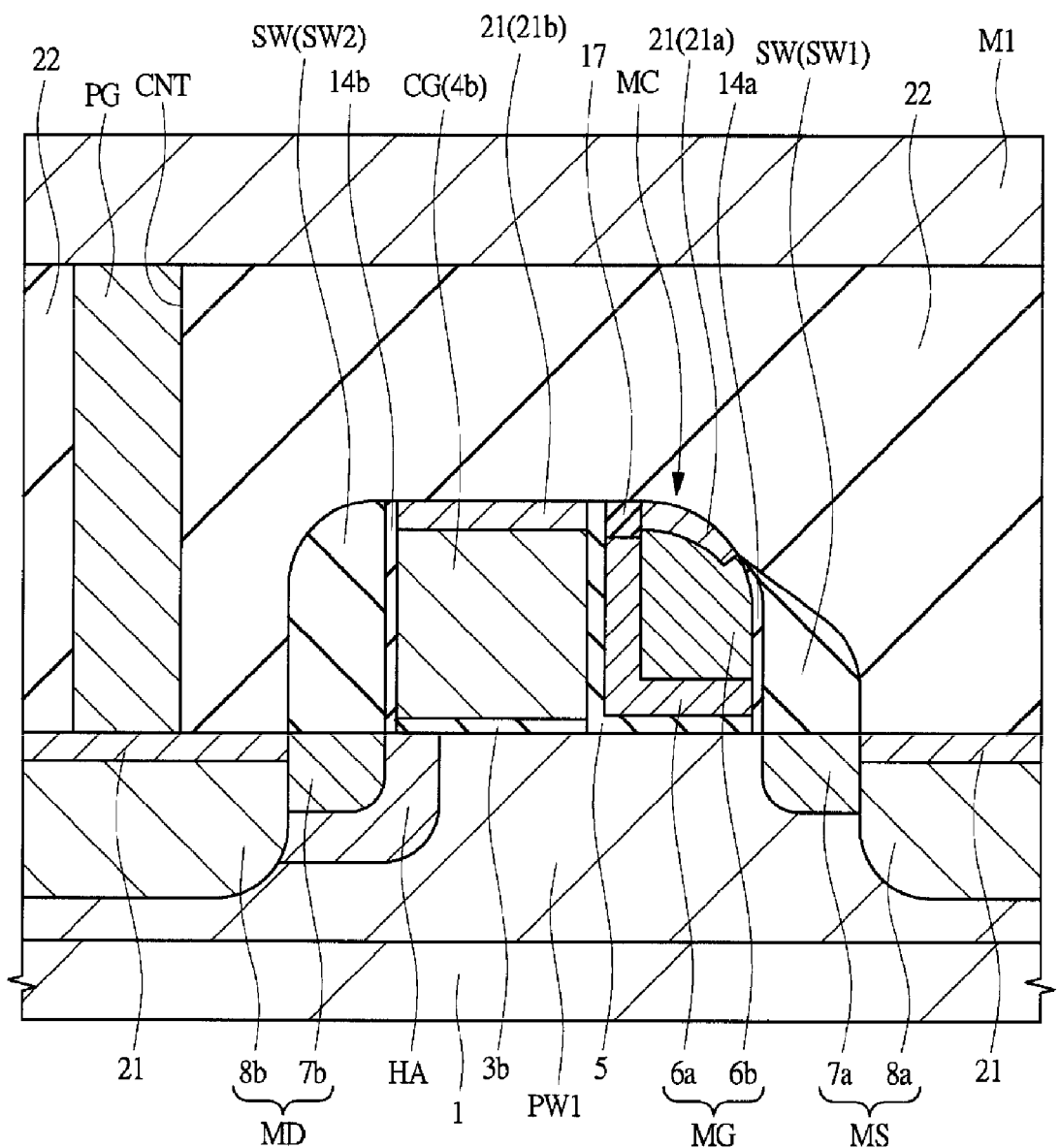
FIG. 35 is a cross-sectional view of essential parts of a semiconductor device in another embodiment of the present invention.

FIG. 35 is a cross-sectional view of essential parts of the semiconductor device in the embodiment 2, and corresponds to FIG. 1 in the embodiment 1. The semiconductor device in the embodiment is also a semiconductor device including a nonvolatile memory. FIG. 35 shows a cross-sectional view of essential parts in the memory cell region of the nonvolatile memory.

The semiconductor device in the embodiment differs from that in the embodiment 1 in the control gate electrode CG and the gate insulating film of the control transistor. In the embodiment 1, the control gate electrode CG is formed from the metal film 4a and the silicon film 4b over the metal film 4a. In the embodiment 2, the control gate electrode CG does not have the metal film 4a but is formed from a single film of the silicon film 4b. The metal silicide layer 21b is formed in the upper part of the silicon film 4b is the same in the embodiments 2 and 1. In the embodiment 1, the control gate electrode CG is a metal gate electrode. In the embodiment 2, the control gate electrode CG is a polysilicon gate electrode (a gate electrode including polysilicon).

Further, in the embodiment 1, the gate insulating film of the control transistor is formed form the insulating film 3 being a high-permittivity film, or from the stacked structure (the stacked film) of the interface layer 3a and the insulating film 3. In the embodiment 2, the gate insulating film of the control transistor is formed from the insulating film 3b including a silicon oxide film or a silicon oxynitride film. In the embodiment 2, between the control gate electrode CG including the silicon film 4b and the semiconductor substrate 1 (the p-type well PW1), the insulating film 3b including a silicon oxide film or a silicon oxynitride film is formed, and the insulating film 3b (the insulating film 3 under the control gate electrode CG) functions as the gate insulating film of the control transistor. In the embodiment 2, as the result of applying the polysilicon gate electrode to the control gate electrode CG and applying the insulating film 3b including a silicon oxide film or a silicon oxynitride film to the gate insulating film of the control transistor, the formation of the side wall insulating film 13a is omitted.

Because the other structure of the semiconductor device in the embodiment is fundamentally the same as that in embodiment 1, the explanation is omitted.

Next, the process of manufacturing a semiconductor device of the embodiment is explained. Differences from the manufacturing process of the embodiment 1 are mainly explained.

Figure 36:
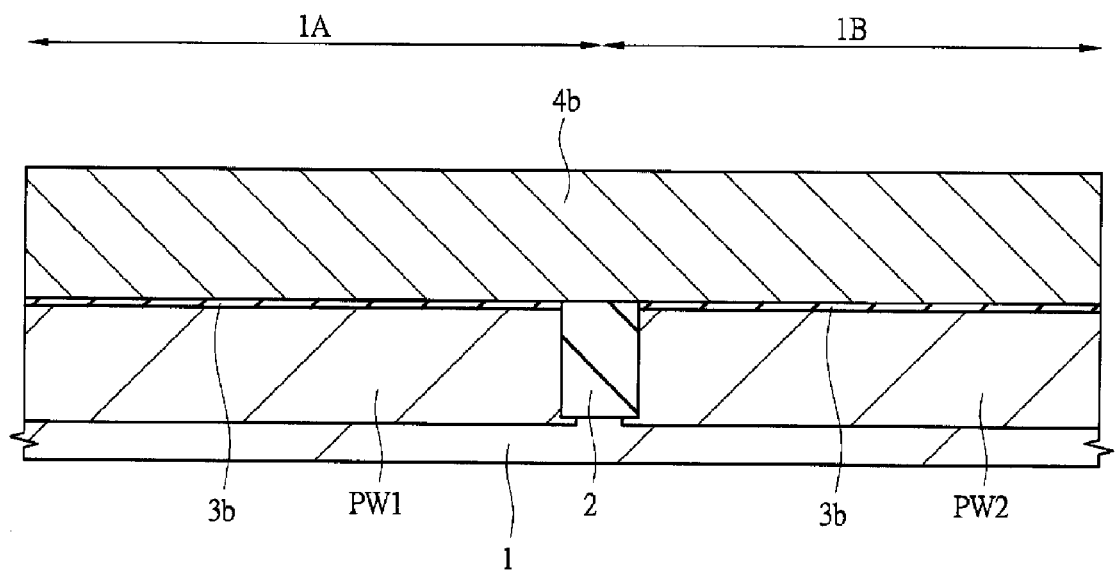
FIG. 36 is a cross-sectional view of essential parts in the process of manufacturing a semiconductor device in another embodiment of the present invention.
Figure 37:
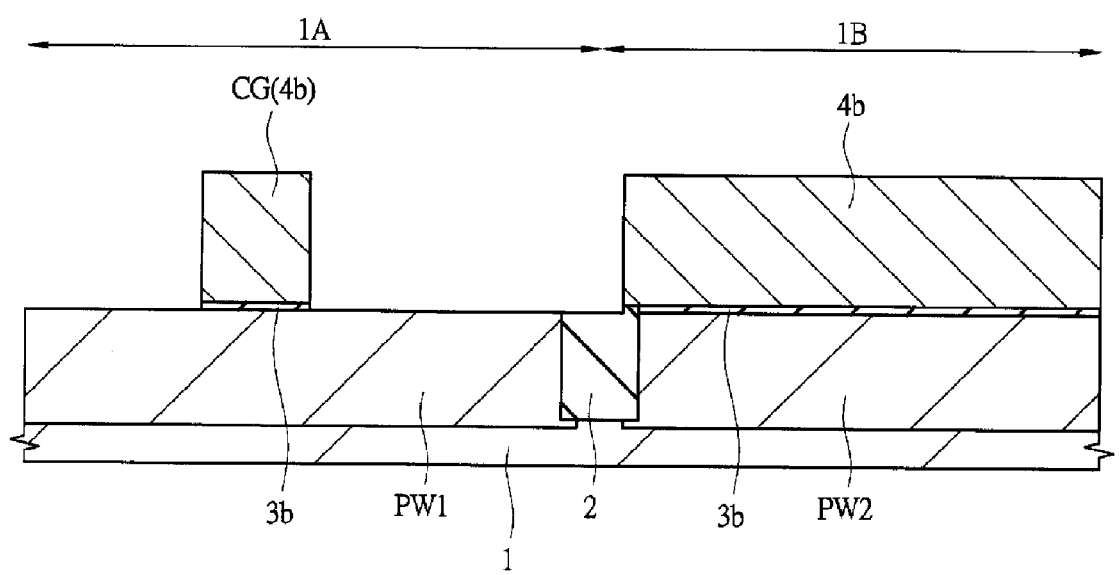
FIG. 37 is a cross-sectional view of essential parts in the process of manufacturing a semiconductor device subsequent to FIG. 36.

FIGS. 36 and 37 are cross-sectional views of essential parts in the process of manufacturing a semiconductor device in the embodiment. FIGS. 36 and 37 show cross sections corresponding to those of the embodiment 1 in FIGS. 8 to 15 and 18 to 33.

To manufacture the semiconductor device in the embodiment, after performing Steps S1, S2 and S3 in the same manner as in the embodiment 1, as shown in FIG. 36, the surface of the semiconductor substrate 1 (the p-type wells PW1 and PW2) is cleaned by diluted hydrofluoric acid cleaning, and the insulating film 3b for the gate insulating film is formed over the main surface of the semiconductor substrate 1 (the surfaces of the p-type wells PW1 and PW2). The insulating film 3b can be formed from a thin silicon oxide film or silicon oxynitride film. The thickness (formed thickness) of the insulating film 3b may be around 2 to 3 nm. Instead of performing the formation process of the interface layer 3a and the insulating film 3 in Step S4 in the embodiment 1, the formation process of the insulating film 3b is performed in the embodiment 2.

Then, in the embodiment, without forming the metal film 4a, as shown in FIG. 36, the silicon film 4b for the gate electrode is formed (deposited) over the main surface (the whole main surface) of the semiconductor substrate 1 (over the insulating film 3b). Instead of forming the stacked film 4 of the metal film 4a and the silicon film 4b in Steps S5 and S6 in the embodiment 1, a single film of the silicon film 4b is formed in the embodiment 2.

Then, the silicon film 4b in the memory cell region 1A is etched (preferably dry-etched) and patterned to form the control gate electrode CG including the silicon film 4b. Instead of patterning the stacked film 4 of the metal film 4a and the silicon film 4b to form the control gate electrode CG in Step S7 in the embodiment 1, the silicon film 4b is patterned to form the control gate electrode CG in the embodiment 2.

In the embodiment 2, as the result of applying the polysilicon gate electrode to the control gate electrode CG and applying the insulating film 3b including a silicon oxide film or a silicon oxynitride film to the gate insulating, film of the control transistor, the formation process of the side wall insulating film 13a in Step S8 is omitted.

Subsequent processes are fundamentally the same as in the embodiment 1, and the explanation is omitted.

In the embodiment 2, regarding the control transistor, structures of the gate insulating film and the control gate electrode CG are different from those in the embodiment 1. In the embodiment 2, the control gate electrode CG is a polysilicon gate electrode, and the gate insulating film of the control transistor is a silicon oxide film or a silicon oxynitride film. The effects resulted from applying a metal gate electrode to the control gate electrode CG and applying a high-permittivity gate insulating film to the gate insulating film of the control transistor in the embodiment 1 can not be obtained. In the embodiment 2, the structure of the memory transistor is the same as that in the embodiment 1. Consequently, effects resulted from the structure of the memory transistor (the structure of the memory gate electrode MG, the formation of the metal oxide portion 17, and the structure of the insulating film 5) in the embodiment 1 can also be obtained in the embodiment 2 (the repeated explanation of the effect is omitted).

Embodiment 3

Figure 38:
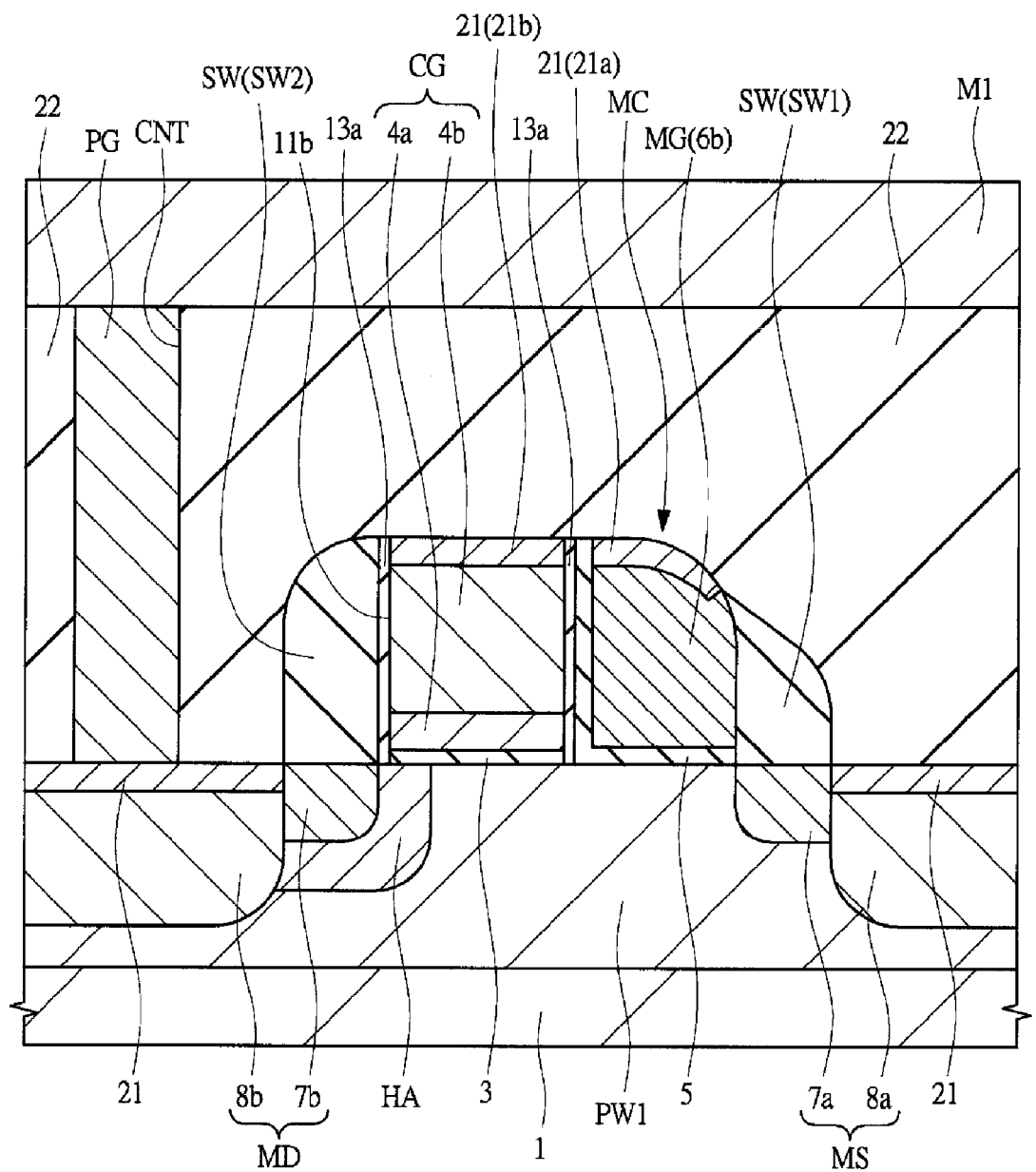
FIG. 38 is a cross-sectional view of essential parts of a semiconductor device in another embodiment of the present invention.

FIG. 38 is a cross-sectional view of essential parts of the semiconductor device in the embodiment 3, and corresponds to FIG. 1 in the embodiment 1. The semiconductor device in the embodiment is also a semiconductor device including a nonvolatile memory. FIG. 38 shows a cross-sectional view of essential parts of the memory cell region of the nonvolatile memory.

The semiconductor device in the embodiment differs from that in the embodiment 1 in the memory gate electrode MG of the memory transistor. In the embodiment 1, the memory gate electrode MG is formed from the metal film 6a and the silicon film 6b over the metal film 6a. In the embodiment 3, the memory gate electrode MG does not have the metal film 6a, and is formed from the single film of the silicon film 6b. As the result that the memory gate electrode MG does not have the metal film 6a, the metal oxide portion 17 is also not formed. In the embodiment 3, the memory gate electrode MG includes the single film of the silicon film 6b and the metal silicide layer 21 is formed in the upper part of the silicon film 6b. In the embodiment 1, the memory gate electrode MG is a metal gate electrode. In the embodiment 3, the memory gate electrode MG is a polysilicon gate electrode (a gate electrode including polysilicon).

Moreover, in the embodiment, as the result that a polysilicon gate electrode is applied to the memory gate electrode MG, the metal oxide portion 17 is not formed, and the formation of the side wall insulating films 14a and 14b may also be omitted. FIG. 38 shows a case where the formation of the side wall insulating films 14a and 14b are omitted. When an offset spacer is necessary in the ion implantation process for forming the n⁻-type semiconductor regions 7a and 7b (corresponding to Step S17), in the same manner as in the embodiment 1, the side wall insulating films 14a and 14b may also be formed in the embodiment 3. FIG. 38 shows a case where the side wall insulating film 13a over the side wall 11b of the control gate electrode CG has not been removed.

The other structure of the semiconductor device of the embodiment is fundamentally the same as that of the embodiment 1, and the explanation is omitted.

Next, the process of manufacturing a semiconductor device of the embodiment is explained. Differences from the manufacturing process of the embodiment 1 are mainly explained.

Figure 39:
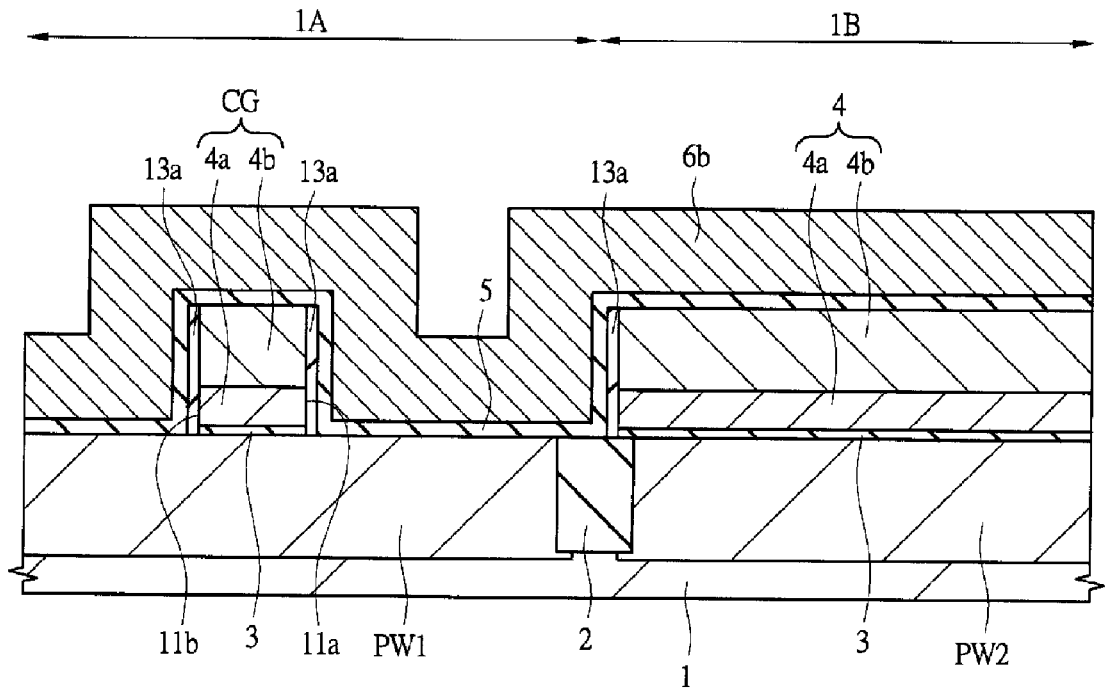
FIG. 39 is a cross-sectional view of essential parts in a process of manufacturing a semiconductor device in another embodiment of the present invention.
Figure 40:
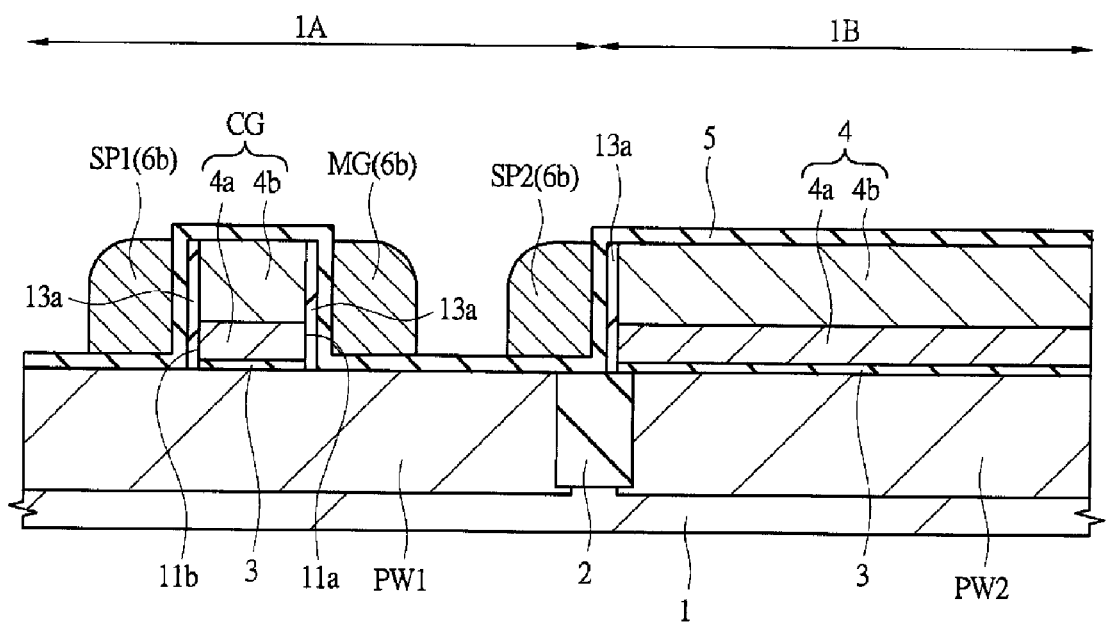
FIG. 40 is a cross-sectional view of essential parts in the process of manufacturing a semiconductor device subsequent to FIG. 39.

FIGS. 39 and 40 are cross-sectional views of essential parts in the process of manufacturing a semiconductor device in the embodiment 3. FIGS. 39 and 40 show cross sections corresponding to those in FIGS. 8 to 15 and 18 to 33 in the embodiment 1.

To manufacture the semiconductor device in the embodiment, first, in the same manner as in the embodiment 1, processes until Step S9 are performed to obtain the structure in FIG. 15. Then, without forming the metal film 6a, as shown in FIG. 39, over the main surface (the whole main surface) of the semiconductor substrate 1 (over the insulating film 5), the silicon film 6b for forming the memory gate electrode is formed (deposited), in the memory cell region 1A, to cover the control gate electrode CG, and, in the peripheral circuit region 1B, to cover the stacked film 4. Instead of forming the stacked film 6 of the metal film 6a and the silicon film 6b in Steps S10 and S11 in the embodiment 1, a single film of the silicon film 6b is formed in the embodiment 3.

Then, by etching back (etching, dry-etching, anisotropically etching) the silicon film 6b by an anisotropic etching technology, the memory gate electrode MG including the silicon film 6b is formed. Instead of forming the memory gate electrode MG by etching back the stacked film 6 of the metal film 6a and the silicon film 6b in Step S12 in the embodiment 1, the silicon film 6b is etched back to form the memory gate electrode MG in the embodiment 3. In forming the memory gate electrode MG by etching back the silicon film 6b, the stacked film spacers SP1 and SP2 are also formed. In the embodiment 1, the stacked film spacers SP1 and SP2 are formed from the stacked film 6 of the metal film 6a and the silicon film 6b. In the embodiment 3, the stacked film spacers SP1 and SP2 include the silicon film 6b.

Because subsequent processes are fundamentally the same as in the embodiment 1, the explanation is omitted. But, in the embodiment 3, as the result of applying a polysilicon gate electrode to the memory gate electrode MG, the metal oxide portion 17 is not formed in forming the insulating film 15 in Step S19. The formation process of the side wall insulating film 14 in Step S16 can also be omitted.

In the embodiment 3, regarding the memory transistor, the structure of the memory gate electrode MG is different from that in the embodiment 1. In the embodiment 3, because the memory gate electrode MG is a polysilicon gate electrode, effects obtained as the result of applying a metal gate electrode to the memory gate electrode MG and forming the metal oxide portion 17 in the embodiment 1 cannot be obtained in the embodiment 3. However, in the embodiment 3, the structure of the control transistor is the same as that in the embodiment 1. Consequently, effects resulted from the structure of the control transistor (the structure of the control gate electrode CG, the structure of the gate insulating film of the control transistor) in the embodiment 1 can also be obtained in the embodiment 3 (the repeated explanation is omitted).

Embodiment 4

Figure 41:
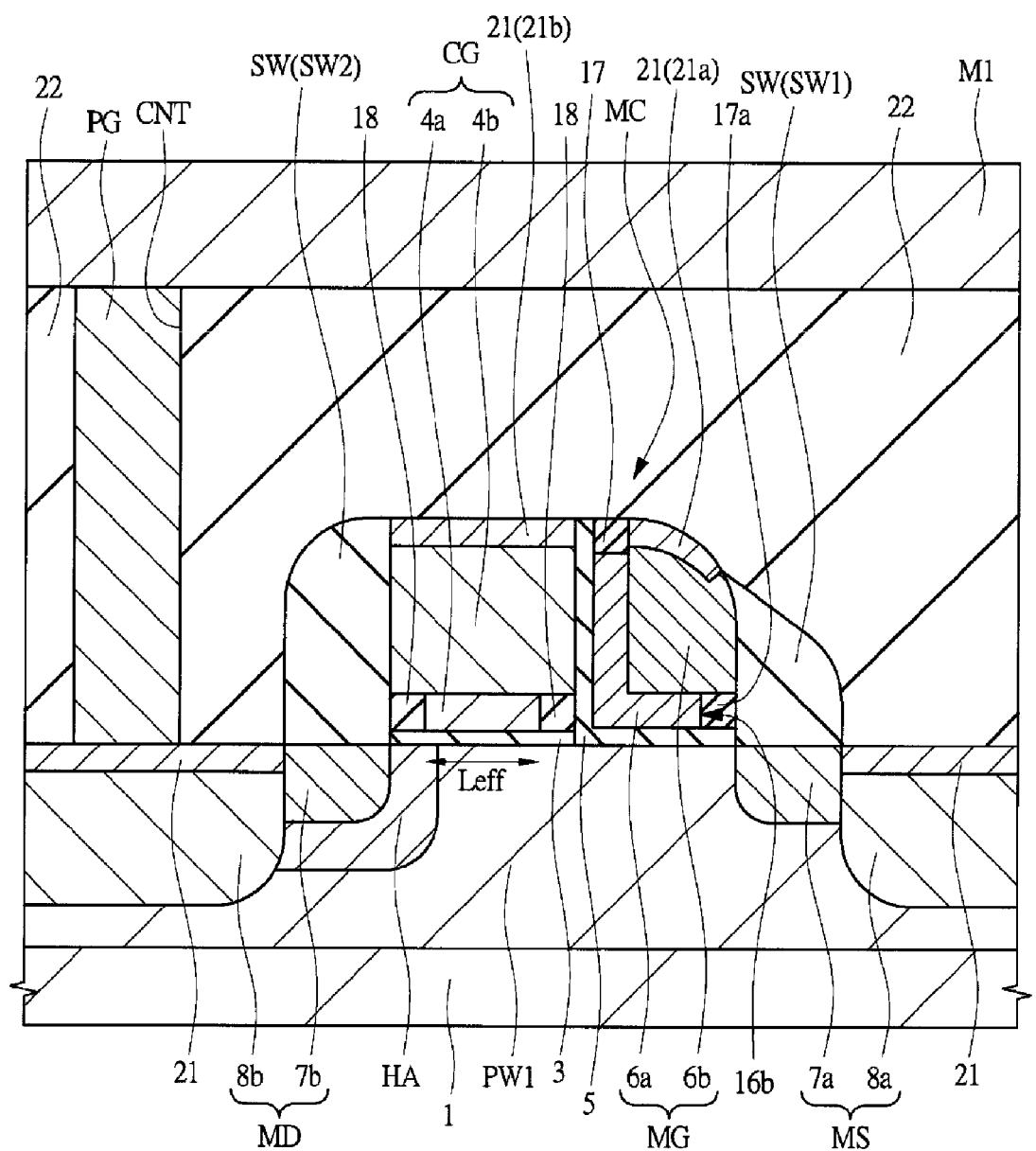
FIG. 41 is a cross-sectional view of essential parts of a semiconductor device in another embodiment of the present invention.

FIG. 41 is a cross-sectional view of essential parts of the semiconductor device in the embodiment 4, and corresponds to FIG. 1 in the embodiment 1. The semiconductor device in the embodiment is also a semiconductor device including a nonvolatile memory. FIG. 41 shows a cross-sectional view of essential parts of the memory cell region of the nonvolatile memory.

The semiconductor device in the embodiment is different from the semiconductor device in the embodiment 1 in the following point. In the embodiment 1, the metal oxide portion 17 is formed in the upper end part (16a) of the metal film 6a constituting the memory gate electrode MG. In the embodiment 4, the metal oxide portion 17 is formed in the upper end part (16a) of the metal film 6a constituting the memory gate electrode MG and the metal oxide portion 17a is formed in the side end part (16b) of the metal film 6a. In addition, in the embodiment 4, a metal oxide portion 18 is formed in the end part (particularly in both end parts in the gate length direction of the control gate electrode CG) of the metal film 4a constituting the control gate electrode CG. Moreover, the side wall insulating films 13a, 14a and 14b formed in the embodiment 1 are not formed in the embodiment 4.

The other structure of the semiconductor device in the embodiment is fundamentally the same as that in the embodiment 1, and the explanation is omitted.

The metal oxide portions 17a and 18 are explained specifically. Because the metal oxide portion 17 is the same as that in the embodiment 1, the explanation is omitted.

On the side end part 16b side of the metal film 6a constituting the memory gate electrode MG, the metal oxide portion 17a having insulating properties is formed. The metal oxide portion 17a is formed by the oxidation of a part of the metal film 6a, and the side end part 16b of the metal film 6a is adjacent to (in contact with) the metal oxide portion 17. Adjacent to the side end part 16b of the metal film 6a, the metal oxide portion 17a is formed continuously to the metal film 6a. Consequently, the side end part of the metal film 6a is oxidized and the metal oxide portion 17a is formed in the side end part of the metal film 6a. Because the sidewall spacer SW1 is formed over the side wall of the memory gate electrode MG, the metal oxide portion 17a is formed between the side end part 16b of the metal film 6a and the sidewall spacer SW1.

Because the metal oxide portion 17a is formed by the oxidation of a part of the metal film 6a, the metal element constituting the metal oxide portion 17a and the metal element constituting the metal film 6a are the same. Also, the metal element constituting the metal oxide portion 17a, the metal element constituting the metal oxide portion 17, and the metal element constituting the metal film 6a are the same. When the metal film 6a is an aluminum (Al) film, the metal oxide portion 17 and the metal oxide portion 17a include aluminum oxide.

Because the side end part of the metal film 6a is oxidized to form the metal oxide portion 17a, at least a part of the metal oxide portion 17a lies on the lower side of the silicon film 6b constituting the memory gate electrode MG. At least a part of the metal oxide portion 17a lies between the silicon film 6b constituting the memory gate electrode MG and the insulating film 5. Specifically, because the metal oxide portion 17a is sandwiched vertically by the silicon film 6b constituting the memory gate electrode MG and the insulating film 5 and is sandwiched laterally (in the gate length direction) by the metal film 6a and the sidewall spacer SW1, the metal oxide portion 17a is surrounded by the silicon film 6b constituting the memory gate electrode MG, the insulating film 5, the metal film 6a, and the sidewall spacer SW1.

In the end part of the metal film 4a constituting the control gate electrode CG (particularly, in both end parts in the gate length direction of the control gate electrode CG), the metal oxide portion 18 having insulating properties is formed. The metal oxide portion 18 is formed by the oxidation of a part of the metal film 4a, and the end part of the metal film 4a (particularly, both end parts in the gate length direction of the control gate electrode CG) is adjacent to (contacts with) the metal oxide portion 18. Consequently, the end part of the metal film 4a constituting the control gate electrode CG (particularly, both end parts in the gate length direction of the control gate electrode CG) is oxidized, and the metal oxide portion 18 is formed in the end part of the metal film 4a constituting the control gate electrode CG (particularly, in both end parts in the gate length direction of the control gate electrode CG).

Because the metal oxide portion 18 is formed by the oxidation of apart of the metal film 4a, the metal element constituting the metal oxide portion 18 and the metal element constituting the metal film 4a are the same. When the metal film 4a is an aluminum (Al) film, the metal oxide portion 18 includes aluminum oxide. Because the metal oxide portion 18 is formed by the oxidation of the end part of the metal film 4a constituting the control gate electrode CG, at least a part of the metal oxide portion 18 lies on the lower side of the silicon film 4b constituting the control gate electrode CG. At least a part of the metal oxide portion 18 lies between the silicon film 4b constituting the control gate electrode CG and the insulating film 3. Specifically, because the metal oxide portion 18 is sandwiched vertically by the silicon film 4b constituting the control gate electrode CG and the insulating film 3 and is sandwiched laterally (in the gate length direction) by the metal film 4a constituting the control gate electrode CG, and the sidewall spacer SW2 or the insulating film 5, the metal oxide portion 18 is surrounded by the silicon film 4b constituting the control gate electrode CG, the insulating film 5, the metal film 4a, and the sidewall spacer SW2 or the insulating film 5.

Next, the process of manufacturing a semiconductor device of the embodiment 4 is explained. Differences from the manufacturing process of the embodiment 1 are mainly explained.

Figure 42:
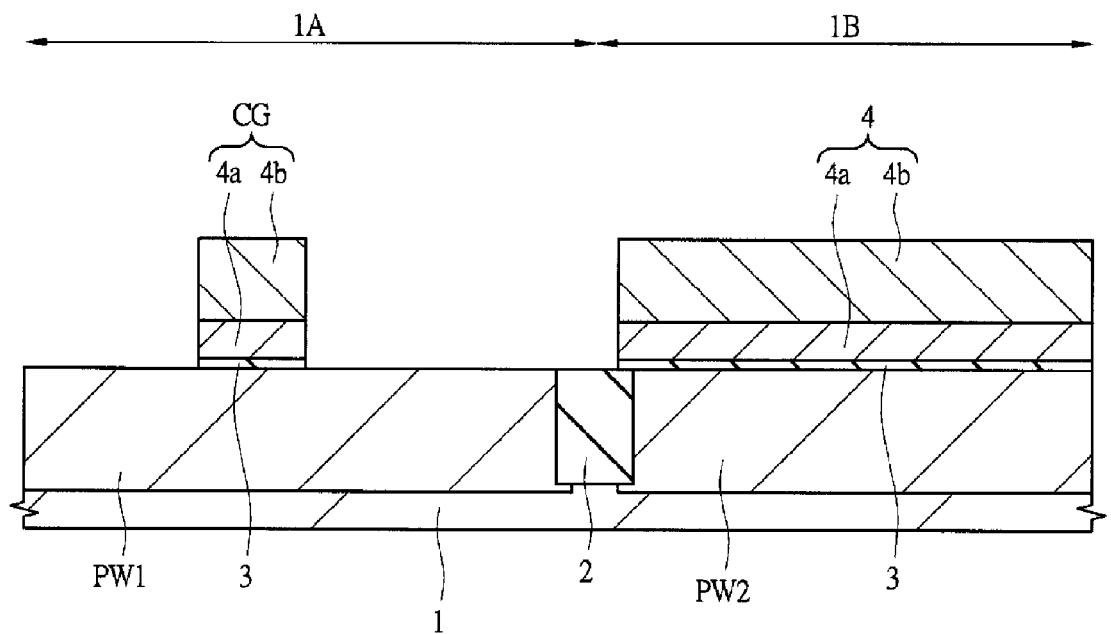
FIG. 42 is a cross-sectional view of essential parts in a process of manufacturing a semiconductor device in another embodiment of the present invention.
Figure 43:
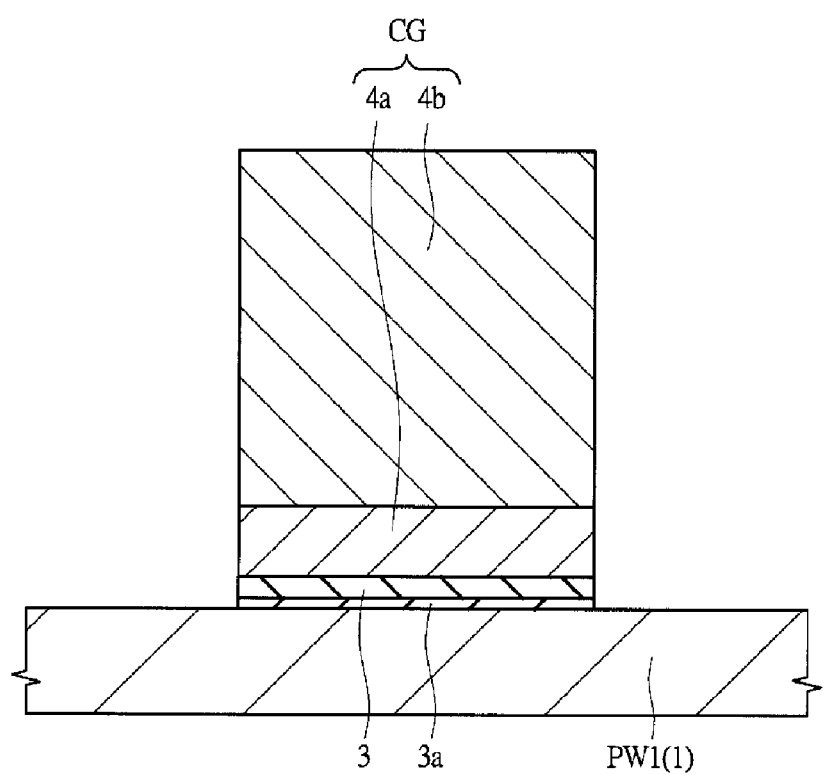
FIG. 43 is a partially enlarged cross-sectional view of FIG. 42.
Figure 44:
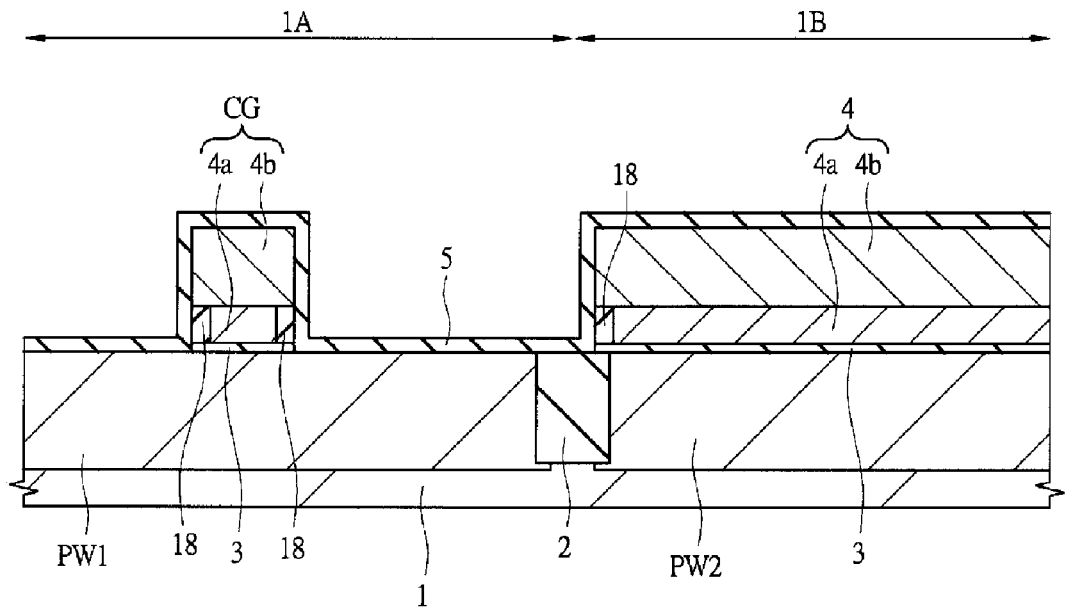
FIG. 44 is a cross-sectional view of essential parts in the process of manufacturing a semiconductor device subsequent to FIG. 42.
Figure 45:
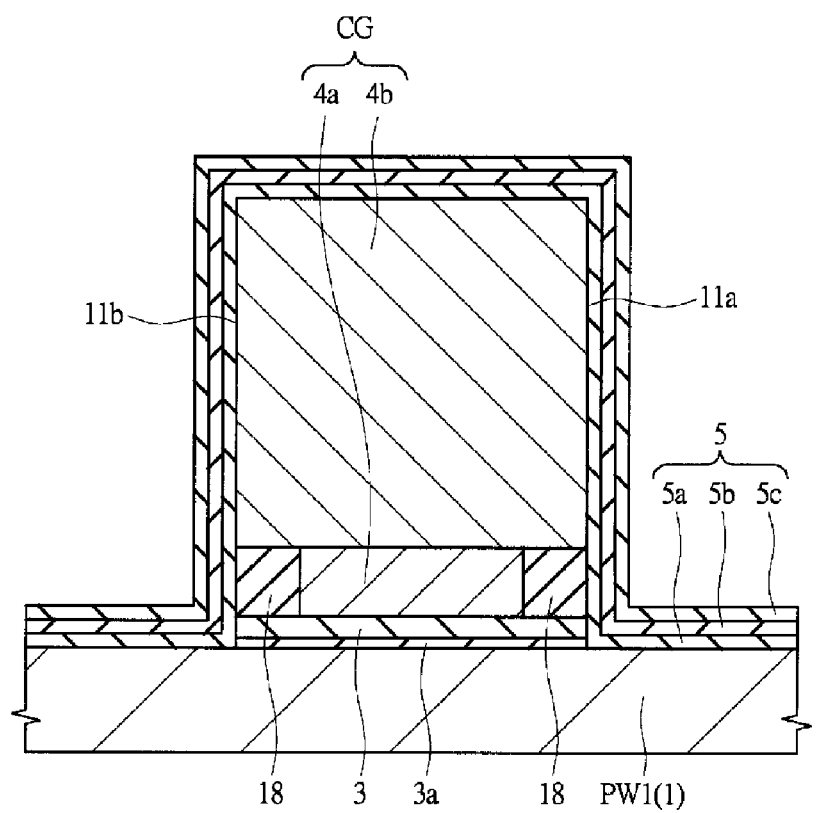
FIG. 45 is a partially enlarged cross-sectional view of FIG. 44.
Figure 46:
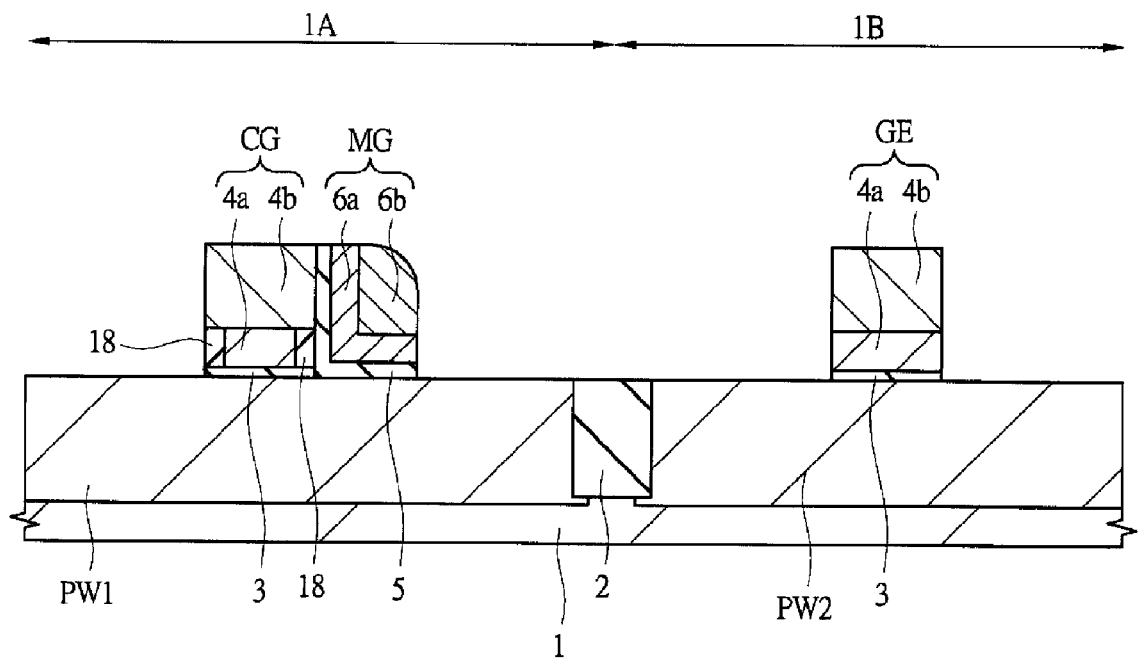
FIG. 46 is a cross-sectional view of essential parts in the process of manufacturing a semiconductor device subsequent to FIG. 44.
Figure 47:
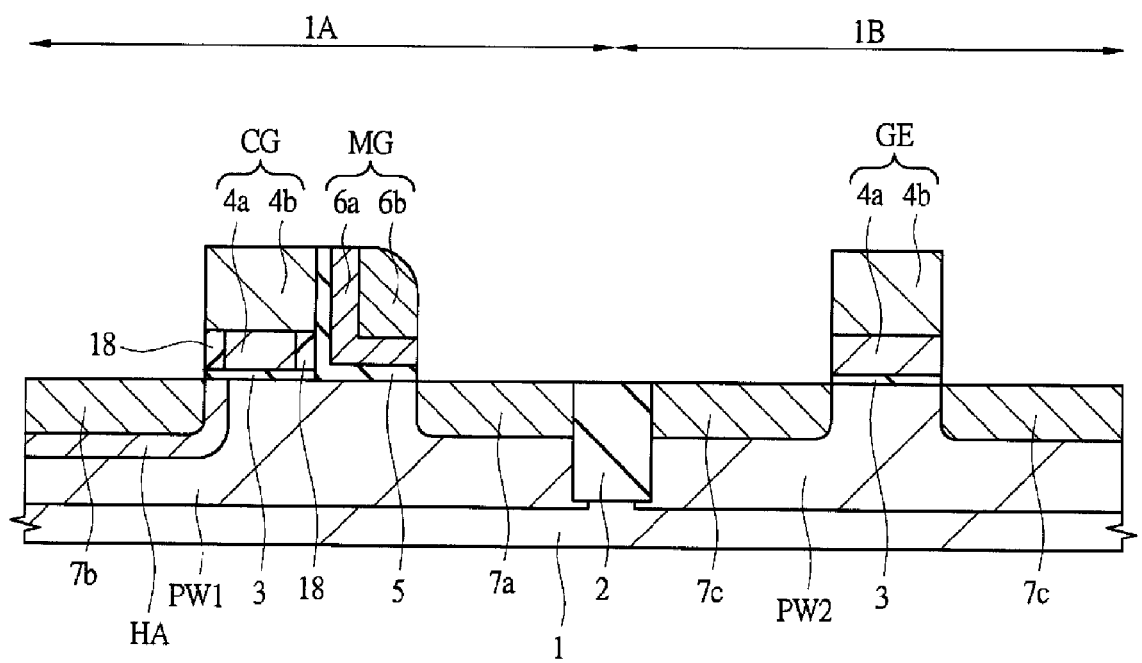
FIG. 47 is a cross-sectional view of essential parts in the process of manufacturing a semiconductor device subsequent to FIG. 46.
Figure 48:
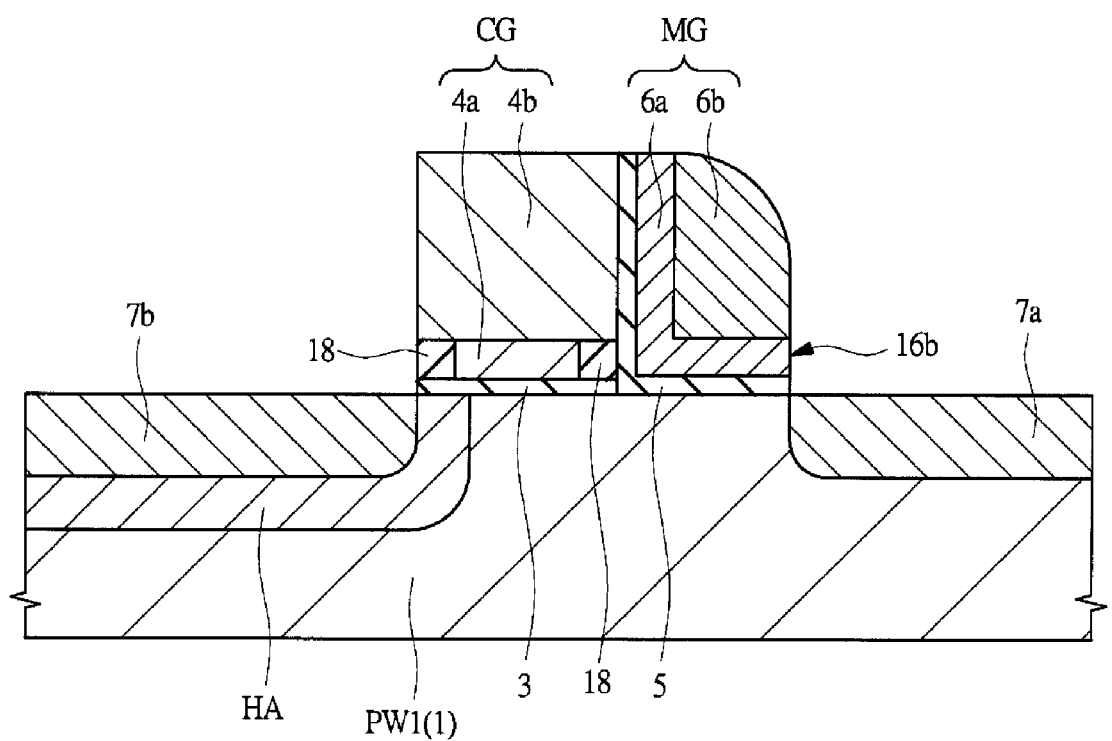
FIG. 48 is a partially enlarged cross-sectional view of FIG. 47.
Figure 49:
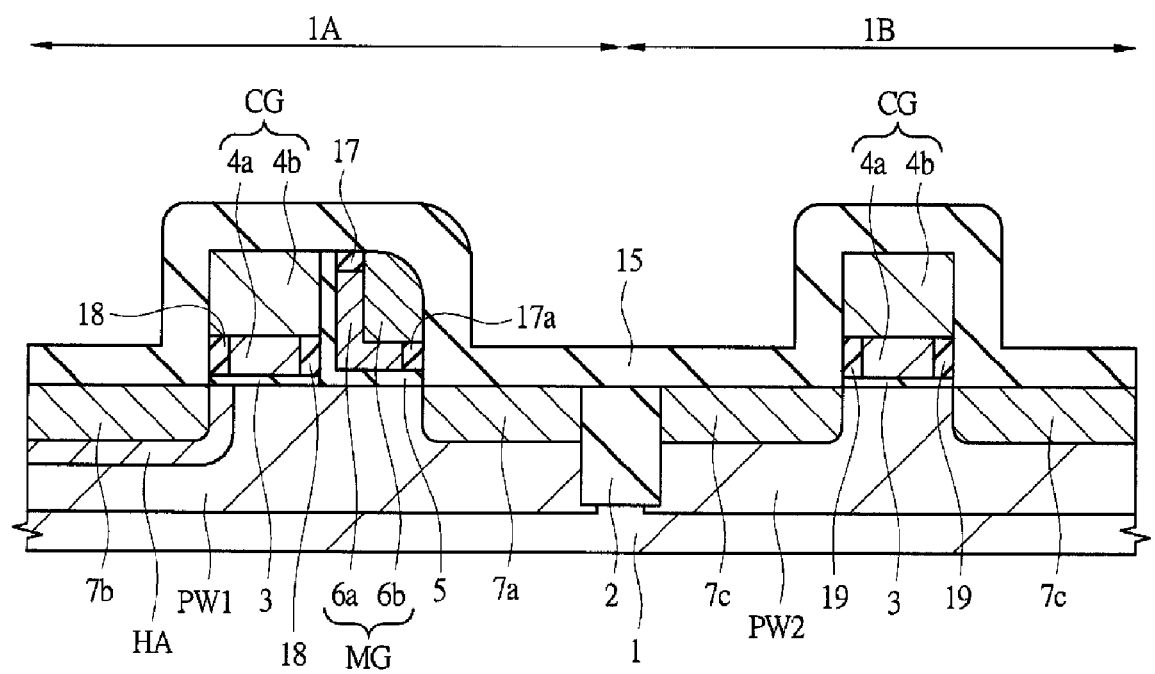
FIG. 49 is a cross-sectional view of essential parts in the process of manufacturing a semiconductor device subsequent to FIG. 47.
Figure 50:
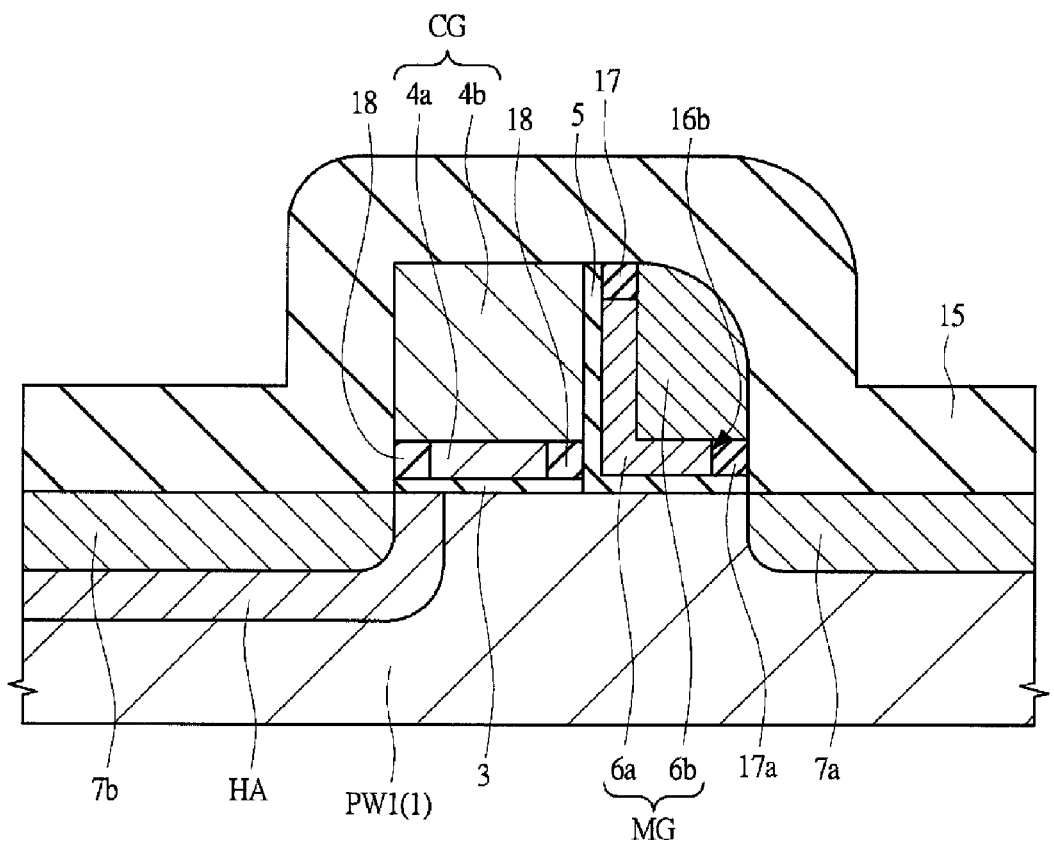
FIG. 50 is a partially enlarged cross-sectional view of FIG. 49.
Figure 51:
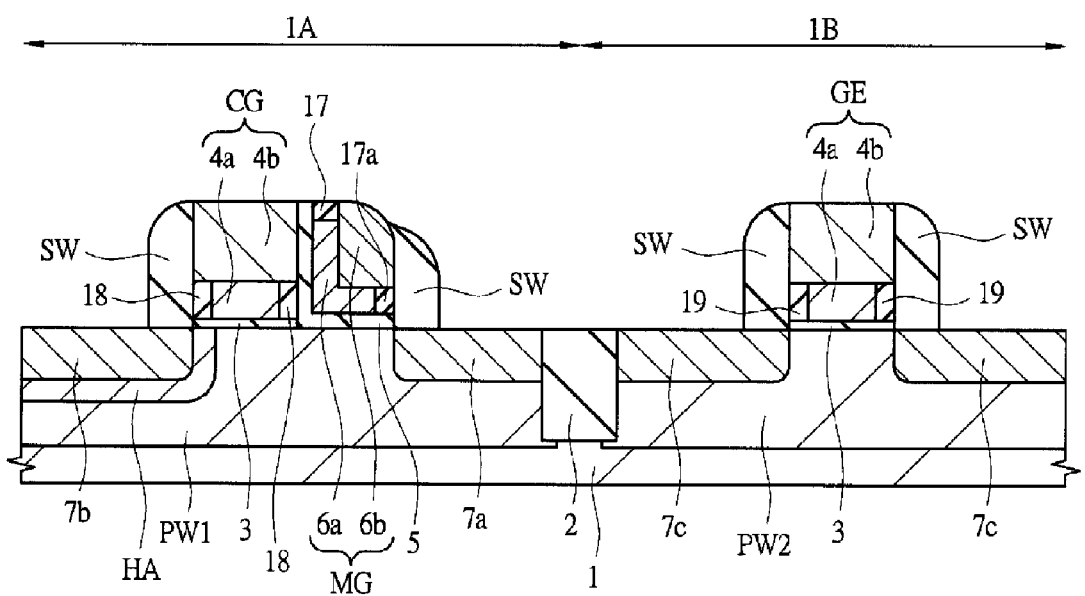
FIG. 51 is a cross-sectional view of essential parts in the process of manufacturing a semiconductor device subsequent to FIG. 49.
Figure 52:
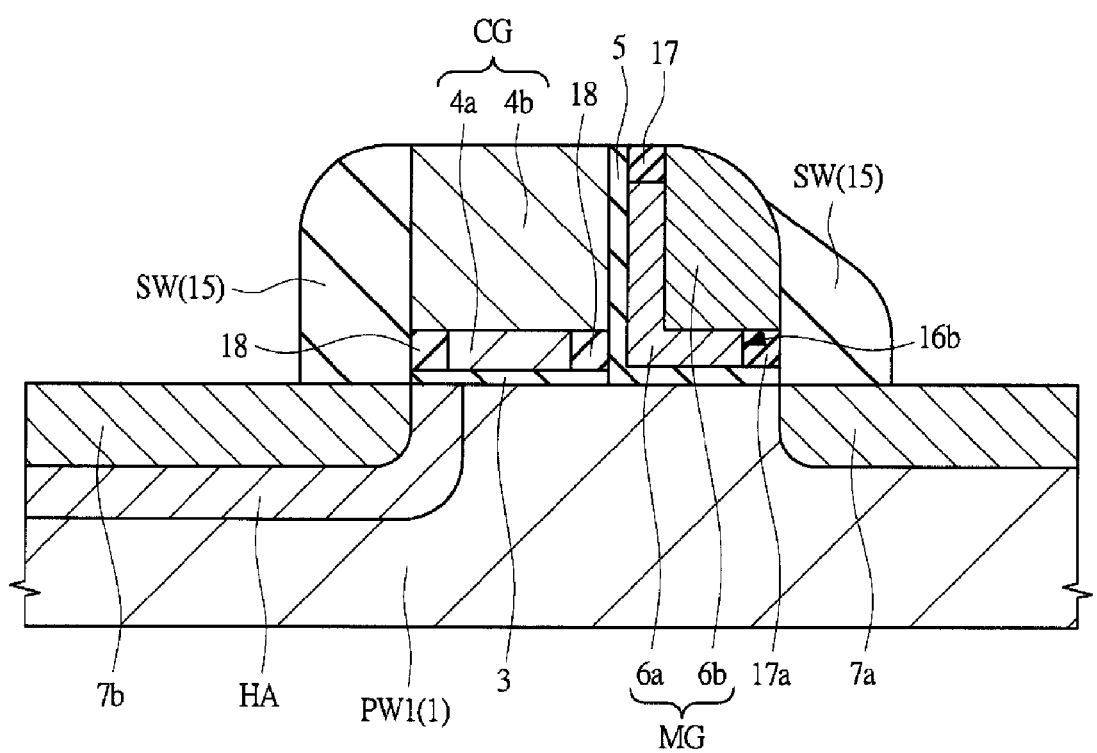
FIG. 52 is a partially enlarged cross-sectional view of FIG. 51.

FIGS. 42 to 52 are cross-sectional views of essential parts in the process of manufacturing a semiconductor device in the embodiment 4. FIGS. 42, 44, 46, 47, 49, and 51 show cross sections corresponding to those of the embodiment 1 in FIGS. 8 to 15 and 18 to 33. FIG. 43 is a partially enlarged cross-sectional view of FIG. 42. FIG. 45 is a partially enlarged cross-sectional view of FIG. 44. FIG. 48 is a partially enlarged cross-sectional view of FIG. 47. FIG. 50 is a partially enlarged cross-sectional view of FIG. 49. FIG. 52 is a partially enlarged cross-sectional view of FIG. 51.

To manufacture the semiconductor device in the embodiment 4, processes until Step S7 are performed in the same manner as in the embodiment 1 to obtain the structure in FIGS. 42 and 43 that is the same as that in FIG. 12. Then, in the embodiment 4, without performing the formation process of the side wall insulating film 13a in Step S8, the formation process of the insulating film 5 in Step S9 is performed to obtain the structure in FIGS. 44 and 45. FIG. 45 shows the case where the insulating film 5 is formed as the stacked film of the silicon oxide film 5a, the silicon nitride film 5b over the silicon oxide film 5a, and the silicon oxide film 5c over the silicon nitride film 5b. As a modification, the insulating film 5 can be formed as the stacked film of the silicon oxide film 5a, the silicon nitride film 5b over the silicon oxide film 5a, the silicon oxide film 5c over the silicon nitride film 5b, and the insulating film 5d over the silicon oxide film 5c.

In the embodiment, as shown in FIGS. 44 and 45, informing the insulating film 5, the side wall insulating film 13a is not formed over the side wall of the control gate electrode CG, and the insulating film 5 is formed over the main surface (the surface) of the semiconductor substrate 1 and over the surface (the upper surface and the side surface) of the control gate electrode CG. In the peripheral circuit region 1B, the insulating film 5 is formed over the surface (the upper surface and the side surface) of the stacked film 4. A large difference from the embodiment 1 is that, in forming the silicon oxide film 5a being the lowermost layer of the insulating film 5, the end part of the metal film 4a having constituted the control gate electrode CG (particularly, both end parts in the gate length direction of the control gate electrode CG) is oxidized to form the metal oxide portion 18 having insulating properties. In the embodiment 4, in a stage immediately prior to forming the insulating film 5, the side wall insulating film 13a is not formed over the side wall of the control gate electrode CG, and the end part of the metal film 4a constituting the control gate electrode CG (particularly, both end parts in the gate length direction of the control gate electrode CG) is exposed. Consequently, in forming the silicon oxide film 5a being the lowermost layer of the insulating film 5, it is possible to oxidize the end part of the metal film 4a having constituted the control gate electrode CG (particularly, both end parts in the gate length direction of the control gate electrode CG) to form the metal oxide portion 18. In the peripheral circuit region 1B, too, in places where the end part of the metal film 4a is exposed, the metal oxide portion 18 is formed in the same manner. The metal oxide portion 18 formed in the peripheral circuit region 1B is removed in the process of forming the gate electrode GE in later Step S15.

Moreover, in forming the silicon oxide film 5a, the end part of the metal film 4a of the control gate electrode CG (particularly, both end parts in the gate length direction of the control gate electrode CG) is oxidized to form the metal oxide portion 18. The silicon oxide film 5a is preferably formed under such conditions that can oxidize the exposed part of the metal film 4a. Because ISSG (In Situ Steam Generation) oxidation has strong oxidizing properties, the formation of the silicon oxide film 5a by the ISSG oxidation is favorable to oxidize the exposed part of the metal film 4a in the formation of the silicon oxide film 5a. Consequently, in the embodiment 4, the silicon oxide film 5a is preferably formed by the ISSG oxidation.

When a part of the metal film 4a is oxidized in forming the silicon oxide film 5a to form the metal oxide portion 18, the exposed part of the silicon film 4b may slightly be oxidized. The material of the metal film 4a and the condition for forming the silicon oxide film 5a are selected so that the metal film 4a is more easily oxidized than the silicon film 4b.

After the insulating film 5 is formed, processes until forming the gate electrode GE in Step S15 are fundamentally the same as those in the embodiment 1. Steps S10, S11, S12, S13, S14, and S15 are performed in the same manner as in embodiment 1 to obtain the structure in FIG. 46 corresponding to FIG. 22. Then, in the embodiment 4, without performing the formation process of the side wall insulating film 14 in Step S16, Step S17 (the process of forming the n⁻-type semiconductor regions 7a, 7b and 7c) and Step S18 (the process of forming the halo region HA) are performed to obtain the structure in FIG. 47 corresponding to FIG. 25. FIG. 48 is a partially enlarged cross-sectional view of FIG. 47. In the embodiment 4, Step S17 (the process of forming the n⁻-type semiconductor regions 7a, 7b and 7c) and Step S18 (the process of forming the halo region HA) are performed when no side wall insulating film 14 is formed over the side walls of the control gate electrode CG, the memory gate electrode MG, and the gate electrode GE. The other points are fundamentally the same as Steps S17 and S18 in the embodiment 1.

In the embodiment 4, the process of forming the insulating film 15 in Step S19 is performed to obtain a structure in FIG. 49 corresponding to FIG. 26. FIG. 50 is a partially enlarged cross-sectional view of FIG. 49.

In the embodiment, too, when the insulating film 15 is formed in Step S19, the exposed part of the metal film 6a having constituted the memory gate electrode MG is oxidized. Specifically, as described above, the insulating film 15 is a single film of a silicon oxide film or a stacked film in which the lowermost layer is a silicon oxide film. When the silicon oxide film is formed, the exposed part of the metal film 6a constituting the memory gate electrode MG is oxidized. In the embodiment 4, what are different from the embodiment 1 are that the side wall insulating film 14 (14a) is not formed over the side wall of the memory gate electrode MG in the stage immediately prior to forming the insulating film 15 and that not only the upper end part of the metal film 6a constituting the memory gate electrode MG but also the side end part (16b) of the metal film 6a is exposed. Consequently, when the insulating film 15 is formed in Step S19, in the embodiment 4, too, in the same manner as in the embodiment 1, the upper end part 16a of the metal film 6a having constituted the memory gate electrode MG is oxidized to form the metal oxide portion 17 having insulating properties, and, differing from the embodiment 1, the side end part 16b of the metal film 6a having constituted the memory gate electrode MG is oxidized to form the metal oxide portion 17a having insulating properties. Because the metal oxide portion 17 and the metal oxide portion 17a are formed by the oxidation of parts of the metal film 6a, the metal elements constituting the metal oxide portions 17 and 17a and the metal element constituting the metal film 6a are the same.

Because the formation process of the side wall insulating film 14 in Step S16 is not performed, no side wall insulating film 14 (14c) is formed over the side wall of the gate electrode GE, and, in a stage immediately prior to forming the insulating film 15, the end part (the side surface) of the metal film 4a constituting the gate electrode GE is also exposed. Consequently, in the embodiment 4, when the insulating film 15 is formed in Step S19, not only the exposed parts of the metal film 6a (the upper end part and side end part) having constituted the memory gate electrode MG are oxidized to form the metal oxide portions 17 and 17a, but also the end part (the side surface) of the metal film 4a having constituted the gate electrode GE is oxidized to form a metal oxide portion 19 having insulating properties is formed. The metal oxide portion 19 is formed in the end part of the metal film 4a having constituted the gate electrode GE (particularly, in both end parts in the gate length direction of the gate electrode GE), and the metal element constituting the metal oxide portion 19 and the metal element constituting the metal film 4a are the same.

When a part of the metal films 4a and 6a is oxidized in the formation of the insulating film 15 to form the metal oxide portions 17, 17a and 19, a case where exposed parts of the silicon films 4b and 6b are slightly oxidized may occur. The materials of the metal films 4a and 6a and formation conditions of the insulating film 15 are selected so that the metal films 4a and 6a are oxidized more easily than the silicon films 4b and 6b.

The subsequent processes are fundamentally the same as in embodiment 1. In the embodiment 4, too, an anisotropic etching (etching back) process of the insulating film 15 in Step S20 is performed in the same manner as in embodiment 1 to form the sidewall spacer SW and then to obtain the structure in FIG. 51 corresponding to FIG. 27. FIG. 52 is partially enlarged cross-sectional view of FIG. 51. After that, in the same manner as in the embodiment 1, the process in Step S21 (the formation process of the n⁺-type semiconductor regions 8a, 8b and 8c) and subsequent processes are performed. The repeated explanation is omitted.

In the embodiment, in addition to the effect of the embodiment 1, the following effects can be obtained.

Because the metal oxide portion 18 is formed in the end part of the metal film 4a constituting the control gate electrode CG (particularly, both end parts in the gate length direction of the control gate electrode CG), an effective gate length $L_{eff}$ of the control gate electrode CG can be shortened by the portion of the metal oxide portion 18. Because the ON current can be increased, the driving force can be improved. Accordingly, the performance (electric performance) of the semiconductor device having the nonvolatile memory can furthermore be improved.

Moreover, since the metal oxide portion 17a is formed in the side end part (16b) of the metal film 6a constituting the memory gate electrode MG, even when no offset spacer like that in the side wall insulating film 14a exists, the end part (the starting point) of a region into which an impurity is implanted in the ion implantation process for forming the n⁻-type semiconductor region 7a can be separated from the side end part 16b of the metal film 6a constituting the memory gate electrode MG by the portion of the metal oxide portion 17a. Consequently, it is possible to reduce the leak current and to improve the short-channel characteristics. In addition, because the offset spacer like that in the side wall insulating film 14a becomes unnecessary, the reduction of cell size of the memory cell (the cell size in the gate length direction) becomes possible, and the size (the area) of the semiconductor device can be reduced.

In the embodiment 2, it is also possible to form the metal oxide portions 17 and 17a for the metal film 6a of the memory gate electrode MG. In the embodiment 3, it is also possible to form the metal oxide portion 18 for the metal film 4a of the control gate electrode CG.

Embodiment 5

In the embodiment 5, the control gate electrode CG of the nonvolatile memory in the embodiment 3 is formed from a stacked film of the metal film 4a, the silicon film 4b, and the insulating film.

Figure 53:
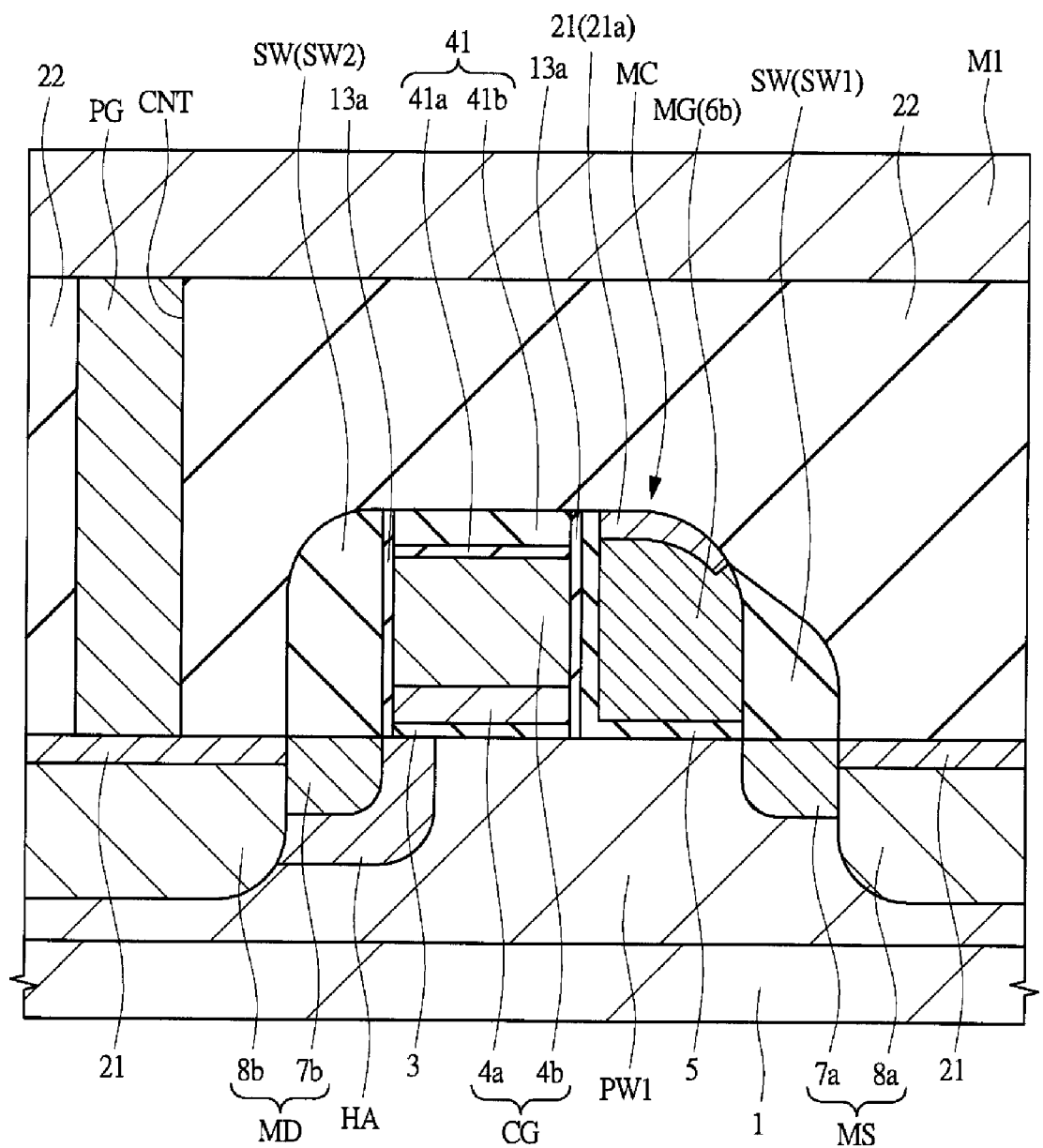
FIG. 53 is a cross-sectional view of essential parts of a semiconductor device in another embodiment of the present invention.

FIG. 53 is a cross-sectional view of essential parts of the semiconductor device in the embodiment 5, and corresponds to FIG. 1 in the embodiment 1 and FIG. 38 in the embodiment 3. The semiconductor device in the embodiment is also a semiconductor device including a nonvolatile memory. FIG. 53 shows a cross-sectional view of essential parts of the memory cell region of the nonvolatile memory.

As shown in FIG. 53, in the memory cell of the nonvolatile memory in the embodiment, the control gate electrode CG is constituted by a stacked film (a stacked pattern, stacked structure) of the metal film 4a, the silicon film 4b and the insulating film 41. More specifically, the control gate electrode CG is constituted by the stacked film (the stacked film pattern) of the metal film 4a, the silicon film 4b over the metal film 4a, the insulating film 41a over the silicon film 4b, and the insulating film 41b over the insulating film 41a. The insulating film 41 is constituted by the insulating film 41a over the silicon film 4b and the insulating film 41b over the insulating film 41a, and the insulating film 41a is thinner than the insulating film 41b. The insulating film 41a includes preferably a silicon oxide film, and the insulating film 41b includes preferably a silicon nitride film.

In the embodiment, because the insulating film 41 (insulating films 41a and 41b) is formed in the upper part of the control gate electrode CG of the memory cell, no metal silicide layer 21 is formed over the control gate electrode CG of the memory cell. What is obtained by replacing the control gate electrode CG formed from the metal film 4a, the silicon film 4b over the metal film 4a, and the metal silicide layer 21 (21b) over the silicon film 4b in the embodiment 3 by the control gate electrode CG formed from the stacked film of the metal film 4a, the silicon film 4b over the metal film 4a, and the insulating film 41 over the silicon film 4b corresponds to the semiconductor device in the embodiment 5.

Because the other structure of the memory cell of the embodiment is the same as that in the embodiment 3, the explanation is omitted.

Next, the process of manufacturing a semiconductor device of the embodiment is explained. Differences from the manufacturing process in the embodiment 3 are mainly explained.

Figure 54:
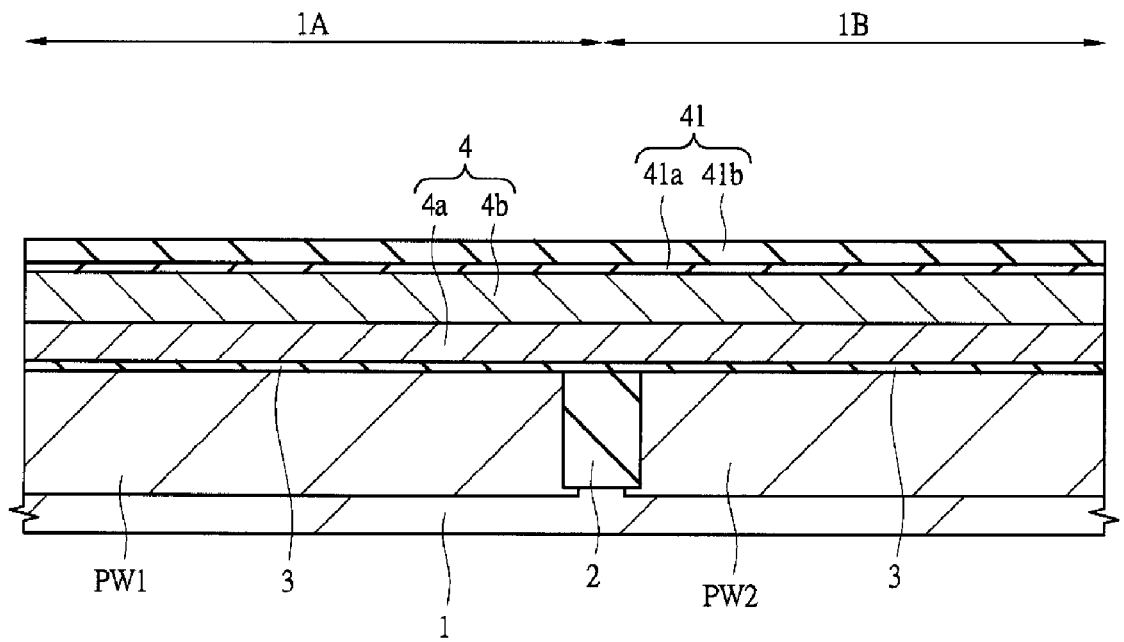
FIG. 54 is a cross-sectional view of essential parts in a process of manufacturing a semiconductor device in another embodiment of the present invention.
Figure 55:
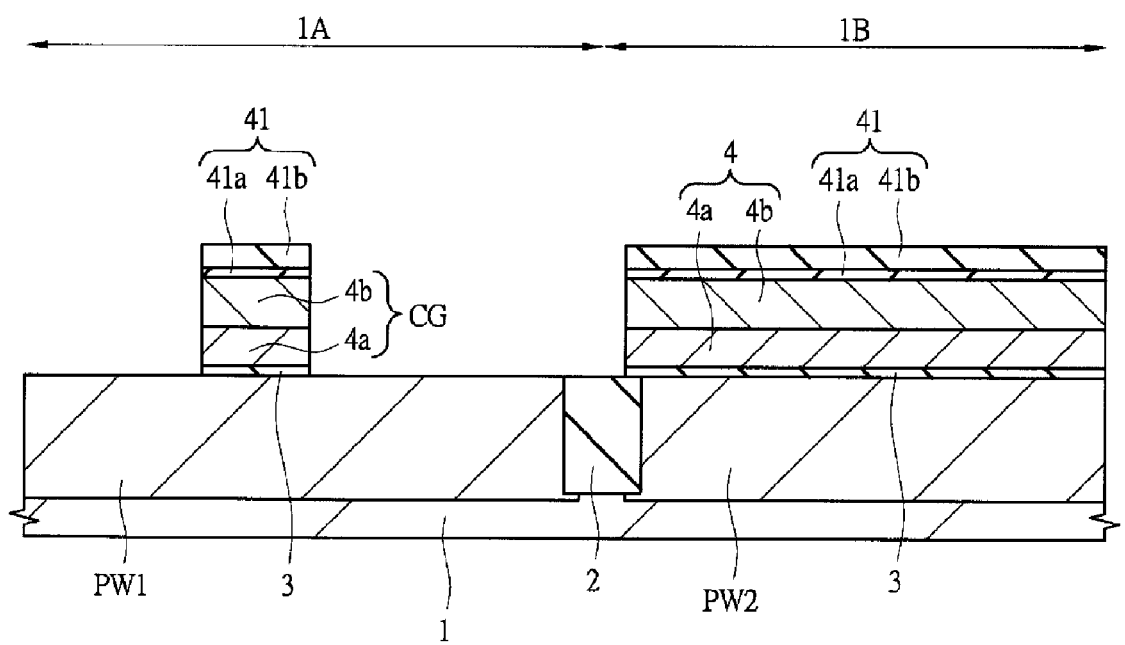
FIG. 55 is a cross-sectional view of essential parts in the process of manufacturing a semiconductor device subsequent to FIG. 54.

FIGS. 54 and 55 are cross-sectional views of essential parts in the process of manufacturing a semiconductor device in the embodiment 5. FIGS. 54 and 55 show cross sections corresponding to those in FIGS. 8 to 15 and 18 to 33 in the embodiment 1.

In the embodiment, between Step S6 (the formation process of the silicon film 4b) and Step S7, as shown in FIG. 54, a process of forming the insulating film 41 over the silicon film 4b is added. The process of forming the insulating film 41 has a process of forming the insulating film 41a over the silicon film 4b, and a process of forming the insulating film 41b over the insulating film 41a.

In Step S7, in the embodiment 3, the stacked film 4 of the metal film 4a and the silicon film 4b over the metal film 4a are patterned to form the control gate electrode CG. In the embodiment 5, the stacked film of the metal film 4a, the silicon film 4b over the metal film 4a, and the insulating film 41 over the silicon film 4b is patterned. Consequently, as shown in FIG. 55, the control gate electrode CG including the stacked film pattern of the metal film 4a, the silicon film 4b over the metal film 4a, and the insulating film 41 over the silicon film 4b is formed. Between Step S7 and Step S8, in regions where the insulating film 41 is to be removed (such as the peripheral circuit region 1B), the insulating film 41 is removed. Since subsequent processes (Step S8 and following Steps) are fundamentally the same as those in the embodiment 3, the explanation is omitted.

In the embodiment 5, too, the same effects as those in the embodiment 3 can be obtained.

Moreover, in the embodiment, because the control gate electrode CG is formed from the stacked film of the metal film 4a, the silicon film 4b and the insulating film 41 (more specifically the insulating films 41a and 41b), even when the metal film 4a and the silicon film 4b are formed thinner than those in the embodiment 3, the height of the memory gate electrode MG formed in a sidewall spacer shape over the side wall of the control gate electrode CG can be kept.

Furthermore, in the embodiment, following effects can also be obtained. When the insulating film 41 is formed in the upper part of the control gate electrode CG, the metal silicide layer 21 can not be formed in the upper part of the control gate electrode CG. Therefore, when the control gate electrode is a polysilicon gate electrode, differing from the embodiment, the resistance of the control gate electrode becomes high, which is disadvantageous for the speeding up of the control transistor. In contrast, in the embodiment 5, the control gate electrode CG has the metal film 4a and is a metal gate electrode. Although the metal silicide layer 21 is not formed in the upper part of the control gate electrode CG as the result of forming the insulating film 41 in the upper part of the control gate electrode CG, the resistance of the control gate electrode CG can be reduced. Consequently, it is possible to speed up the control transistor and to improve the performance (the electric performance) of the semiconductor device having the nonvolatile memory.

Figure 56:
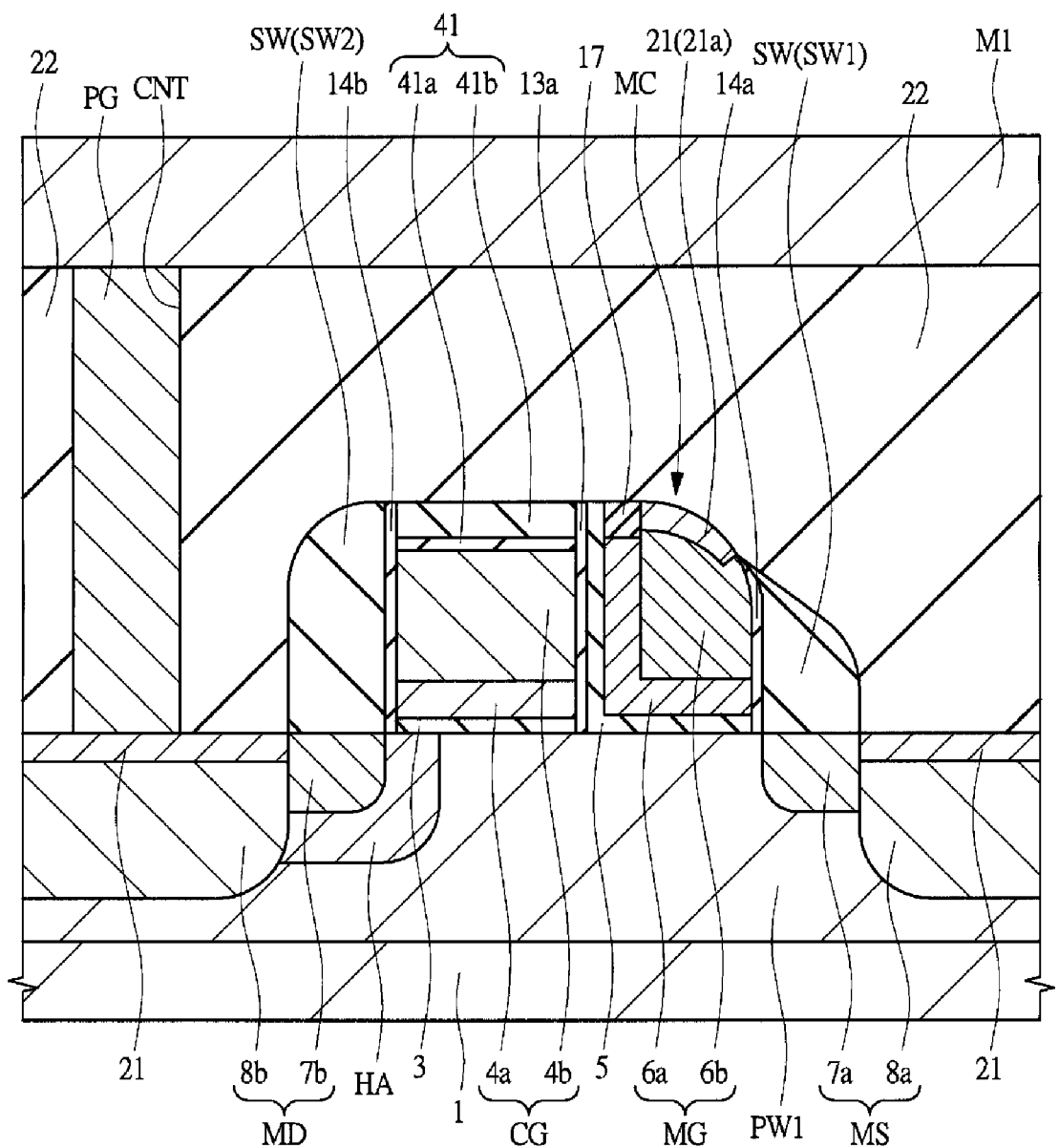
FIG. 56 is a cross-sectional view of essential parts showing a modification of a semiconductor device in another embodiment of the present invention.

FIG. 56 is a cross-sectional view of essential parts of a semiconductor device of a modification in the embodiment 5, and corresponds to FIG. 53 and FIG. 1 in the embodiment 1.

The modification in FIG. 56 is obtained by setting the control gate electrode CG to have the structure same as that of the control gate electrode CG in FIG. 53 (the stacked structure of the metal film 4a, the silicon film 4b, and the insulating film 41), in the memory cell in FIG. 1 in the embodiment 1. Specifically, in the modification in FIG. 56, in the same manner as in the memory cell in FIG. 53, the control gate electrode CG is constituted by the stacked film (the stacked film pattern) of the metal film 4a, the silicon film 4b over the metal film 4a, the insulating film 41a over the silicon film 4b, and the insulating film 41b over the insulating film 41a. Over the control gate electrode CG, no metal silicide layer 21 is formed. Because the other structure of the memory cell of the modification in FIG. 56 is the same as that of the embodiment 1, the explanation is omitted.

The modification in FIG. 56 can also be considered as a case where, in the memory cell in FIG. 53, the memory gate electrode MG is a metal gate electrode (a stacked structure of the metal film 6a and the silicon film 6b) and the metal oxide portion 17 is formed.

In the modification in FIG. 56, in the same manner as the memory cell in FIG. 53, no metal silicide film 21b is formed over the control gate electrode CG. In the process shown in FIG. 28 (Step S21), when the potential difference between the control gate electrode CG and the memory gate electrode MG becomes large as the result of implantation of an impurity (ion implantation) into a portion exposed in the upper portions of the side wall insulating film 13a and the insulating film 5, there is such an anxiety that a leak current may flow in the upper part of the control gate electrode CG and the memory gate electrode MG. As shown in FIG. 56, by forming the metal oxide portion 17, the metal oxide portion 17 having insulating properties lies between the upper part of the control gate electrode CG and the upper part of the memory gate electrode. The distance between electroconductive films in the upper part of the control gate electrode CG and the upper part of the memory gate electrode MG becomes long. Accordingly, the generation of the leak current can be prevented or decreased.

Furthermore, as modifications in the embodiment 5, the metal oxide portion 18 may be formed in the memory cell in FIG. 53 and in the memory cell in FIG. 56, the metal oxide portion 17a may be formed in the memory cell in FIG. 56, and the metal oxide portions 17a and 18 may be formed in the memory cell in FIG. 56.

The invention achieved by the inventors is explained on the basis of the embodiments. The invention is not limited to the embodiments and can be changed in a range that does not deviate from the purport.

The invention is effective when applied to semiconductor devices and technologies of manufacturing the devices.

What is claimed is:

1. A semiconductor device, comprising:
   a semiconductor substrate;
   a first gate electrode formed in an upper part of the semiconductor substrate;
   a second gate electrode that is formed in an upper part of the semiconductor substrate and is adjacent to the first gate electrode;
   a first insulating film formed between the first gate electrode and the semiconductor substrate; and
   a second insulating film that is formed between the second gate electrode and the semiconductor substrate and between the first gate electrode and the second gate electrode, and that includes an electric charge accumulation part, wherein:
   the second gate electrode has a first metal film adjacent to the second insulating film and a first silicon film that is formed over the first metal film and is separated from the second insulating film via the first metal film; and
   a first metal oxide portion is formed in an upper end part of the first metal film.

2. The semiconductor device according to claim 1, wherein a metal element constituting the first metal oxide portion and a metal element constituting the first metal film are the same.

3. The semiconductor device according to claim 2, wherein the first metal oxide portion is formed by oxidation of a part of the first metal film.

4. The semiconductor device according to claim 3, wherein a first metal silicide layer is formed in an upper part of the first silicon film.

5. The semiconductor device according to claim 4, wherein a second metal silicide layer is formed in an upper part of the first gate electrode.

6. The semiconductor device according to claim 5, wherein:
   the semiconductor device has a nonvolatile memory; and
   the first and second gate electrodes are gate electrodes constituting the nonvolatile memory.

7. The semiconductor device according to claim 6, wherein:
   a sidewall spacer is formed over a side wall that is a side wall of the second gate electrode and that is on a side opposite to the side adjacent to the first gate electrode; and
   a second metal oxide portion is formed between an end part located on an opposite side of the upper end part of the first metal film and the sidewall spacer.

8. The semiconductor device according to claim 7, wherein at least a part of the second metal oxide portion is located between the first silicon film and the second insulating film.

9. The semiconductor device according to claim 8, wherein the second metal oxide portion is formed by oxidation of a part of the first metal film.

10. The semiconductor device according to claim 9, wherein the first gate electrode has a second metal film formed over the first insulating film, and a second silicon film formed over the second metal film, and the second metal silicide layer is formed in an upper part of the second silicon film.

11. The semiconductor device according to claim 10, wherein the first insulating film is a high-permittivity film.

12. The semiconductor device according to claim 11, wherein impurity concentration in a channel region below the first gate electrode in the semiconductor substrate is not more than $1 \times 10^{17}/cm^3$.

* * * * *